(12) United States Patent
Hong et al.

(10) Patent No.: US 7,504,290 B2
(45) Date of Patent: *Mar. 17, 2009

(54) THIN FILM TRANSISTOR ARRAY PANEL FOR A LIQUID CRYSTAL DISPLAY AND A METHOD FOR MANUFACTURING THE SAME

(75) Inventors: Mun-Pyo Hong, Yongin (KR); Woon-Yong Park, Suwon (KR); Jong-Soo Yoon, Cheonan (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/750,630

(22) Filed: May 18, 2007

(65) Prior Publication Data

US 2008/0035971 A1 Feb. 14, 2008

Related U.S. Application Data

(60) Continuation of application No. 11/451,686, filed on Jun. 13, 2006, now abandoned, which is a continuation of application No. 10/933,545, filed on Sep. 3, 2004, now Pat. No. 7,078,255, which is a division of application No. 10/644,917, filed on Aug. 21, 2003, now Pat. No. 6,787,809, which is a division of application No. 10/172,982, filed on Jun. 18, 2002, now Pat. No. 6,642,074, which is a division of application No. 09/410,760, filed on Oct. 1, 1999, now Pat. No. 6,429,057.

(30) Foreign Application Priority Data

| Oct. 1, 1998 | (KR) | ..................................... 98-41355 |
| Dec. 31, 1998 | (KR) | ..................................... 98-63760 |

(51) Int. Cl.
*H01L 21/84* (2006.01)

(52) U.S. Cl. ......................... 438/158; 438/159; 438/160
(58) Field of Classification Search ................. 438/158, 438/159, 160
See application file for complete search history.

(56) References Cited

U.S. PATENT DOCUMENTS 5,614,728 A 3/1997 Akiyama (Continued)

FOREIGN PATENT DOCUMENTS

| JP | 01100518 | 4/1989 |
| JP | 06289589 | 10/1994 |
| KR | 199632778 | 2/2001 |

\* cited by examiner

*Primary Examiner*—M. Wilczewski
(74) *Attorney, Agent, or Firm*—Cantor Colburn LLP

(57) ABSTRACT

Simplified method of manufacturing liquid crystal displays. A gate wire including a gate line, a gate pad and a gate electrode is formed on the substrate by using the first mask. A gate insulating layer, a semiconductor layer, a ohmic contact layer and a metal layer are sequentially deposited to make a quadruple layers, and patterned by a dry etch of using the second mask. At this time, the quadruple layers is patterned to have a matrix of net shape layout and covering the gate wire. An opening exposing the substrate is formed in the display area and a contact hole exposing the gate pad is formed in the peripheral area. Next, ITO is deposited and a photoresist layer coated on the ITO. Then, the ITO layer is patterned by using the third mask and a dry etch, and the data conductor layer and the ohmic contact layer not covered by the ITO layer is dry etched. After depositing a passivation layer, a opening is formed by using the fourth mask and the exposed semiconductor layer through the opening is etched to separate the semiconductor layer under the adjacent data line.

7 Claims, 58 Drawing Sheets

U.S. PATENT DOCUMENTS

| | | | |
|---|---|---|---|
| 5,621,556 A | 4/1997 | Fulks et al. | |
| 5,652,158 A | 7/1997 | Bae | |
| 6,022,753 A | 2/2000 | Park et al. | |
| 6,287,899 B1* | 9/2001 | Park et al. | 438/149 |
| 6,451,635 B2* | 9/2002 | Park et al. | 438/158 |
| 6,531,392 B2* | 3/2003 | Song et al. | 438/648 |
| 6,555,409 B2* | 4/2003 | Kim et al. | 438/34 |
| 6,586,286 B2* | 7/2003 | Park et al. | 438/155 |
| 6,969,889 B2* | 11/2005 | Cho et al. | 257/347 |
| 7,112,512 B2* | 9/2006 | Lan et al. | 438/430 |
| 7,172,913 B2* | 2/2007 | Lee et al. | 438/30 |
| 7,187,003 B2* | 3/2007 | Kong et al. | 257/59 |
| 7,279,370 B2* | 10/2007 | Lim et al. | 438/155 |
| 7,306,981 B2* | 12/2007 | Kuwabara et al. | 438/166 |
| 7,316,944 B2* | 1/2008 | Ahn | 438/155 |
| 7,351,623 B2* | 4/2008 | Ahn | 438/158 |
| 7,352,004 B2* | 4/2008 | Lee et al. | 257/59 |
| 7,396,695 B2* | 7/2008 | Cho et al. | 438/30 |
| 2003/0136971 A1* | 7/2003 | Rhee et al. | 257/98 |
| 2004/0238886 A1* | 12/2004 | Lee et al. | 257/347 |
| 2006/0194368 A1* | 8/2006 | Hong et al. | 438/109 |
| 2006/0252168 A1* | 11/2006 | Rhee et al. | 438/28 |
| 2008/0227245 A1* | 9/2008 | Lee et al. | 438/160 |

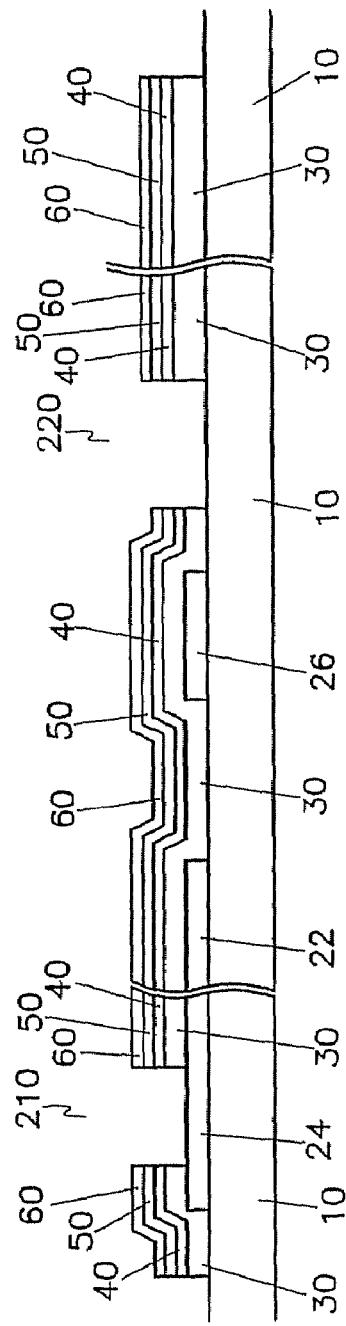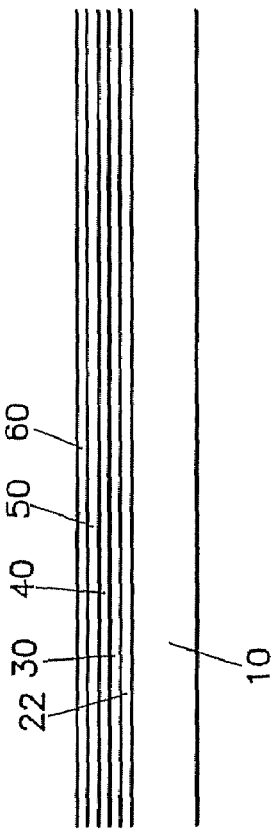

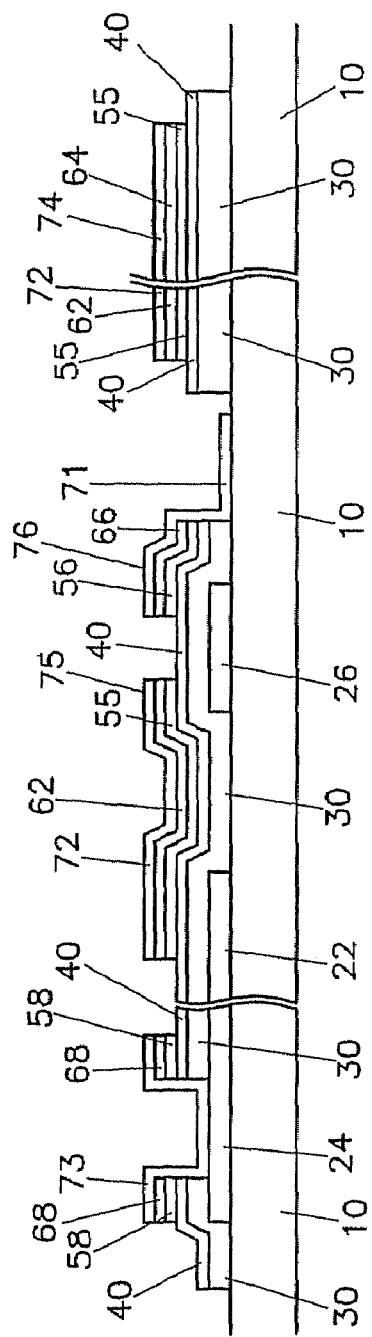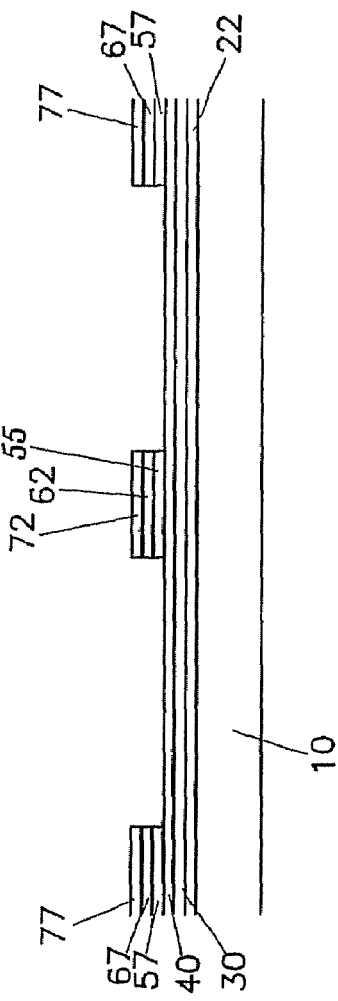

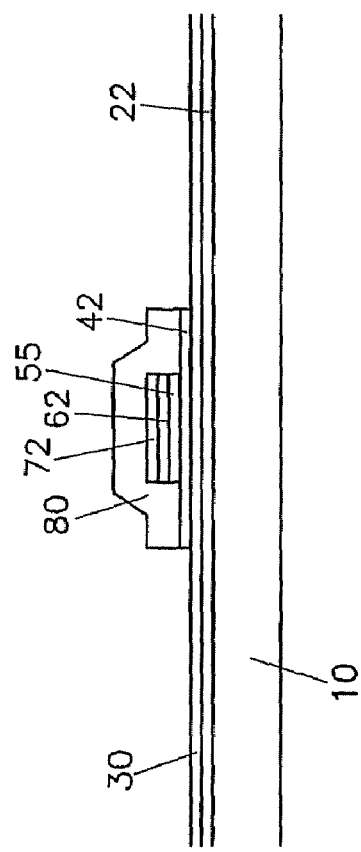
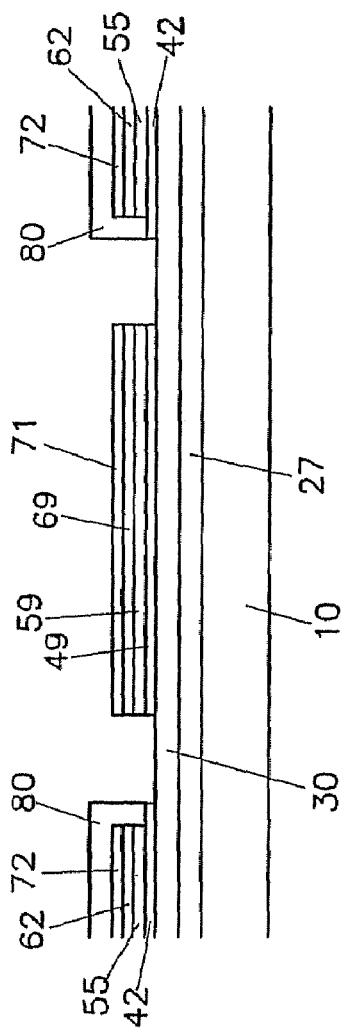

FIG.24B
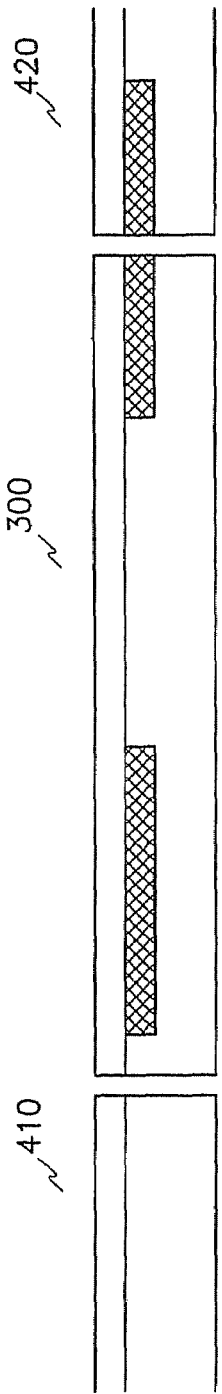
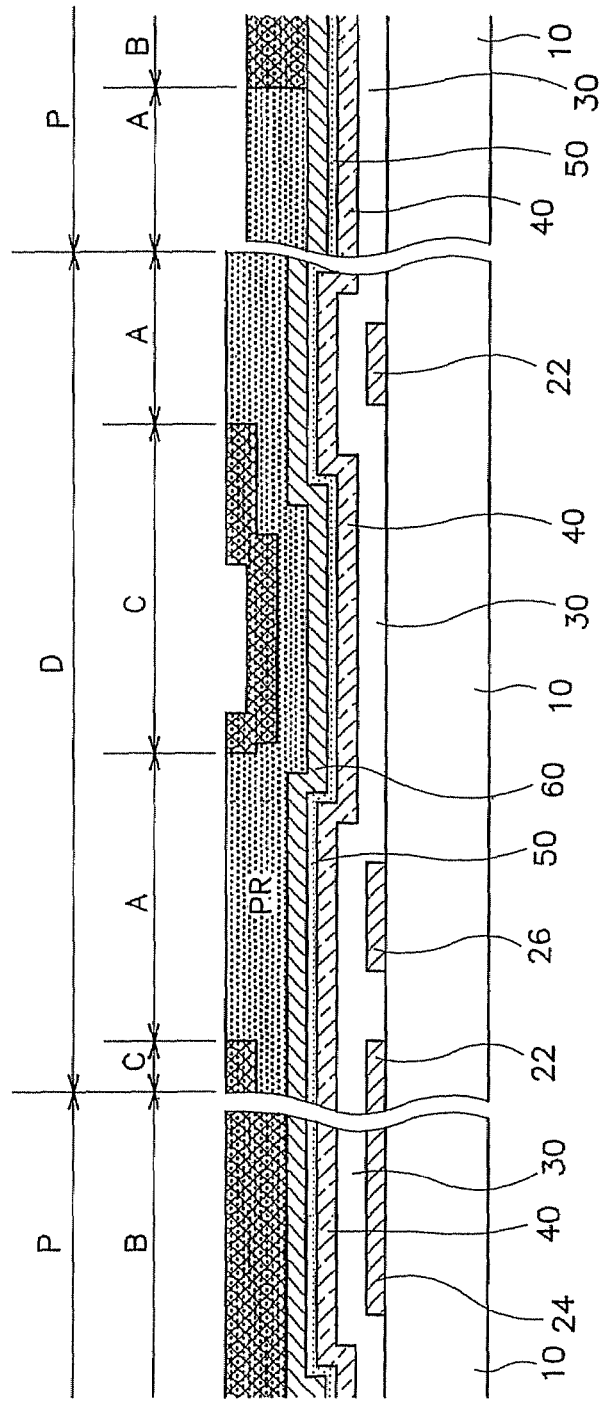

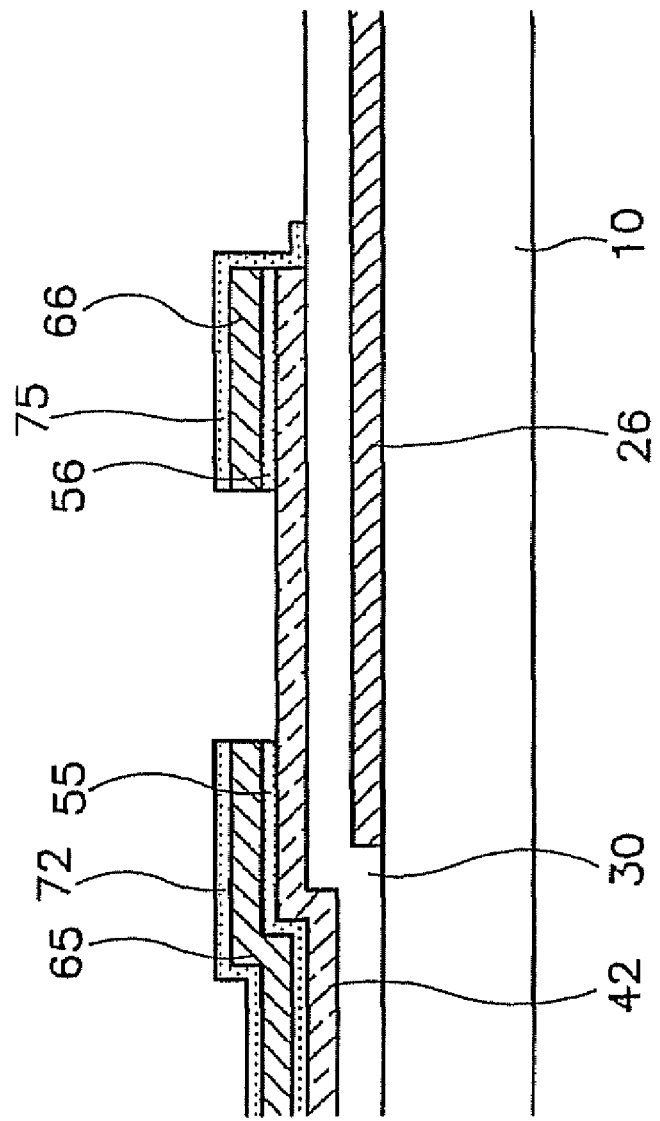

THIN FILM TRANSISTOR ARRAY PANEL FOR A LIQUID CRYSTAL DISPLAY AND A METHOD FOR MANUFACTURING THE SAME

CROSS REFERENCE TO PRIOR APPLICATIONS

This application is a continuation application of U.S. application Ser. No. 11/451,686 filed Jun. 13, 2006, which is a continuation application of U.S. application Ser. No. 10/933,545 filed Sep. 3, 2004, which is a divisional application of U.S. patent application Ser. No. 10/644,917 filed on Aug. 21, 2003 and issued as U.S. Pat. No. 6,787,809, which is a divisional application of U.S. patent application Ser. No. 10/172,982 filed on Jun. 18, 2002 and issued as U.S. Pat. No. 6,642,074, which is a divisional application of U.S. patent application Ser. No. 09/410,760 filed on Oct. 1, 1999 and issued as U.S. Pat. No. 6,429,057, which claims priority to and the benefit of Korean Patent Application No. 98-41355 filed on Oct. 1, 1998 and Korean Patent Application No. 98-63760 filed on Dec. 31, 1998, each of which is herein incorporated by reference in their entireties.

BACKGROUND OF THE INVENTION (a) Field of the Invention

The present invention relates to a thin film transistor array panel for a liquid crystal display and a method for manufacturing the same, especially to a method for manufacturing a thin film transistor array panel with a reduced number of photolithography steps.

(b) Description of the Related Art

A liquid crystal display (LCD) is one of the most popular FPDs (flat panel displays). The LCD has two panels having electrodes for generating electric fields and a liquid crystal layer interposed therebetween. The transmittance of incident light is controlled by the intensity of the electric field applied to the liquid crystal layer.

In the most widely used LCD, the field-generating electrodes are provided at both panels, and one of the panels has switching elements such as thin film transistors (TFTs).

In general, a thin film transistor array panel is manufactured by photolithography using a plurality of photomasks, and five or six photolithography steps are used. The high cost for the photolithography process makes it desirable to reduce the number of the photolithography steps. Even though a few manufacturing methods using only four photolithography steps are suggested, these methods are not easy to accomplish.

Now, a conventional method of manufacturing a thin film transistor array panel using four lithography steps will be described.

First, a gate wire of aluminum or aluminum alloy are formed on a substrate by using a first mask. A gate insulating layer, an amorphous silicon layer, an n+ amorphous silicon layer and a metal layer are sequentially deposited. The metal layer, the n+ amorphous silicon and the amorphous silicon layer are patterned by using a second mask. At this time, gate pads of the gate wire is covered only with the gate insulating layer. An ITO (indium tin oxide) layer is deposited and patterned by using a third mask. At this time, the portions of the ITO layer over the gate pads are removed. After the metal layer and the n+ amorphous silicon layer thereunder are patterned by using the patterned ITO layer as an etch mask, a passivation layer is deposited. A complete thin film transistor array panel is obtained by patterning the passivation layer and gate insulating layer thereunder using a fourth mask, thereby removing the portion of the passivation layer and the gate insulating layer on the gate pads.

As a result, the gate pads of aluminum or aluminum alloy are exposed in the conventional manufacturing method of using four masks. The aluminum and the aluminum alloy cannot stand against physical and chemical variations and are vulnerable to damage and oxidation, despite their advantages of low resistivity. To compensate this matter, gate lines are formed to have multiple-layered structure or made of materials that can stand against the physical and chemical changes. However, the former makes the manufacturing process complicated, and the latter may result in a high resistivity problem.

SUMMARY OF THE INVENTION

It is therefore an object of the present invention to provide new methods for manufacturing a thin film transistor array panel for LCDs with a reduced number of photolithography steps.

It is another object of the present invention to protect gate pads of LCDs.

It is the other object of the present invention to prevent the LCD's current leakage.

These and other objects are achieved, according to the present invention, by patterning the gate insulating layer, the semiconductor layer, the ohmic contact layer and the data conductor layer at a time.

According to the present invention, a gate wire is formed on an insulating substrate by a first photolithography process. A quadruple layers including a gate insulating layer, a semiconductor layer, an ohmic contact layer and a data conductor layer is deposited on the insulating substrate and the gate wire and formed by a second photolithography process. A conductive pattern is formed on the data conductor layer and the area surrounded by the data conductor layer by a third photolithography process. Then, the portion of the data conductor layer not covered by the conductive pattern is etched out to form a data wire and the ohmic contact layer not covered by the data wire is also etched out. Finally, a passivation layer pattern on the conductive pattern is formed by a fourth photolithography process.

At this time, the gate wire may include a plurality of gate lines extended to a first direction, gate electrodes that are branches of the gate line and gate pads connected to an end of the gate line and receiving a scanning signal from an external circuit. The quadruple layers may have first contact holes exposing the gate pad, and the passivation layer may have second contact holes exposing the first contact hole.

The gate wire may include a plurality of gate lines extended to a first direction, gate electrodes that are branches of the gate line and gate pads connected to an end of the gate line and receiving a scanning signal from an external circuit. The quadruple layers may have first contact holes exposing the gate pad. The conductive pattern may include first conductive patterns connected to the gate pad through the first contact hole, and the passivation layer may have second contact holes exposing the first conductive pattern.

The gate wire may include a plurality of gate lines extended to a first direction, gate electrodes that are branches of the gate line and gate pads connected to an end of the gate line and receiving a scanning signal from an external circuit. The data wire may include a plurality of data lines extended to a second direction and crossing the gate line, data pads connected to an end of the data line and receiving an image signal from an external circuit, source electrodes connected to the data line and adjacent with the gate electrode, and drain electrodes located at the opposite side of the source electrode with respect to the gate electrode. The conductive pattern may include a plurality of first conductive patterns formed on the data line, the source electrode and the data pad, second conductive patterns formed on the drain electrode, and pixel electrodes connected to the second conductive pattern and formed in the area surrounded by the gate line and the data line. The passivation layer may have first openings exposing the pixel electrode and second openings exposing the first conductive pattern on the data pad. The passivation layer may have third openings exposing a part of the semiconductor layer between the adjacent two data line. The step may further comprise a step of etching the exposed portion of the semiconductor layer to separate the semiconductor layer under the two data line from each other. The pixel electrode may be overlapped with the previous gate line and the portion of the semiconductor layer sandwiched between the pixel electrode and the gate line is isolated from the other portion.

The gate insulating layer may include a first portion formed between the gate pads and between the data pads, the passivation layer may have a fourth opening exposing the first portion of the gate insulating layer. The portion of the semiconductor layer located on the first portion of the gate insulating layer may be removed to separate the portions of the semiconductor layer under the gate pads and the data pads.

The passivation layer may cover the edge of the pixel electrode. The first opening exposes the edge of the pixel electrode. A storage wire overlapped with the pixel electrode may be formed on the substrate, the quadruple layers may be formed on the storage wire, and the portion of the semiconductor layer sandwiched between the storage wire and the pixel electrode is isolated from the other portion.

The passivation layer may have a trench exposing the portion of the semiconductor layer between the first conductive pattern and the pixel electrode and between the adjacent pixel electrodes, and further comprising a step of etching the exposed semiconductor layer through the trench. The gate line may include two main lines and branches connecting the two main lines, and the pixel electrode may be overlapped with a part of the gate line. The source electrode may have a concave part and the end part of the drain electrode may be located in the concave part.

The conductive pattern may be made of a transparent conductor such as indium-tin-oxide.

The forming step of the quadruple layers may comprise the substeps of coating a photoresist layer on the data conductor layer, patterning the photoresist layer to be a pattern of which thickness is varying depending on the location by exposure and development, etching the quadruple layers along with the photoresist layer pattern to expose the gate pad, to form a data wire leaving the source electrode and the drain electrode connected to each other, and to expose the portion of the gate insulating layer between the data wires. A first portion, the thinnest portion of the photoresist layer, may be formed on the gate pad. A second portion, the thickest portion, may be formed on the data wire where the source electrode and the drain electrode are connected to each other. A third portion that is thicker than the first portion and thinner than the second portion may be formed between the second portions. The exposure of the photoresist layer may be performed by using a photomask having at least three parts of which transmittance are different from each other. A portion of the gate insulating layer may be removed to expose ends of the gate wire by the second photolithography process. The conductive pattern may include first conductive patterns contacting with the exposed end of the gate wire. Contact holes exposing the first conductive pattern may be formed in the passivation layer by the fourth photolithography process.

According to the present invention, a thin film transistor array panel is provided. The thin film transistor array panel comprises a gate wire formed on an insulating substrate and including a plurality of gate lines extending to a first direction, gate electrodes connected to the gate line, and gate pads connected to an end of the gate line, a gate insulating layer having contact holes exposing the gate pad and formed in a matrix shape on the gate wire and the substrate, a semiconductor layer formed on the gate insulating layer, a data wire formed on the semiconductor layer and including a plurality of data lines extending to a second direction to cross the gate line, source electrodes adjacent to the gate electrode, drain electrode separated from the data line and the source electrode and located at the opposite side of the source electrode with respect to the gate electrode, and data pads connected to an end of the data line, a conductive pattern including a plurality of first patterns formed on the source electrode and the data line, second patterns formed on the drain electrode, third patterns formed on the data pad, and pixel electrodes connected to the second pattern, and a passivation layer formed on the conductive pattern, the semiconductor pattern and the substrate, and having a plurality of first openings exposing the pixel electrode, second openings exposing the gate insulating layer between the two adjacent data lines, third openings located on the gate pad, and fourth openings exposing the third pattern. At this time, the data wire is only formed between the conductive pattern and the semiconductor layer, the semiconductor layer is formed on the whole gate insulating layer except the portion under the second opening, and the portions of the semiconductor layer under the two adjacent data lines are separated from each other.

At this time, the thin film transistor array panel may further comprise a contact layer formed between the semiconductor layer and the data wire to have the same layout as the data wire and to reduce the contact resistance between the semiconductor layer and the data wire. The conductive pattern further includes a fourth pattern connected to the gate pad through the contact hole and the third opening exposes the fourth pattern. The pixel electrode may be overlapped with the adjacent gate line and the portion of the semiconductor layer sandwiched between the pixel electrode and the gate line is isolated from the other portion. The gate insulating layer may include a first portion formed between the two gate pads and the two data pads, the passivation layer has fifth openings exposing the first portion of the gate insulating layer, and the semiconductor layer is not formed under the fifth opening. The passivation layer may cover the edge of the pixel electrode. The first opening may expose the edge of the pixel electrode. The thin film transistor array panel may further include a storage wire formed on the substrate, overlapped with the pixel electrode and covered by the gate insulating layer, wherein the portion of the semiconductor layer sandwiched between the storage wire and the pixel electrode is isolated from the other portion. The conductive pattern may be made of indium-tin-oxide.

According to the present invention, a thin film transistor array panel may be manufactured by a method comprising the steps of forming a gate wire including a plurality of gate lines and gate pads by a first photolithography process. The next step is depositing a first insulating layer, a semiconductor layer, an ohmic contact layer and a metal layer on the gate wire and forming a metal layer pattern, an ohmic contact layer pattern, a semiconductor layer pattern and a first insulating layer pattern that have a matrix shape layout overlapping the gate wire except the gate pad by a second photolithography process. The next step is depositing a transparent conductor layer, forming a transparent conductor pattern including a pixel electrode, a plurality of redundant data lines, redundant source electrodes, redundant drain electrodes, redundant data pads and redundant gate pads by a third photolithography process. Following is etching out the portion of the metal layer not covered by the transparent conductor pattern and the ohmic contact layer thereunder, depositing a second insulating layer, forming a passivation layer pattern having openings respectively exposing the gate pad, the data pad, the pixel electrode and the portion of the semiconductor layer connecting the adjacent data line, and etching out the portion of the semiconductor layer exposed through the openings.

At this time, the manufacturing method may further comprise an etching step of the first insulating layer under the exposed portion of the semiconductor layer after the etching step of the exposed portion of the semiconductor layer.

According to the present invention, a thin film transistor array panel may also be manufactured by a method comprising the steps of forming a gate wire including a plurality of gate lines and gate pads by a first photolithography process. The next step is depositing a first insulating layer, a semiconductor layer, an ohmic contact layer and a metal layer on the gate wire and patterning the metal layer, the ohmic contact layer, the semiconductor layer and the first insulating layer to form a metal layer pattern, an ohmic contact layer pattern and a semiconductor layer pattern that are separated into two pieces at least on the gate wire and a first insulating layer pattern covering the gate wire except for the gate pad. The following step is depositing a transparent conductor layer and forming a transparent conductor layer pattern by a third photolithography process. The next step is etching the portion of the metal layer not covered by the transparent conductor layer pattern and the ohmic contact layer thereunder. The final step is to form a data wire including a plurality of data pads, source and drain electrodes and ohmic contact layer pattern thereunder, depositing a second insulating layer, and forming a passivation layer pattern at least having contact holes exposing the gate pad and the data pad by a fourth photolithography process.

At this time, the second photolithography process may comprise the substeps of coating a photoresist layer on the metal layer, forming a photoresist layer pattern having at least three portions of which thickness are different from each other by exposure and development, and etching the metal layer, the ohmic contact layer, the semiconductor layer and the first insulating layer along with the photoresist layer to remove the first portion that is the thinnest portion of the photoresist layer pattern, and the metal layer, the ohmic contact layer, the semiconductor layer and the first insulating layer thereunder, along with the third portion that is thicker than the first portion, and the metal layer, the ohmic contact layer and the semiconductor layer thereunder, but not to remove the layers under the second portion which is the thickest portion. The exposure of the photoresist layer may be performed by using a photomask including at least three parts of which transmittance are different from each other. The photomask may have slits smaller than the resolution of the stepper or is formed by at least two materials of which transmittance are different from each other. The photomask may be classified into a first mask to form the gate pad and a second mask to form the other area and the transmittance of the first mask is different from that of the second mask. The first portion of the photoresist layer pattern may be located on the gate pad.

The etching step of the metal layer, the ohmic contact layer and the first insulating layer along with the photoresist layer pattern may comprise the substeps of etching the metal layer, the ohmic contact layer, the semiconductor layer and the first insulating layer under the first portion of the photoresist layer pattern by using the second and the third portion as an etch stopper, removing the second portion of the photoresist layer to expose the metal layer thereunder by ashing process, and etching the exposed portion of the metal layer, and the ohmic contact layer and the semiconductor layer thereunder by using the third portion of the photoresist layer as an etch stopper.

The semiconductor layer may be made of amorphous silicon. The second insulating layer may be made of a photo-definable material.

According to the present invention, a thin film transistor array panel may be manufactured by a method comprising the steps of forming a gate wire including a plurality of gate lines and a plurality of gate pads connected to the gate lines on a substrate having a display area and a peripheral area, the gate lines located substantially in the display area and the gate pads located substantially in the peripheral area. The next step is sequentially depositing a gate insulating layer, a semiconductor layer, an ohmic contact layer and a conductor layer on the gate wire, coating a photoresist layer on the metal layer, forming a photoresist layer pattern of which thickness is varying depending on the location by exposure and development, patterning the metal layer, the ohmic contact layer, the semiconductor layer and the gate insulating layer at a time to form a metal layer pattern, a first ohmic contact layer pattern and a semiconductor layer pattern and expose the gate pad by a photolithography process. The following step is depositing a conductor layer, forming a conductor layer pattern including a pixel electrode covering a part of the metal layer and a separated conductor layer pattern covering the other part of the metal layer and located at the opposite side of the pixel electrode with respect to the gate electrode by a photolithography process. The next step is removing the portion of the metal layer between the pixel electrode and the separated conductor layer pattern and the ohmic contact layer thereunder to form a data wire including a plurality of data lines, data pads, source electrodes and drain electrodes, and a second ohmic contact layer pattern thereunder. And the final step is forming a passivation layer.

At this time, the photoresist layer pattern may be formed only in the display area and on the metal layer pattern, the thickness of the photoresist layer pattern is thicker on the metal layer pattern than elsewhere of the display area. The step of patterning the metal layer, the ohmic contact layer, the semiconductor layer and the gate insulating layer at a time may comprise the substeps of removing the exposed portion of the metal layer in the peripheral area to expose the ohmic contact layer, removing the thin photoresist layer in the display area to expose the metal layer thereunder by using an etch method that is able to etch the photoresist layer, the ohmic contact layer and the semiconductor layer at a time. Then, the exposed portion of the metal layer in the display area is removed to expose the ohmic contact layer. The semiconductor layer and the gate insulating layer are etched out to expose the gate pad in the peripheral area and to remove the exposed portion of the ohmic contact layer and the semiconductor layer thereunder by using an etch method that is able to etch the ohmic contact layer, the semiconductor layer and the gate insulating layer at a time.

The passivation layer may have openings exposing the pixel electrode. The conductor layer pattern may include a plurality of redundant data lines covering the data line, redundant data pad covering the data pad and redundant gate pad covering the gate pad. The passivation layer may have openings exposing the redundant gate pad and the redundant data pad. The manufacturing method may further include a step of forming a common wire on the substrate including a plurality of common electrodes that generate electric fields with the pixel electrode.

According to the present invention, a thin film transistor array panel may be manufactured by a method comprising the steps of forming a gate wire including a plurality of gate lines, gate electrodes connected to the gate line and a common wire including a plurality of common electrodes on an insulating substrate, forming a gate insulating layer pattern that covers the gate wire and the common wire, forming a semiconductor pattern on the gate insulating layer, forming an ohmic contact layer pattern on the semiconductor pattern, forming a data wire including a plurality of data lines, source electrodes connected to the data line, drain electrodes separated from the source electrode on the ohmic contact layer pattern, forming a passivation layer pattern covering the data wire except for a part of the drain electrode, and forming a plurality of pixel electrode connected to the drain electrodes and generating electric fields with the common electrode. At this time, the source electrode and the drain electrode is separated by a photolithography process that uses a photoresist layer pattern. The photoresist layer pattern includes a first portion located between the source electrode and the drain electrode, a second portion thicker than the first portion, and a third portion thinner than the first portion.

Furthermore, the data wire, the ohmic contact layer and the semiconductor layer may be formed using a mask. The gate insulating layer, the semiconductor pattern, the ohmic contact layer pattern and the data wire may be formed in the substeps of depositing the gate insulating layer, the semiconductor layer, the ohmic contact layer and the metal layer. A photoresist layer is coated on the metal layer and exposed through the photomask. Then, the photoresist layer is developed to form the photoresist layer pattern. The second portion of the pattern is located on the data wire. The portion of the metal layer, the ohmic contact layer and the semiconductor layer under the third portion are etched out. The second portion is also etched to a certain thickness along with the portion of the metal layer and the ohmic contact layer thereunder. The remaining photoresist layer pattern of the second portion is used for forming the data wire, the ohmic contact layer pattern and the semiconductor pattern. Finally, the photoresist layer pattern is removed. The data wire, the ohmic contact layer pattern and the semiconductor pattern may be formed in the substeps of etching the portion of the metal layer under the third portion to expose the ohmic contact layer by wet etch or dry etch, dry etching the ohmic contact layer under the third portion and the semiconductor layer thereunder along with the first portion to expose the gate insulating layer under the third portion and the metal layer under the first portion along with completing the semiconductor pattern. The portion of the metal layer under the first portion and the ohmic contact layer thereunder are etched out to complete the data wire and the ohmic contact layer pattern.

BRIEF DESCRIPTION OF THE DRAWINGS

FIGS. 7B and 7C are respectively the cross-sectional views taken along the line VIIB-VIIB' and VIIC-VIIC' of the FIG. 7A.

FIGS. 8B and 8C are respectively the cross-sectional views taken along the line VIIIB-VIIIB' and VIIIC-VIIIC' of the FIG. 8A.

FIGS. 17 and 18 are cross-sectional views respectively taken along the line XVII-XVII', XVIII-XVIII' of the FIG. 16.

FIG. 24B is the cross-sectional view taken along the line XXIVB-XXIVB' of the FIG. 24A.

FIGS. 35B and 35C are respectively the cross-sectional views taken along the line XXXVB-XXXVB' and XXXVC-XXXVC' of the FIG. 35A.

DETAILED DESCRIPTION OF THE PREFERRED EMBODIMENTS

Figure 1:
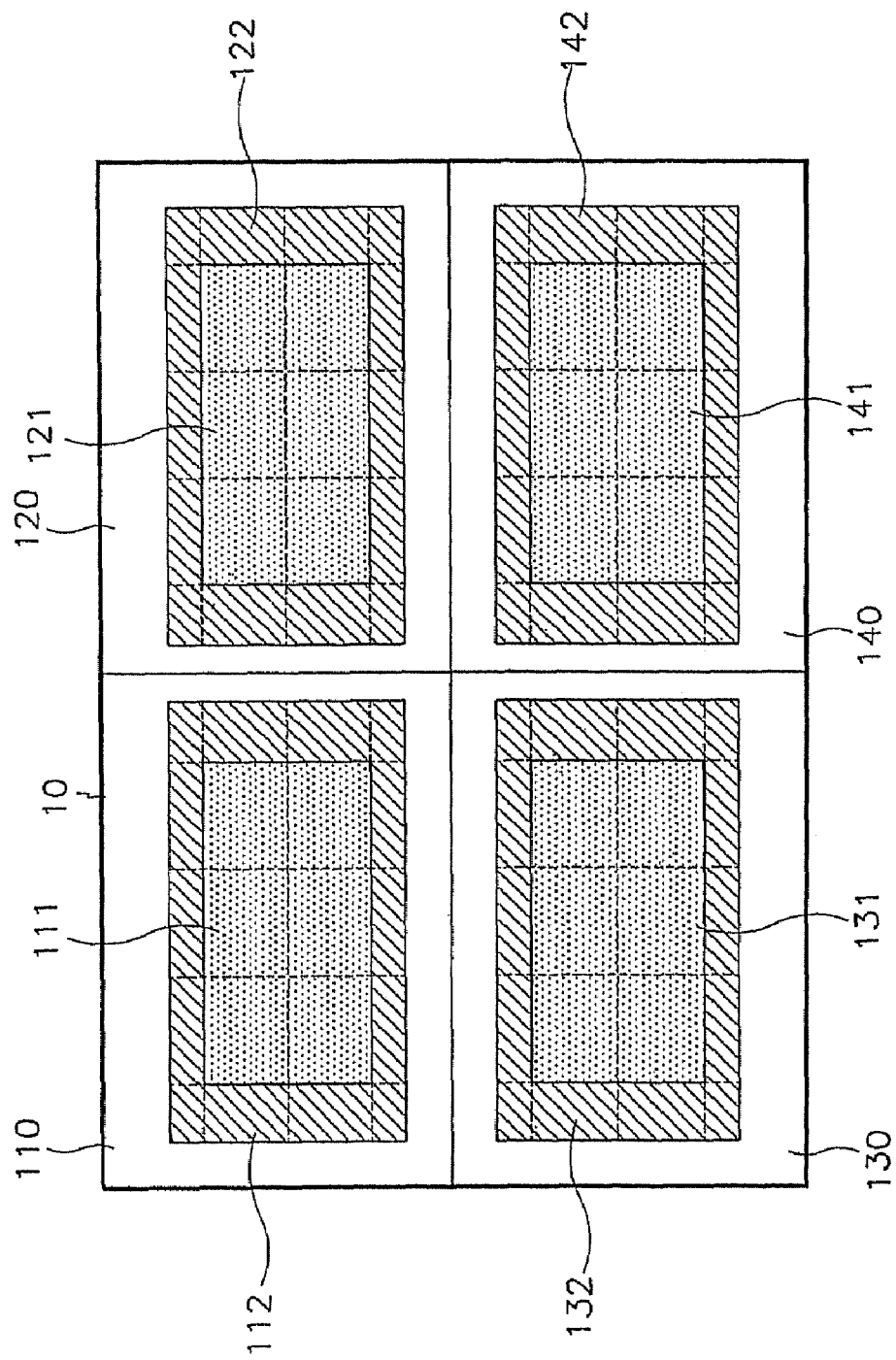
FIG. 1 is a plan view of a substrate partitioned to manufacture a TFT panel for an LCD according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Now, a structure of a TFT array panel according to an embodiment of the present invention will be described with reference to the FIGS. 1 to 5.

As shown in FIG. 1, a plurality of panel areas are formed on an insulating plate 10. For example, as shown in FIG. 1, four panel areas 110, 120, 130 and 140 are formed on a glass plate 10. When the panels are TFT array panels, the panel areas 110, 120, 130 and 140 include display areas 111, 121, 131 and 141 having a plurality of pixels and peripheral areas 112, 122, 132 and 142, respectively. TFTs, wires and pixel electrodes are repeatedly arranged in a matrix shape in the display areas 111, 121, 131 and 141. Pads to be connected to external circuits and electrostatic discharge protection circuits are provided in the peripheral areas 111, 121, 131 and 141.

In general, the elements in the panel areas 110, 120, 130 and 140 are formed by photolithography using a stepper, an exposure equipment. When using the stepper, the display areas 111, 121, 131 and 141 and the peripheral areas 112, 122, 132 and 142 are divided into several sections, and a PR layer coated on thin films is exposed to light section by section through one or more masks. Then, the PR layer is developed, and the thin films under the PR layer is etched to form thin film patterns. A complete LCD panel is obtained by repeating the above described patterning step.

Figure 2:
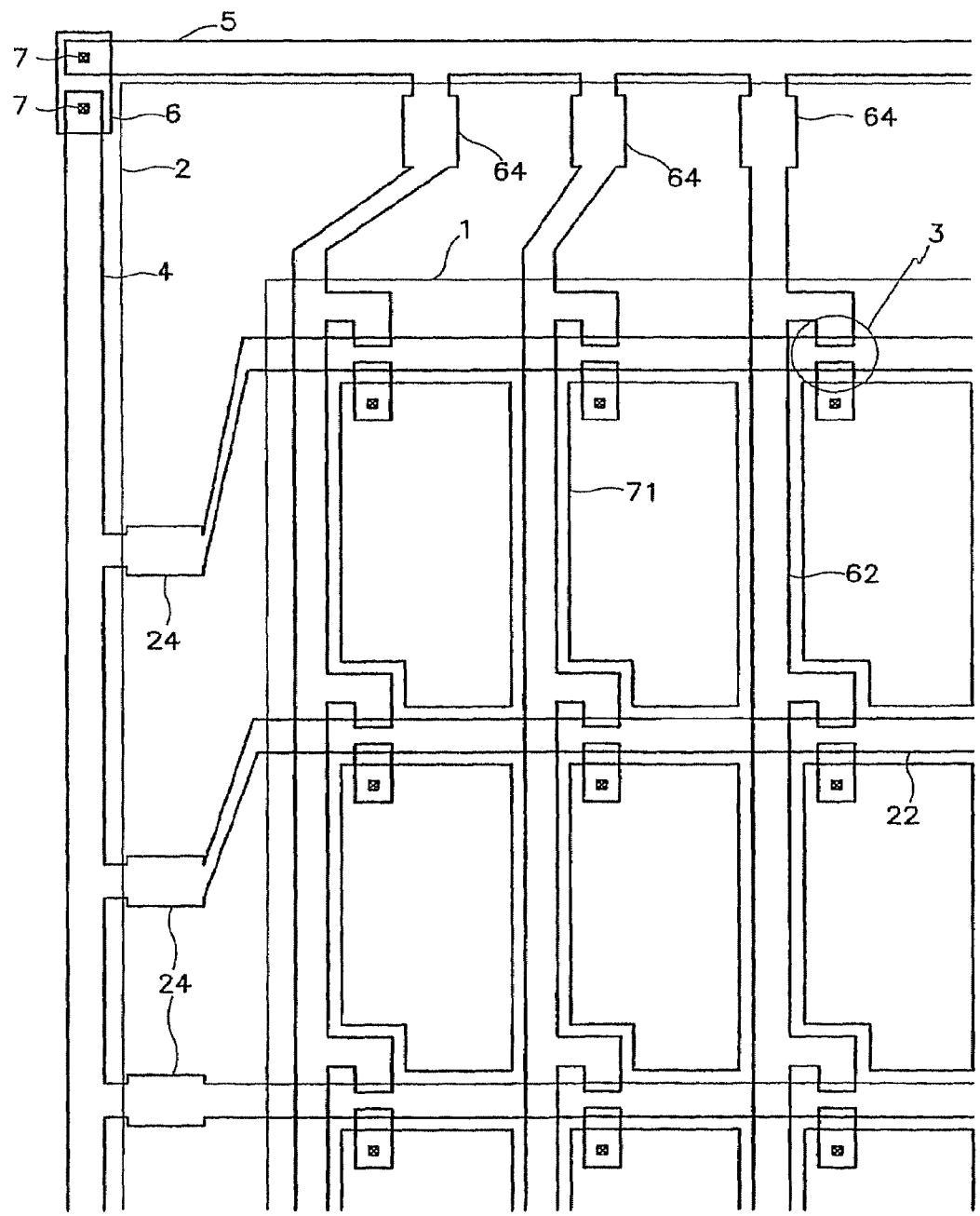
FIG. 2 is a layout view of a TFT panel for an LCD according to an embodiment of the present invention.

FIG. 2 is a layout view of a TFT array panel area shown in FIG. 1 according to an embodiment of the present invention.

As shown in FIG. 2, a number of TFTs, a plurality of pixel electrodes electrically connected to the TFTs and a plurality of wires including gate lines 22 and data lines 62 are formed in the display area surrounded by an imaginary line 1. Gate pads 24 and data pads 64 respectively connected to the gate lines 22 and the data lines 62, and a gate shorting bar 4 and a data shorting bar 5 are formed in the peripheral area. The gate shorting bar 4 and the data shorting bar 5 connect to the whole gate lines 22 and to the whole data lines 62, respectively. The two shorting bars are electrically connected to each other through a connector 6 to make them in the same potential, thereby protecting the device elements from the electrostatic discharge failure. The shorting bars 4 and 5 will be removed by cutting the panel along the cutting line 2. A reference numeral 7 represents contact holes that are formed in insulating layers (not shown) interposed between the connector 6 and the shorting bars 4 and 5. The connector 6 is connected to the shorting bars 4 and 5 through the contact holes 7.

Figure 3:
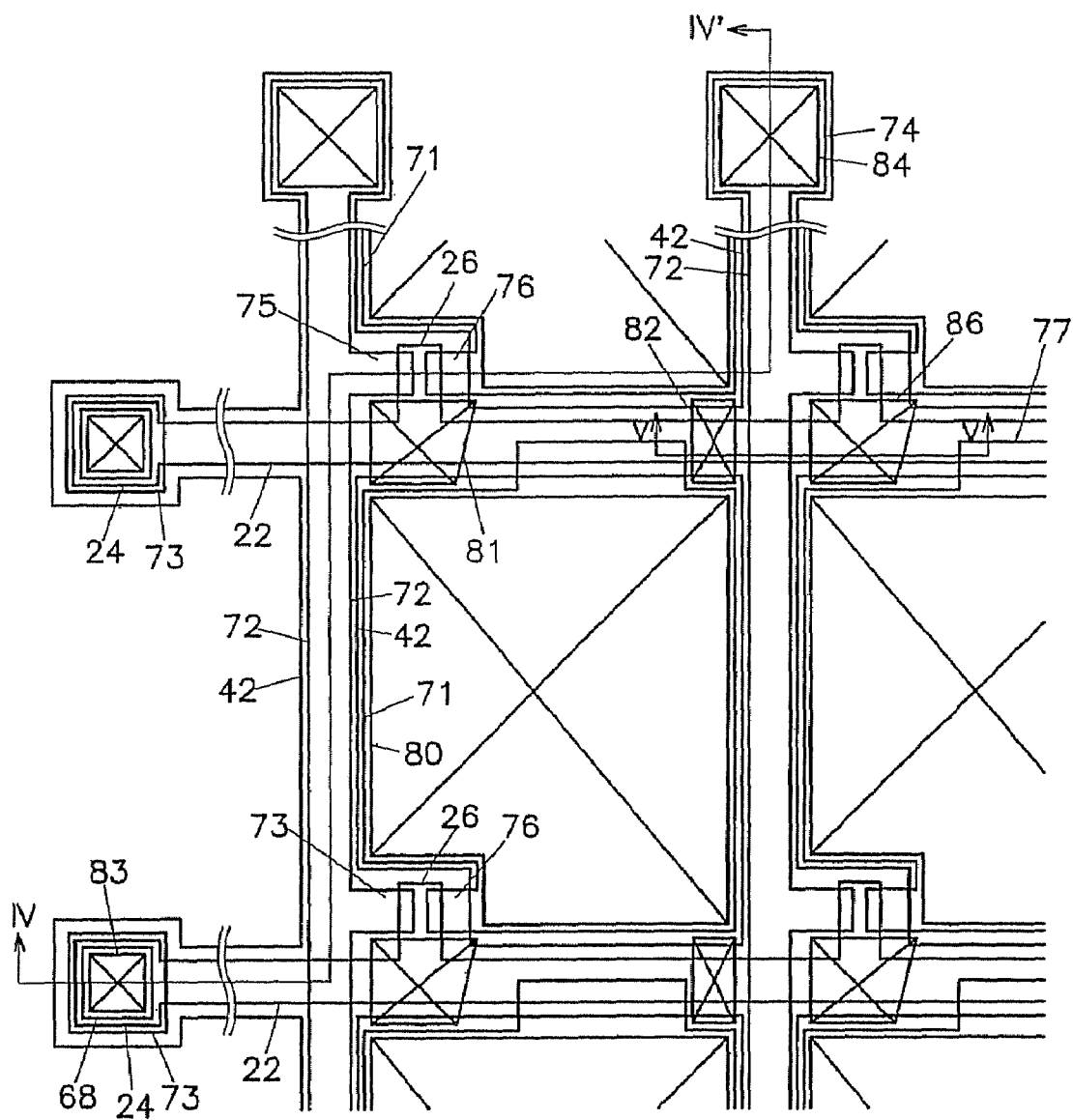
FIG. 3 is a layout view of a TFT panel for an LCD according to the first embodiment of the present invention, and an enlarged view of a portion mainly including a pixel and pads of the FIG. 2.
Figure 4:
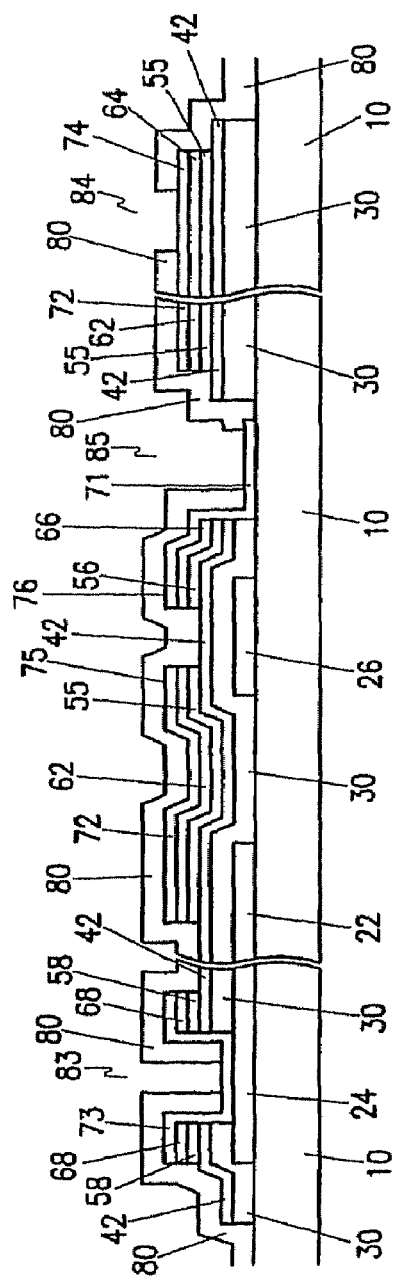
FIGS. 4 and 5 are cross-sectional views respectively taken along the line IV-IV' and V-V' of the FIG. 3.
Figure 5:
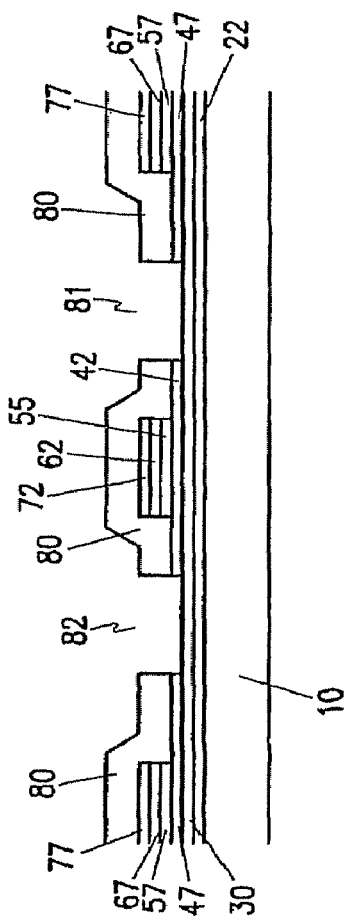

FIG. 3 is a layout view of a TFT panel for an LCD according to an embodiment of the present invention, and an enlarged view of a portion mainly including a pixel and pads of the FIG. 2. FIGS. 4 and 5 are cross-sectional views respectively taken along the line IV-IV' and V-V' of the FIG. 3.

A gate wire of metal or conductive material such as aluminum (Al) or aluminum alloy, molybdenum (Mo) or molybdenum-tungsten (MoW), chromium (Cr) and tantalum (Ta) are formed on an insulating substrate 10. The gate wire includes a plurality of gate lines (scanning signal lines) 22 extending in the horizontal direction, a plurality of gate pads 24 that are connected to one ends of the respective plurality of gate lines 22 and transmit scanning signals from an external circuit to the gate lines 22, and a plurality of gate electrodes 26 of TFTs, which are branches of the gate lines.

The gate wire 22, 24 and 26 may have a multiple-layered structure as well as a single-layered structure. When the gate wire 22, 24 and 26 has formed a multiple-layered structure, it is preferable that one layer is made of a material having a low resistivity and another layer is made of a material that has a good contact with other materials. The double layers of Cr/Al (or Al alloy) and Al/Mo are such examples.

A gate insulating layer 30 of silicon-nitride (SiNx) is formed on the gate wire 22, 24 and 26 and covers the same. The gate insulating layer 30 has a net-shaped pattern.

A semiconductor pattern 42 and 47 made of semiconductor such as hydrogenated amorphous silicon is formed on the gate insulating layer 30. The semiconductor pattern 42 and 47 has two portions, a plurality of the first portions 42 extend to the vertical direction and a plurality of the second portions 47 are isolated from the first portion 42 and located between two of the first portions 42. The first portion 42 adjacent to a gate pad 24 extends to it and forms a branch on the gate pad 24.

An ohmic contact layer pattern 55, 56, 57 and 58 made of amorphous silicon heavily doped with impurities such as phosphorus is formed on the semiconductor pattern 42 and 47.

A data wire 62, 64, 66, 67 and 68 made of conductive materials such as Mo or MoW, Cr, Al or Al alloy and Ta is formed on the ohmic contact layer pattern 55, 56, 57 and 58. The data wire 62, 64, 66, 67 and 68 has a plurality of data lines 62 including a plurality of source electrodes 65 of thin film transistors (TFTs) and extending in the vertical direction, data pads 64 connected to one end of the data lines 62 and transmitting image signals from an external circuit to the data lines 62. The data wire also has a plurality of drain electrodes 66 located at the opposite side of the source electrodes 65 with respect to the gate electrodes 26, first isolated data conductors 68 formed on the gate pads 24, and second isolated data conductors 67 formed on the second portions 47 of the semiconductor layer. The ohmic contact layer pattern 55, 56, 57 and 58 is formed between the semiconductor layer pattern 42 and 47 and the data wire 62, 64, 66, 67 and 68, and has the same layout as the data wire 62, 64, 65, 66 and 68.

On the other hand, the gate insulating layer 30, the semiconductor layer 42, the ohmic contact layer patterns 58 and the first isolated data conductors 68 that are located on the gate pads 24 have a plurality of contact holes to expose the gate pads 24.

A plurality of conductive pattern 71, 72, 73, 74, 75, 76 and 77 made of a transparent and conductive material such as ITO (indium tin oxide) is formed on the data wire 62, 64, 66, 67 and 68 and the substrate 10 of the pixel regions surrounded by the gate lines 22 and the data lines 62. The conductive pattern 71, 72, 73, 74, 75, 76 and 77 includes a plurality of first patterns to fourth patterns. The first pattern 72 and 75 formed on the data line 62 and the data pad 64 is classified into two portions, one is a portion 75 on the source electrode 65 and the other is elsewhere 72. The second pattern 71 and 76 includes a plurality of portions 76 on the drain electrode 66 and a plurality of pixel electrodes 71 in the pixel areas. As shown in FIG. 3, The pixel electrode 71 extends to and is formed on the second isolated data conductor 67 to form a storage capacitor by overlapping with the previous gate line 22. The third pattern 74 is formed on the data pad 64 to assist ohmic contact between the data pad 64 and a external circuit, and the fourth pattern 73 is formed on the gate pad 24 exposed through the contact hole to assist an ohmic contact between the gate pad 24 and an external circuit. At this time, the first pattern 72 and 75 is connected with the third pattern 74, while the second and the fourth pattern 71, 73 and 76 are separated from the first pattern 72, 74 and 75. The fourth pattern 73 may be omitted.

In this embodiment, the conductive pattern is made of a transparent material, but it can be made of an opaque material in a reflective type LCD.

A passivation layer 80 made of insulating material such as SiNx is formed on the described structure, and has a plurality of openings 83, 84 and 85 respectively exposing the pixel electrode 71 and the third and the fourth pattern 73 and 74 of transparent conductor and openings 81 and 82 exposing the gate insulating layer 30. The openings 81 and 82 separate the semiconductor layer into two portions 42 and 47. It is to prevent a parasitic transistor of the gate line 22 as a gate, the date line 62 as a source and the pixel electrode 71 as a drain from being formed, as shown in FIG. 5. Since, in a previous gate type LCD like the present embodiment, where the pixel electrode 71 is overlapped with the previous gate line, such a parasitic transistor can cause a big problem. On the other hand, the semiconductor layer may form an electrical channel when voltages applied. The two adjacent data lines connected via a semiconductor layer may interfere the signals of the two data lines with each other. Therefore, the semiconductor layer needs to be separated in other types of LCDs as well as in the previous gate type LCD. An embodiment, which is not a previous gate type LCD will be described in the fourth embodiment of the present embodiment.

Now, a manufacturing method of a thin film transistor array panel according to the first embodiment of the present invention will be described with reference to the FIGS. 6A to 8C and FIGS. 3 to 5 mentioned above.

Figure 6A:
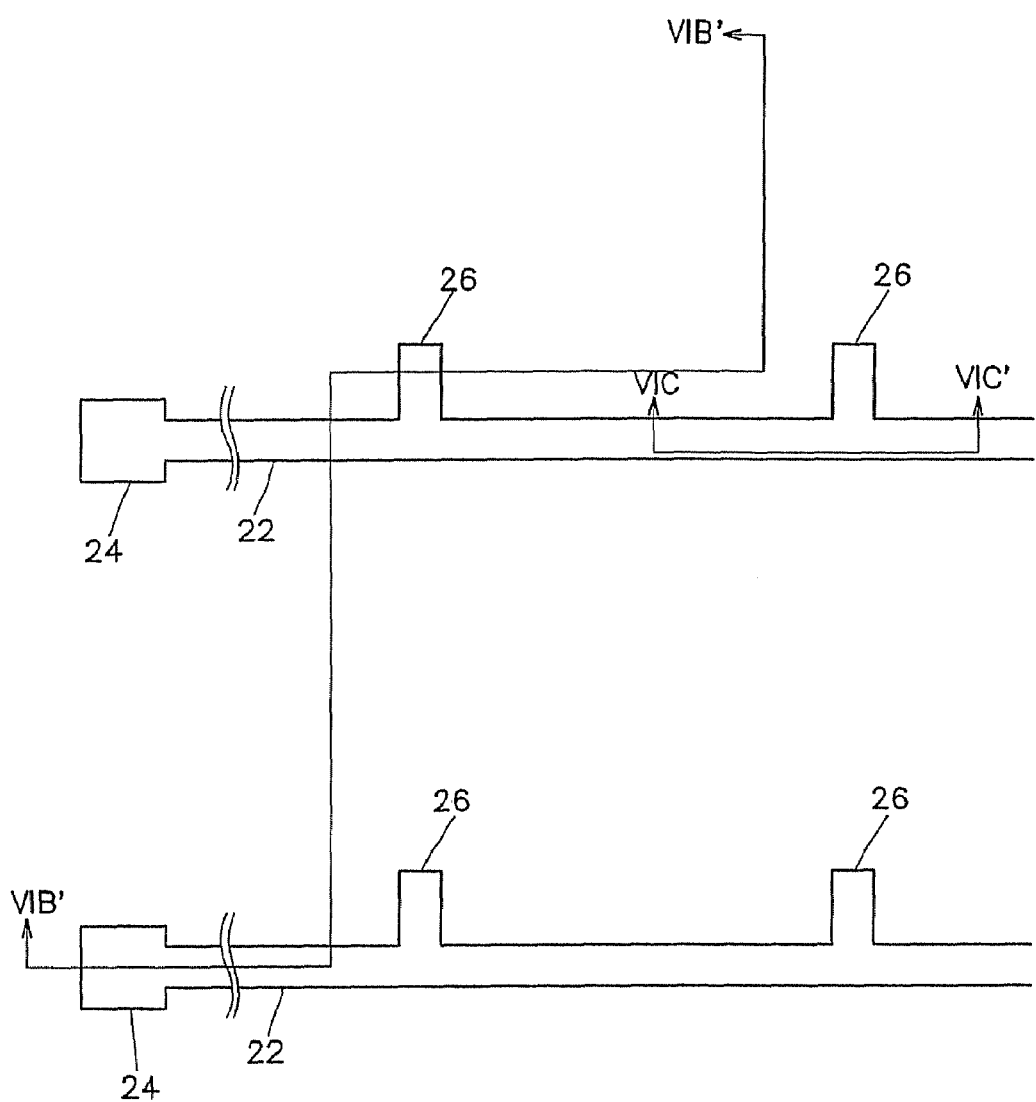
FIG. 6A is a layout view of a TFT panel in the first manufacturing step according to the first embodiment of the present invention.
Figure 6B:
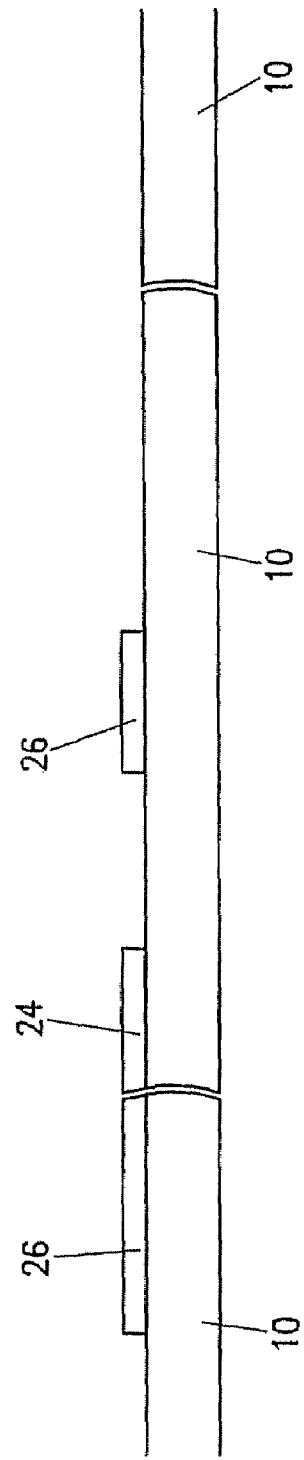
FIGS. 6B and 6C are respectively the cross-sectional views taken along the line VIB-VIB' and VIC-VIC' of the FIG. 6A.
Figure 6C:
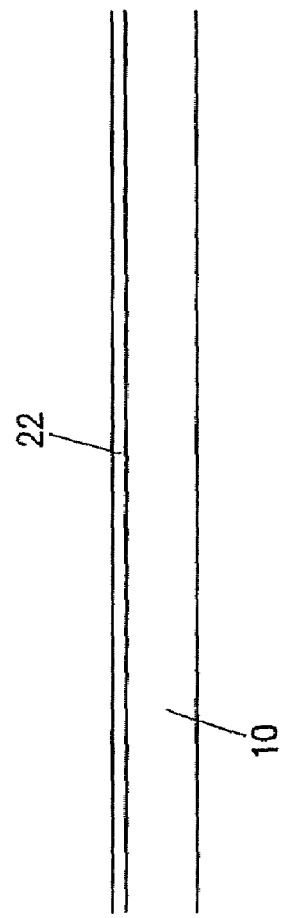
Figure 7A:
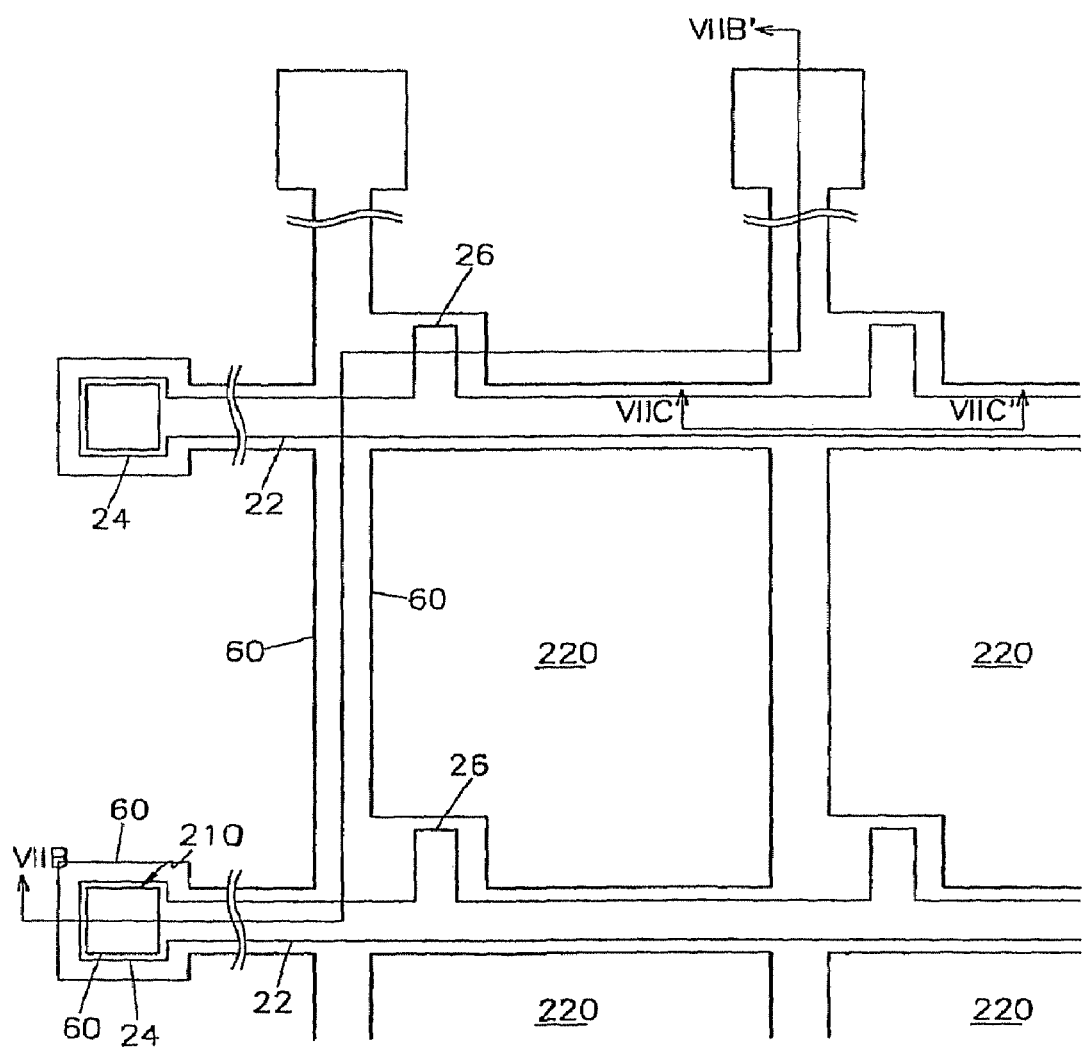
FIG. 7A is a layout view of a TFT panel in a manufacturing step following the FIGS. 6A to 6C.
Figure 8A:
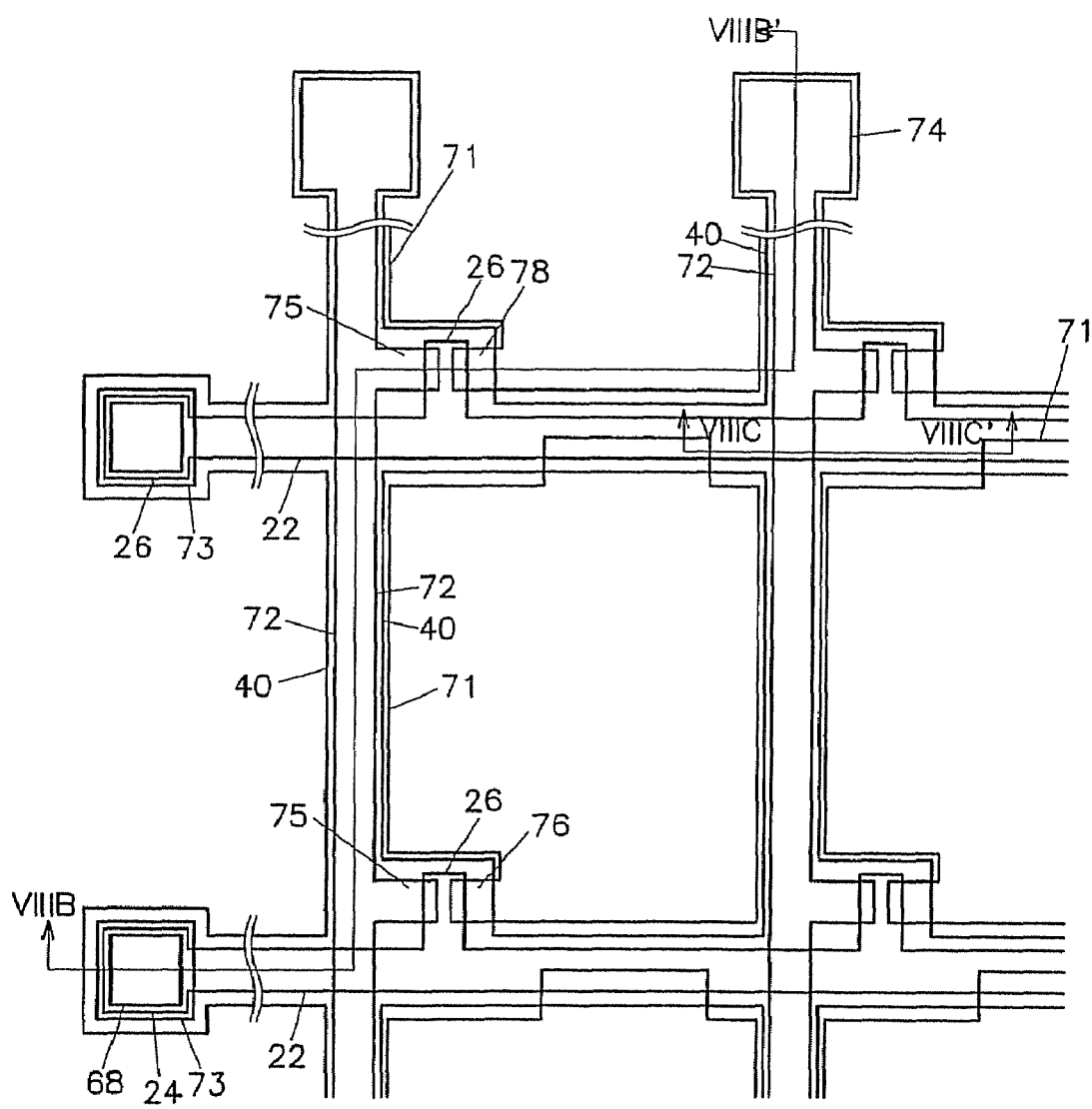
FIG. 8A is a layout view of a TFT panel in a manufacturing step following the FIGS. 7A to 7C.

FIGS. 6A, 7A and 8A are layout views of a TFT panel and are sequentially arranged according to the manufacturing step of the first embodiment of the present invention. FIGS. 6B, 6C, 7B, 7C, 8B and 8C are respectively the cross-sectional views taken along the line VIB-VIB' and VIC-VIC' of the FIG. 6A, VIIB-VIIB' and VIIC-VIIC' of the FIG. 7A and VIIIB-VIIIB' and VIIIC-VIIIC' of the FIG. 8A.

At first, as shown in FIGS. 6A to 6C, a conductor layer is deposited on a substrate 10 by such methods as sputtering to have a thickness 1,000 Å to 3,000 Å, and a gate wire including a gate line 22, a gate pad 24 and a gate electrode 26 is formed by dry etch or wet etch using the first mask. As described above, the gate wire 22, 24 and 26 may be formed of double layers of Al—Nd and Mo—W, in which case the dry etch is preferable. When the gate wire is formed of double layers of Cr and Al—Nd, the wet etch is preferable.

Next, as shown in FIGS. 7A to 7C, a gate insulating layer 30, a semiconductor layer 40, an ohmic contact layer 50 and a data conductor layer 60 of Cr or Al—Nd alloy are sequentially deposited and patterned by dry etch. At this time, as shown in FIG. 7A, the pattern of the four layer 30, 40, 50 and 60 is formed to have a mesh type, covering the whole gate wire 22, 24 and 26. The pixel area has an opening 220 exposing the substrate 10, and a contact hole 210 is formed to expose the gate pad 24.

Next, as shown in FIG. 8A to 8C, an ITO layer is deposited and patterned by using the third mask and dry etch to form a conductive pattern 71, 72, 73, 74, 75, 76 and 77. Then, the portion not covered by the transparent conductor layer of the data conductor layer 60 and the ohmic contact layer 50 is etched by dry etch.

Next, as shown in FIG. 3 to 5, a passivation layer 80 of SiNx is deposited and patterned by using the fourth mask to form the openings 81, 82, 83, 84 and 85, and the semiconductor layer 40 exposed through the openings 81 and 82 is etched to divide it into two pieces 42 and 47. At this time, the etch processes of the passivation layer 80 and the semiconductor layer 40 may be performed in sequence by using a dry etch. A mixture of chlorine gas ($Cl_2$) and oxygen gas ($O_2$), of which etch ratio for the SiNx with respect to the amorphous silicon is about 10:1, may be used as an etch gas.

Such a thin film transistor panel may be manufactured by varieties of different ways to have varieties of different structures.

A TFT array panel and a manufacturing method thereof according to a second embodiment of the present invention will be described.

Figure 9:
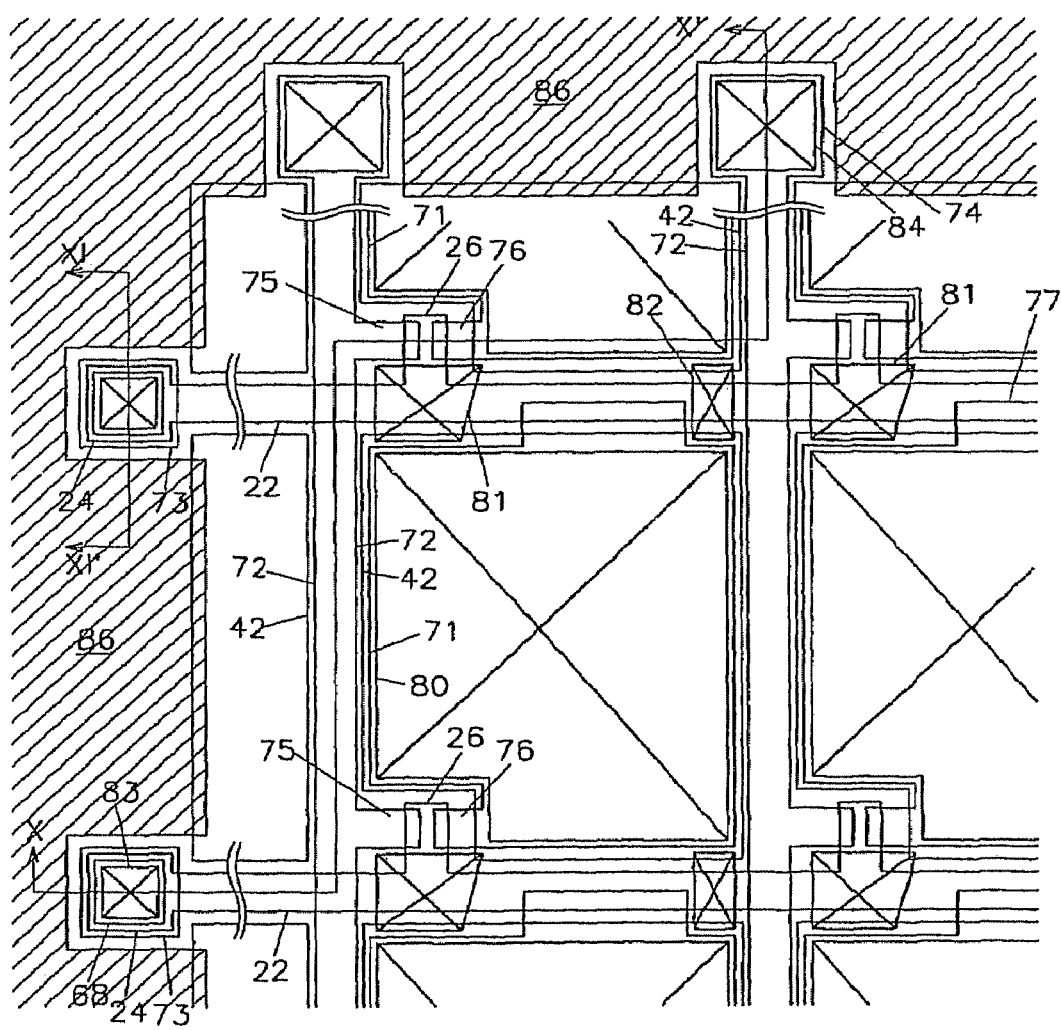
FIG. 9 is a layout view of a TFT panel for an LCD according to the second embodiment of the present invention, and an enlarged view of a portion mainly including a pixel and pads of the FIG. 2.
Figure 10:
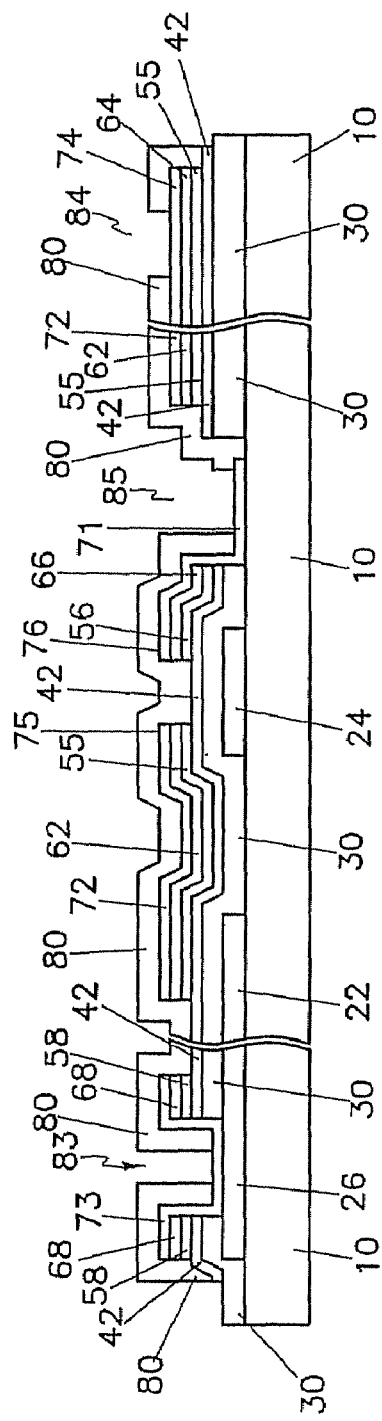
FIGS. 10 and 11 are cross-sectional views respectively taken along the line X-X' and XI-XI' of the FIG. 9.
Figure 11:
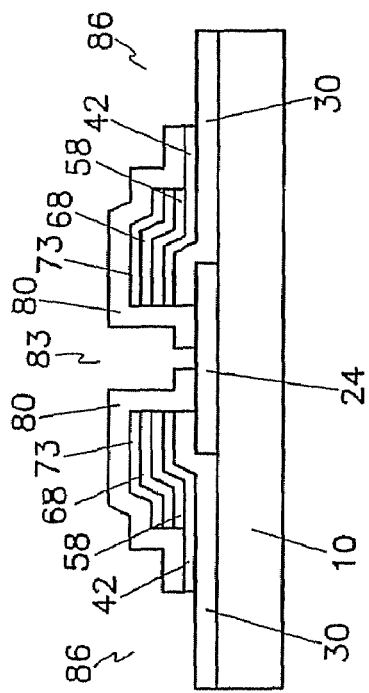

FIG. 9 is a layout view of a TFT panel for an LCD according to the second embodiment of the present invention and an enlarged view of a portion mainly including a pixel and pads of the FIG. 2, and FIGS. 10 and 11 are cross-sectional views respectively taken along the line X-X' and XI-XI' of the FIG. 9.

As shown in FIGS. 9 to 11, the structure of the TFT array panel of the second embodiment is almost the same as that of the first embodiment except for that around the pads. That is to say, between the pads, the gate insulating layer 30 is removed in the first embodiment, but is not removed in the second embodiment. In addition, in the second embodiment, the passivation layer 80 has an opening 86 marked as slanted creases, exposing the gate insulating layer 30 between the pads. Therefore, the pads are not connected to each other through the semiconductor layer.

Now, a manufacturing method of a thin film transistor array panel according to the second embodiment of the present invention will be described with reference to the FIGS. 12A to 13B and FIGS. 9 to 11 mentioned above.

Figure 12A:
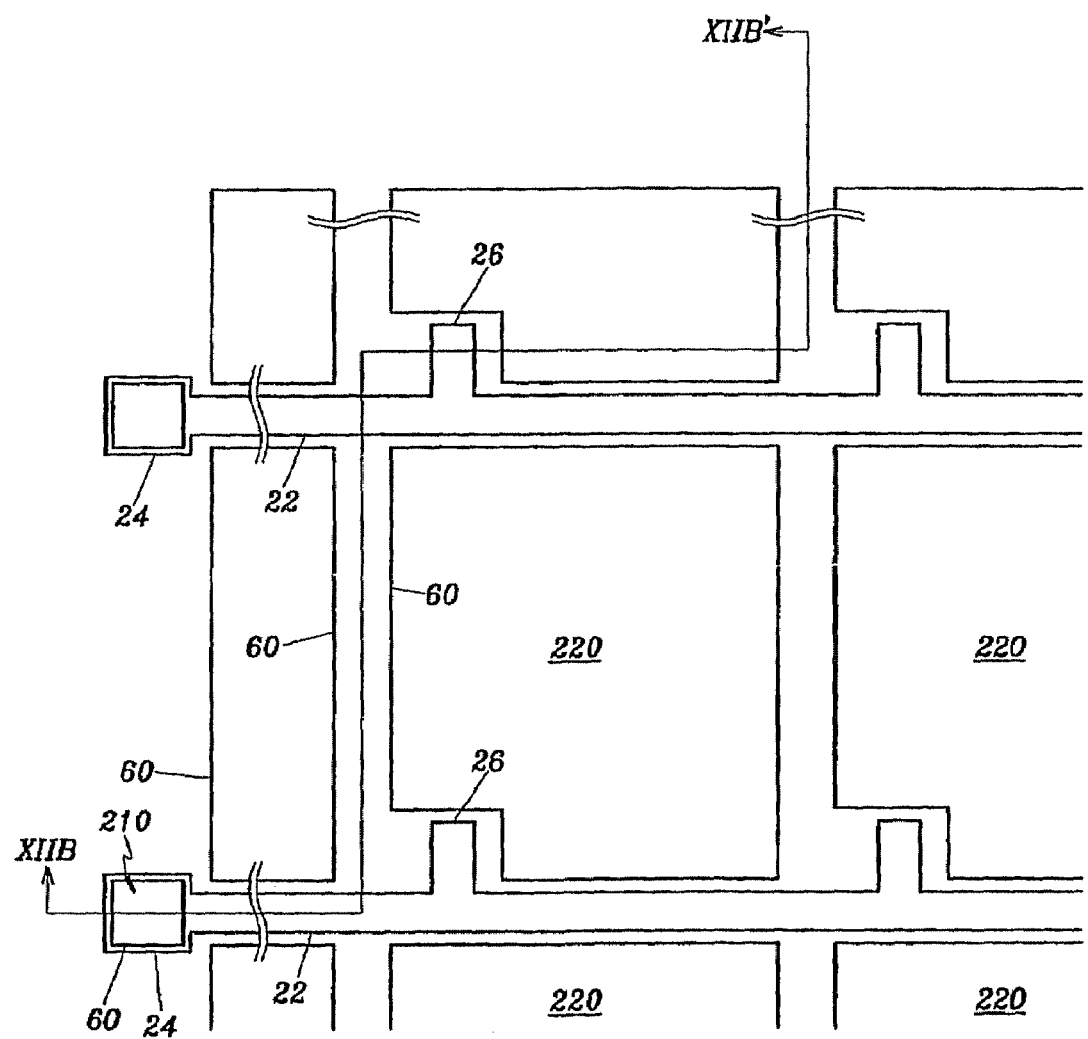
FIG. 12A is a layout view of a TFT panel in the first manufacturing step according to the second embodiment of the present invention.
Figure 12B:
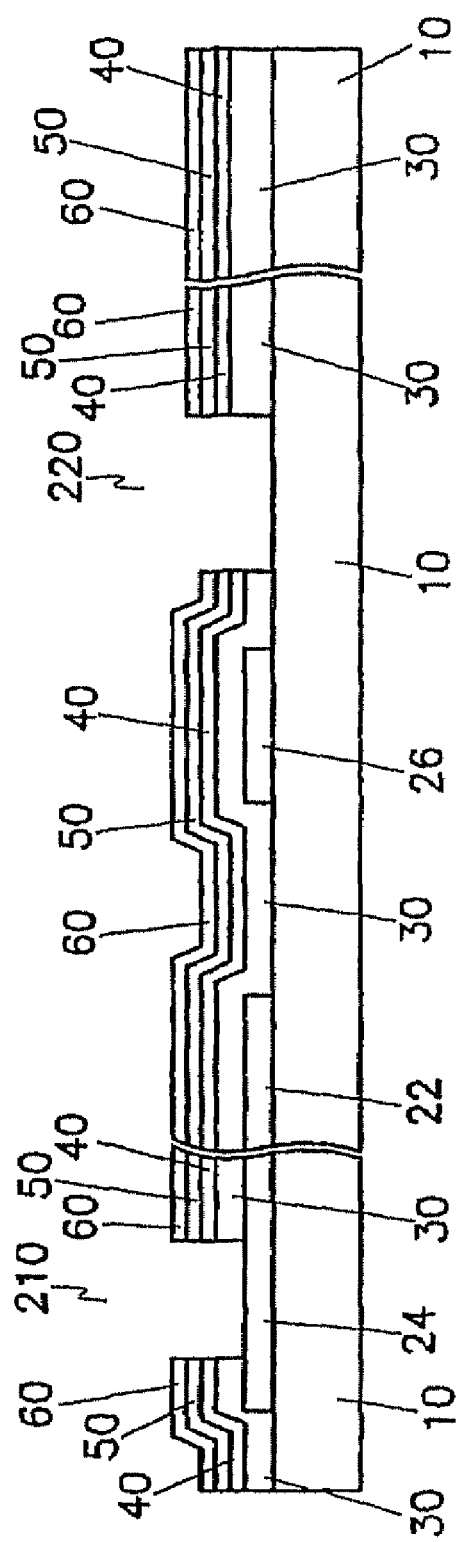
FIG. 12B is the cross-sectional view taken along the line XIIB-XIIB' of the FIG. 12A.
Figure 13A:
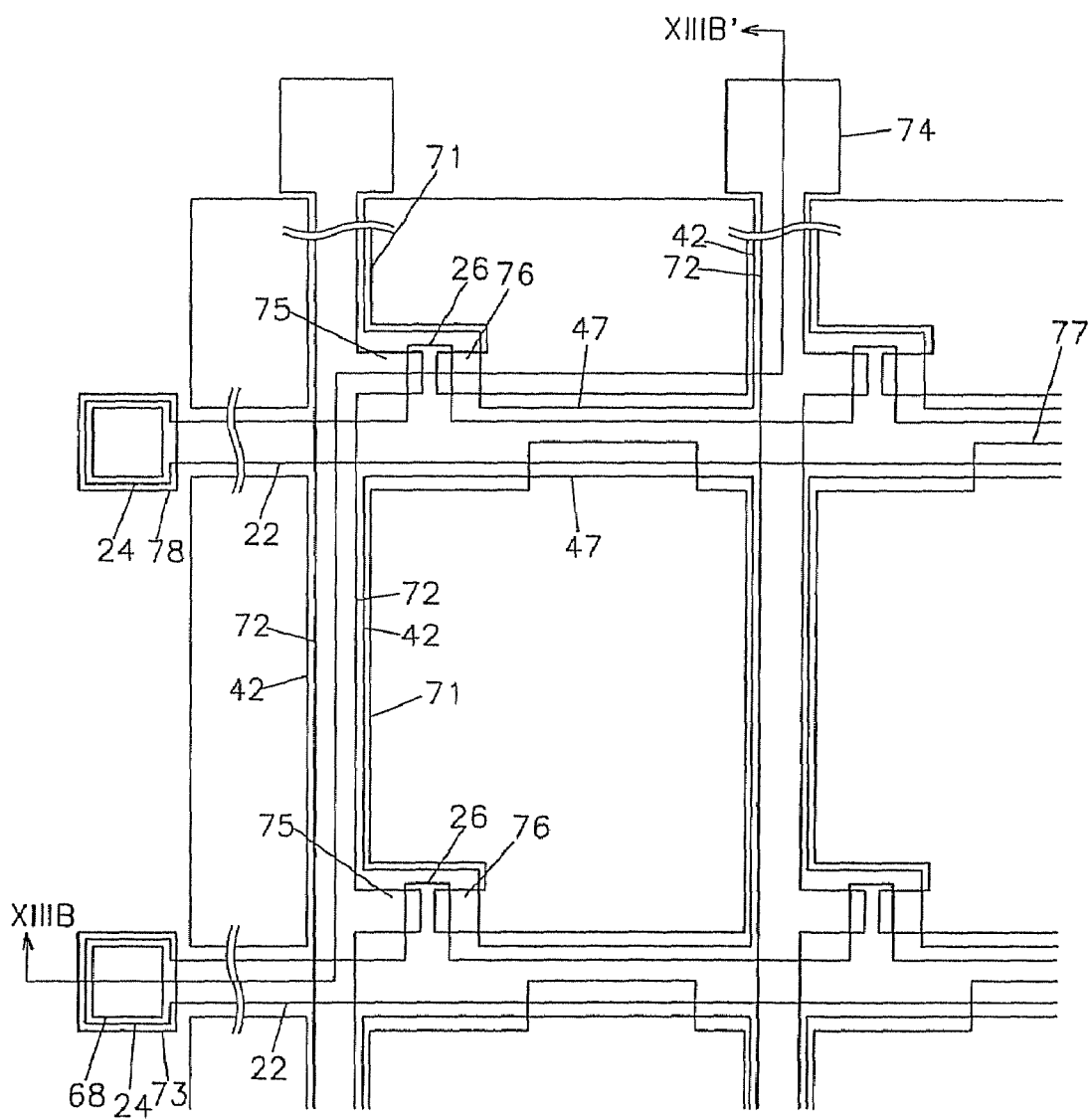
FIG. 13A is a layout view of a TFT panel in a manufacturing step following the FIGS. 12A and 12B.
Figure 13B:
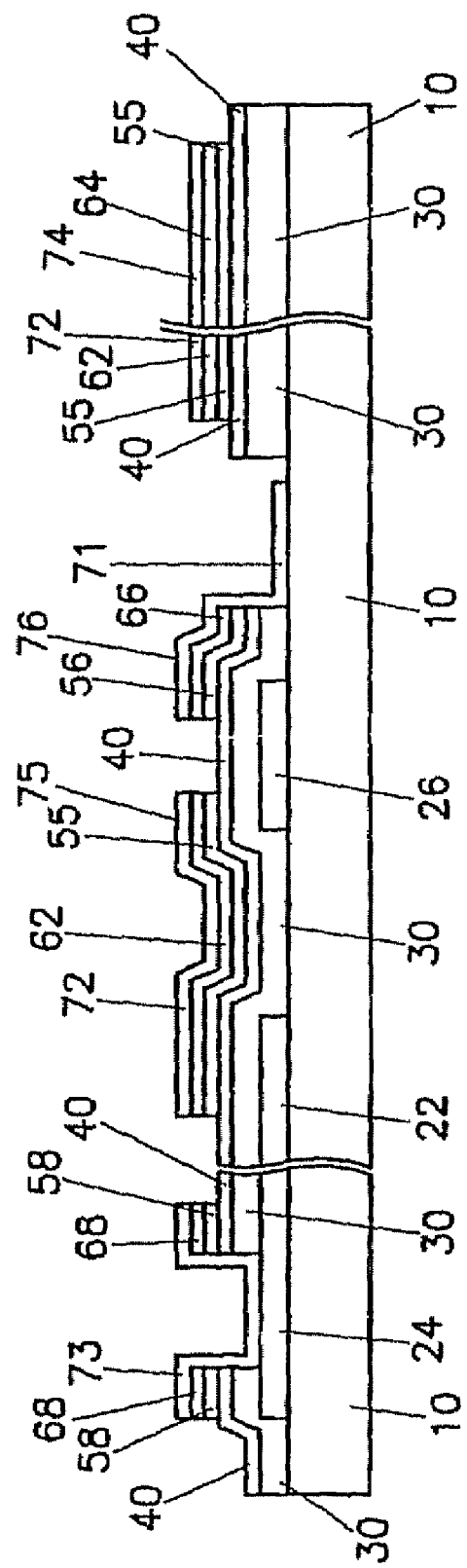
FIG. 13B is the cross-sectional view taken along the line XIIIB-XIIIB' of the FIG. 13A.

FIGS. 12A and 13A are layout views of a TFT panel and are sequentially arranged according to the manufacturing step of the second embodiment of the present invention, FIGS. 12B and 13B are respectively the cross-sectional views taken along the line XIIB-XIIB' of the FIG. 12A and XIIIB-XIIIB' of the FIG. 13A.

At first, like the first embodiment, a gate wire 22, 24 and 26 is formed. Then, four layers of a gate insulating layer 30, a semiconductor layer 40, an ohmic contact layer 50 and a data conductor layer 60 are sequentially deposited and patterned. At this time, as shown in FIGS. 12A and 12B, the four layers around pads are not removed.

Next, as shown in FIGS. 13A and 13B, an ITO layer is deposited and patterned by using the third mask and dry etch to form a conductive pattern 71, 72, 73, 74, 75, 76 and 77. Then, the portion not covered by the transparent conductor layer of the data conductor layer 60 and the ohmic contact layer 50 is etched by dry etch.

Next, as shown in FIGS. 9 to 12, a passivation layer 80 is deposited and patterned by using the fourth mask to form the openings 81, 82, 83, 84 and 85. Then, the semiconductor layer 40 exposed through the openings 81, 82 and 86 is etched to separate the portions of the semiconductor layer 40 under the data lines from each other and remove the portion between the pads.

In the first and the second embodiment, the edge of the pixel electrode 71 is covered by the passivation layer 80, but it may not be covered by the passivation layer 80. This case will be described by the third embodiment with reference to the FIGS. 14 and 15. FIG. 15 is a cross-sectional view taken along the line XV-XV' of the FIG. 14.

Figure 14:
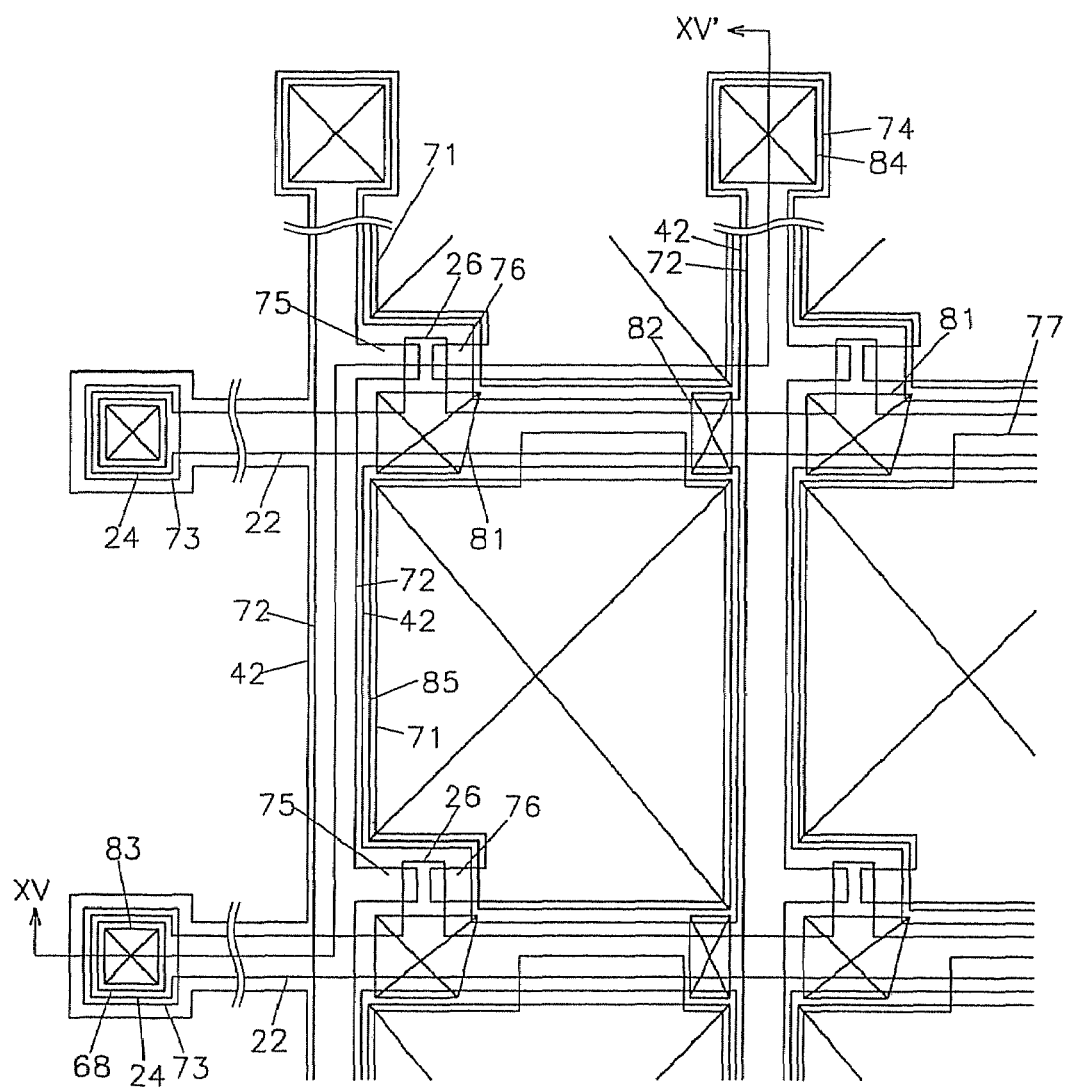
FIG. 14 is a layout view of a TFT panel for an LCD according to the third embodiment of the present invention, and an enlarged view of a portion mainly including a pixel and pads of the FIG. 2.
Figure 15:
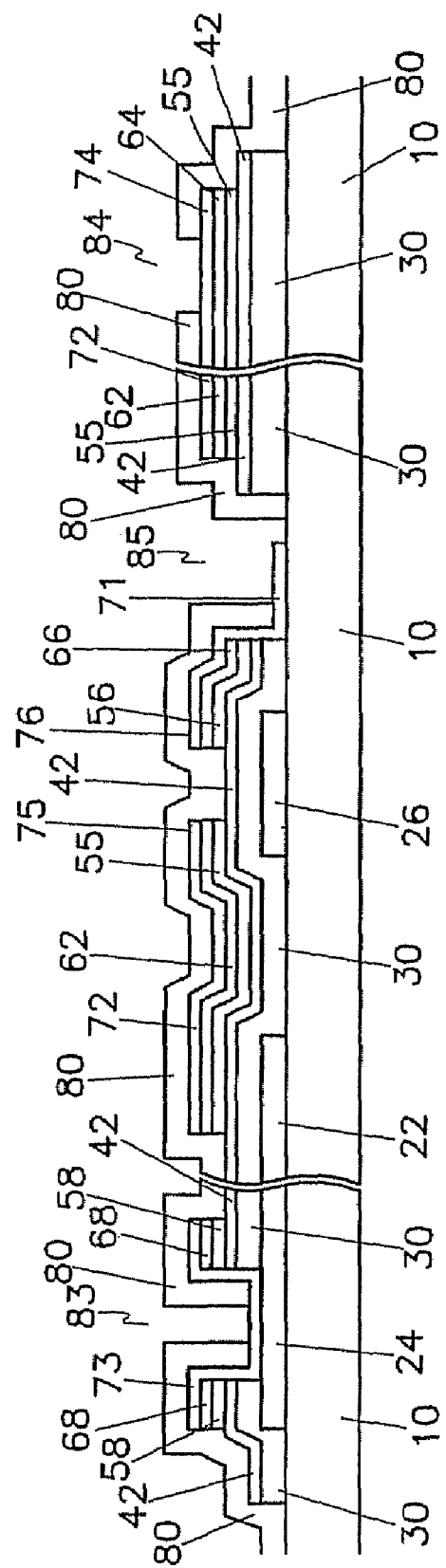
FIG. 15 is a cross-sectional view taken along the line XV-XV' of the FIG. 14.

As shown in FIGS. 14 and 15, an opening 85 of a passivation layer 80 exposes the edge of a pixel electrode 71. Therefore, the portion of a substrate 10 between the passivation 80 and the pixel electrode 71 is exposed. The other structure is almost the same as that of the first embodiment.

Such a structure is necessary for preventing the pixel electrode 71 from shortening with the data line 62 or the conductive pattern 72 on the data line 62 through the semiconductor layer 42. That is to say, although the pixel electrode 71 is formed on the semiconductor layer 42, which is under the data line 62 but both sides of which is not covered by the data line 62 by misalignment, the exposed portion of the semiconductor layer 42 through the opening 85 is removed by etch after forming the opening 85. Therefore, the portion of semiconductor layer under the pixel electrode 71 is separated from the portion under the data line 62.

The first through the third embodiments are about the previous gate type TFT array panel, but the present invention may also be applied to a separated common line type TFT array panel. This will be described in the fourth embodiment.

Figure 16:
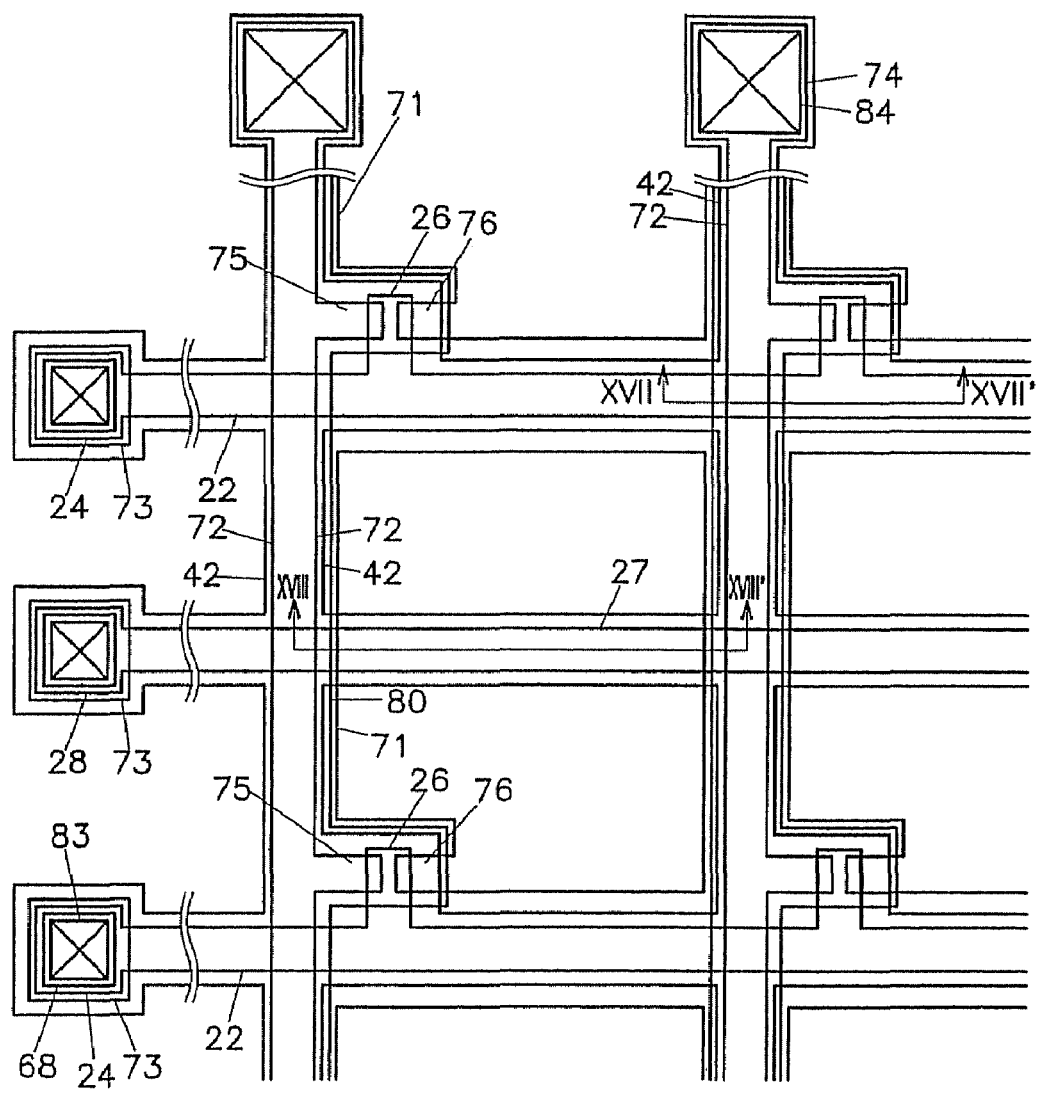
FIG. 16 is a layout view of a TFT panel for an LCD according to the fourth embodiment of the present invention, and an enlarged view of a portion mainly including a pixel and pads of the FIG. 2.

FIG. 16 is a layout view of a TFT panel for an LCD according to the fourth embodiment of the present invention. FIGS. 17 and 18 are cross-sectional views respectively taken along the line XVII-XVII', XVIII-XVIII' of the FIG. 16.

As shown in FIGS. 16 to 18, a storage wire 27 and 28 is formed on an insulating substrate 10 along with a gate wire 22, 24 and. 26. The storage wire 27 and 28 is made of the same material and is on the same layer with the gate wire 22, 24 and 26. The gate wire includes a gate line (scanning signal line) .22 extending in the horizontal direction, a gate pad 24 connected to an end of the gate line 22 and transmitting a scanning signal from an external circuit to the gate line 22, and a gate electrode 26 that is a part of thin film transistor. The storage wire includes a storage line 27, which is separated from and laid in parallel with the gate line 22, extending to a horizontal direction, and a storage pad 28 connected to the end of the storage line 27.

A gate insulating layer 30 is formed on the gate wire 22, 24 and 26 and the storage wire 27 and 28, and a semiconductor layer 42 and 49 is formed on the gate insulating layer 30.

The semiconductor pattern has two portions, 42 and 49. The first portion 42 is extending to a vertical direction and the second portion 49 is located between the two first portion 42 and on the storage line 27. The second portion 49 is isolated from the first portion 42.

An ohmic contact layer 55, 56, 58 and 59 is formed on the semiconductor pattern 42 and 49, and a data wire 62, 64, 66, 68 and 69 made of conductive materials such as Mo or MoW, Cr and Ta is formed on the ohmic contact layer pattern 55, 56, 58 and 59. The data wire has a data line 62 including a source electrode 65 and extending in the vertical direction, a data pad 64 connected to an end of data line 62, a drain electrode 66, a first isolated data conductor 68, and a second isolated data conductor 69 formed on the second portion 49 of the semiconductor layer. The ohmic contact layer pattern 55, 56, 58 and 59 is formed between the semiconductor layer 42 and 49 and the data wire 62, 64, 66, 68 and 69, and has the same layout as the data wire 62, 64, 65, 68 and 69.

On the other hand, the gate insulating layer 30, the semiconductor layer 42, the ohmic contact layer 58 and the first isolated data conductor 68 that are located on the gate pad 24 and the storage pad 28 have a contact hole to expose the gate pad 24 and the storage pad 28.

A conductive pattern 71, 72, 73, 74, 75, 76 and 77 made of a transparent and conductive material such as ITO (indium tin oxide) is formed on the data wire 62, 64, 66, 68 and 69 and the substrate 10 of pixel area, which is defined as an area surrounded by the gate line 22 and the data line 62. The conductive pattern 71, 72, 73, 74, 75, 76 and 77 includes a first pattern through a fourth pattern. The first pattern formed on the data line 62 and the data pad 64 is classified into a portion 75 on the source electrode 65 and elsewhere 72. The second pattern includes a portion 76 on the drain electrode 66 and a pixel electrode 71 on the pixel area. As shown in FIG. 16, The pixel electrode 71 is elongated to and formed on the second isolated data conductor 69 to form a storage capacitor by overlapping with the storage line 27. The third pattern 74 is formed on the data pad 64 to enhance the ohmic contact between the data pad 64 and an external circuit, and the fourth pattern 73 is formed on the gate pad 24 and the storage pad 28 exposed through the contact hole to enhance the ohmic contact between the gate pad 24 and an external circuit as well as the storage pad 28 and an external circuit.

A passivation layer 80 made of insulating material such as SiNx is formed on the described structure. The passivation layer 80 has an opening that exposes the pixel electrode 71 and the portion of the gate insulating layer 30 between the two adjacent data lines. As a result, the passivation layer 80 is formed along the data line 62. This opening is formed to remove the portion of the semiconductor layer 42 exposed through the opening, therefore, to prevent the two adjacent data line 62 from shortening to each other. At the same time, the pixel electrode 71 is exposed. The passivation layer 80 also has openings 83 and 84 respectively exposing the third and the fourth transparent conductive pattern 73 and 74.

The other structure is similar to the third embodiment.

The manufacturing method according to the fourth embodiment is almost the same as that of the first embodiment except that the storage wire 27 and 28 is formed along with the gate wire 22, 24 and 26.

Now, the fifth embodiment that applies the present invention to a ring gate type TFT array panel will be described.

Figure 19:
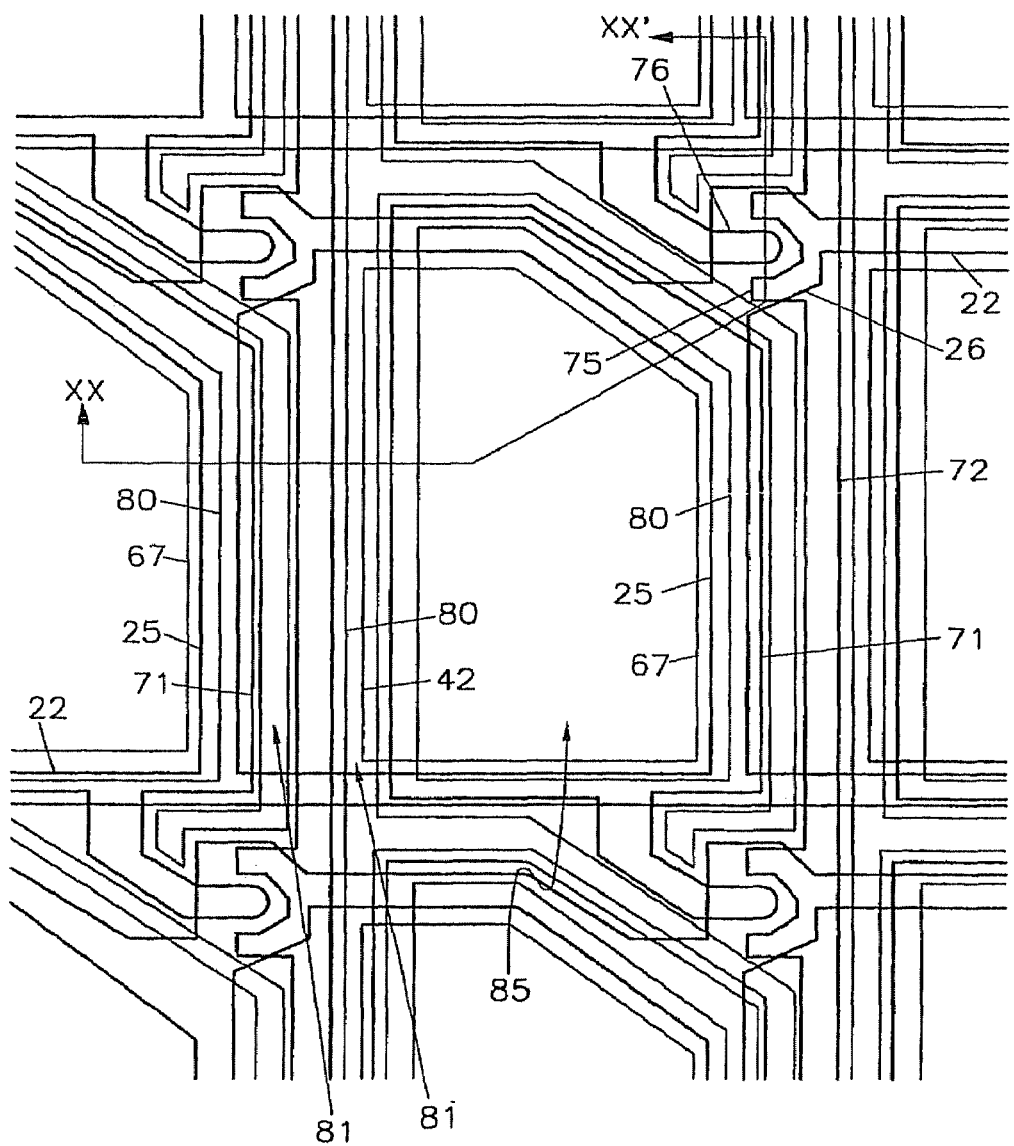
FIG. 19 is a layout view of a TFT panel for an LCD according to the fifth embodiment of the present invention, and an enlarged view of a portion mainly including a pixel of the FIG. 2.
Figure 20:
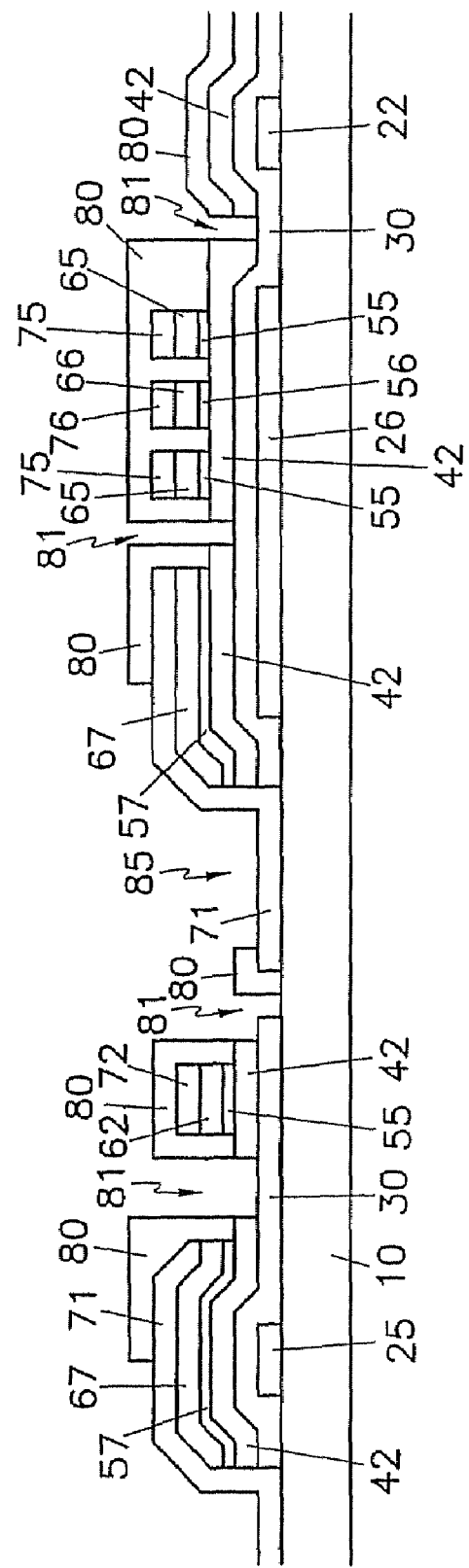
FIG. 20 is a cross-sectional view taken along the line XX-XX' of the FIG. 19.

FIG. 19 is a layout view of a TFT panel for an LCD according to the fifth embodiment of the present invention, FIG. 20 is a cross-sectional view taken along the line XX-XX' of the FIG. 19.

As shown in FIGS. 19 and 20, a gate wire 22, 25 and 26 extending to the horizontal direction is formed on an insulating substrate 10. The gate line 22 comprises a pair of lines, which are connected to each other through a gate line bridge 25. One of the line has a gate electrode. Though not shown in the FIGS. 19 and 20, a gate pad is formed at an end of the gate line 22 in the same way as the former embodiment.

A gate insulating layer 30 is formed on the gate wire 22, 25 and 26, and a semiconductor layer 42 is formed on the gate insulating layer 30. The semiconductor layer 42 has a first portion, which is extended to a vertical direction, and a second portion, which is separated from the first portion except for the channel part of TFT and overlapped with a part of the gate line 22 and the gate line bridge 25.

An ohmic contact layer 55, 56 and 57 is formed on the semiconductor layer 42, and a data wire 62, 65, 66 and 67 is formed on the ohmic contact layer 55, 56 and 57. The data wire 62, 65, 66 and 67 includes a data line 62, a source electrode 65 connected to the data line 62 and having a "U" shape concave part, a drain electrode 66 formed in the concave part of the source electrode 65, and a storage electrode 67 that is connected to the drain electrode 66 and overlapped with the second portion of the semiconductor layer 42. Though not shown in the FIGS. 19 and 20, a data pad is formed at an end of the data line 22 and an isolated data conductor is formed on the gate pad in the same manner as the former embodiment. The ohmic contact layer pattern 55, 56 and 57 is formed between the semiconductor layer 42 and the data wire 62, 65, 66 and 67, and has the same layout as the data wire 62, 65, 66 and 67.

On the other hand, the gate insulating layer 30, the semiconductor layer 42, the ohmic contact layer and the isolated data conductor that are located on the gate pad 24 have a contact hole to expose the gate pad 24.

A conductive pattern 71, 72, 75 and 76 made of a transparent and conductive material such as ITO (indium tin oxide) is formed on the data wire 62, 65, 66 and 67 and the substrate 10 of pixel area defined by the gate line 22 and the data line 62. At this time, the transparent conductive pattern 72, 75 and 76 has the same layout as the data wire 62, 65, 66 and 67 thereunder, except for the pixel electrode 71 and the portion of the transparent conductive pattern on the gate pad and the data pad. It is because the data wire 62, 65, 66 and 67 and the ohmic contact layer 55, 56 and 57 are patterned by using the transparent conductive pattern 72, 75 and 76 as etch mask. The pixel electrode 71 is elongated to and formed on the storage electrode 67, and overlapped with the gate line 22 and the gate line bridge 25 to form a storage capacitor. Like the former embodiment, the transparent conductive patterns on the gate pad and the data pad enhance the ohmic contact between the gate pad, the data pad and the external circuit.

A passivation layer 80 of insulating material such as SiNx is formed on the above-mentioned structure. The passivation layer 80 has an opening 85 exposing the pixel electrode 71 and a trench 81 that is exposing the gate insulating layer 30 and the substrate 10 and is formed along the edge of the pixel electrode 71. At this time, the trench 81 is extended to the vertical direction, and surrounds the pixel electrode 71 except for the portion connected to the drain electrode 66. The trench 81 is formed to prevent the two adjacent data line 62, and the pixel electrode 71 and the data line 62 from shortening to each other through the semiconductor layer 42 or ITO residue by removing the semiconductor layer 42 and ITO residue under the trench 81.

The manufacturing method of the fifth embodiment is the same as that of the first to the fourth embodiment in other aspects.

Other methods to achieve the object of the present invention will be described by the sixth through the eighth embodiments.

Figure 21:
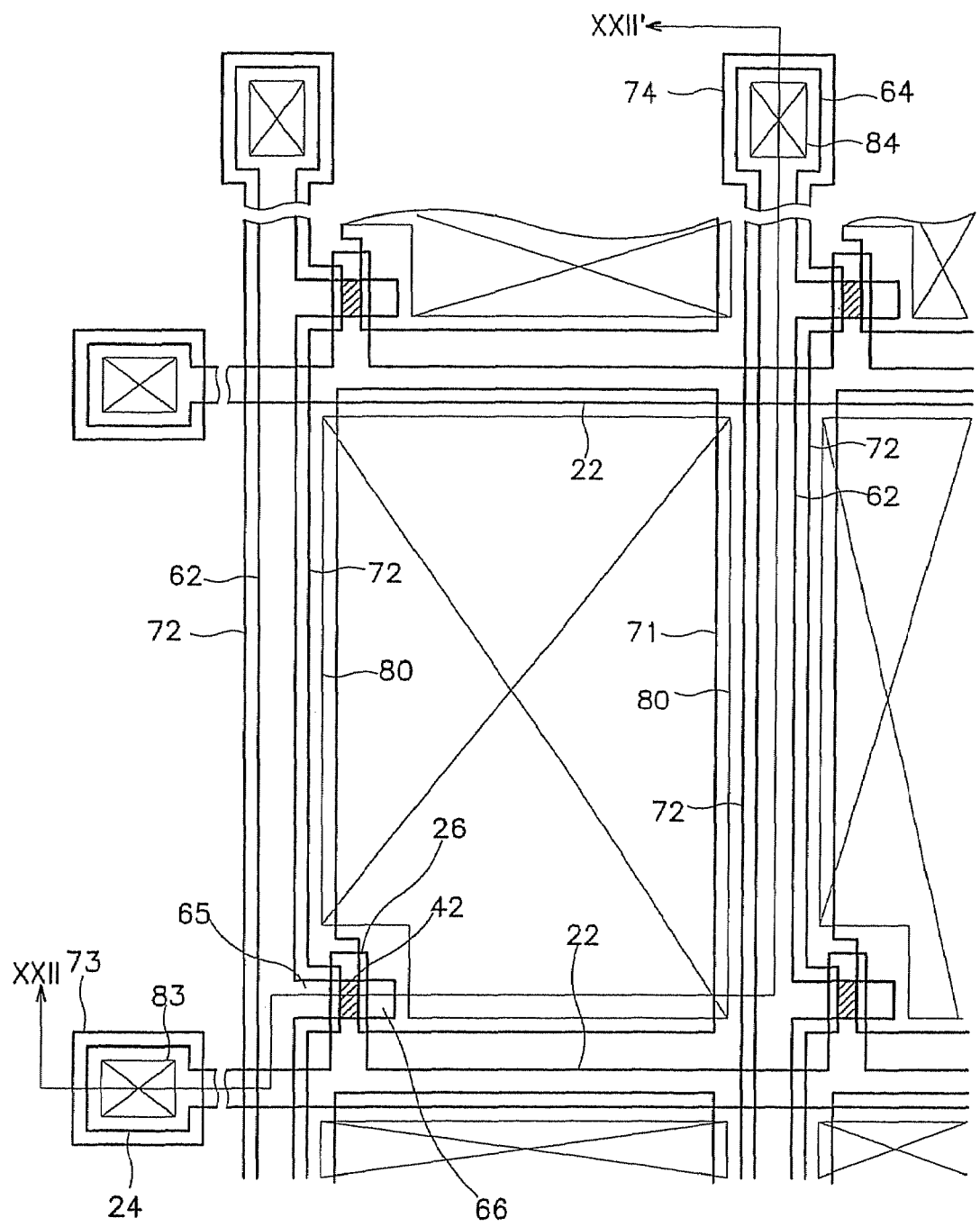
FIG. 21 is a layout view of a TFT panel for an LCD according to the sixth embodiment of the present invention, and an enlarged view of a portion mainly including a pixel and pads of the FIG. 2.
Figure 22:
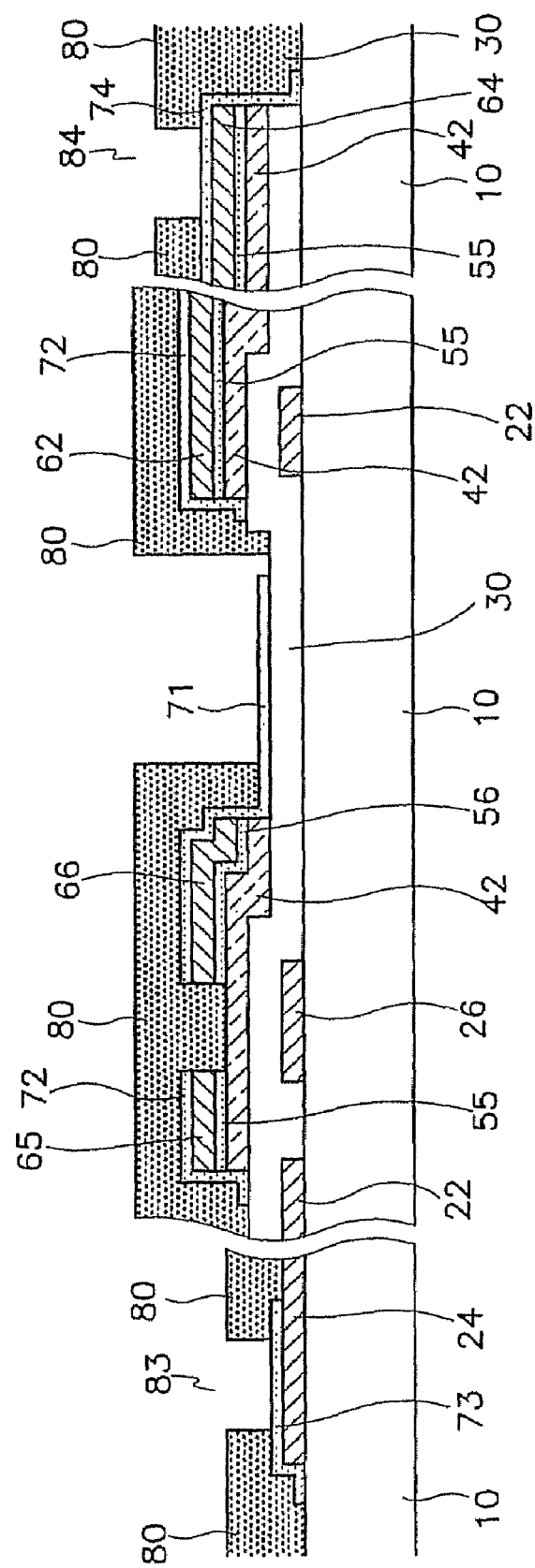
FIG. 22 is a cross-sectional view taken along the line XXII-XXII' of the FIG. 21.

The structure of TFT array panel according to the sixth embodiment will be described with reference to the FIGS. 21 and 22. FIG. 21 is a layout view of a TFT panel for an LCD according to the sixth embodiment of the present invention. FIG. 22 is a cross-sectional view taken along the line XXII-XXII' of the FIG. 21.

At first, gate wires of metal or conductive material such as aluminum (Al) or aluminum alloy, molybdenum (Mo) or molybdenum-tungsten (MoW), chromium (Cr) and tantalum (Ta) are formed on an insulating substrate 10. A gate wire includes a gate line (scanning signal line) 22 extending in the horizontal direction, a gate pad 24 formed at the end of the gate line 22 and transmitting a scanning signal from an external circuit to the gate line 22, and a gate electrode 26 that is a part of thin film transistor.

The gate wire 22, 24 and 26 may have a multiple-layered structure as well as a single-layered structure. When the gate wire 22, 24 and 26 has formed a multiple-layered structure, it is preferable that one layer is made of a material having a low resistivity and another layer is made of a material having a good contact with other materials. The double layers of Cr/Al (or Al alloy) and Al/Mo are such examples.

A gate insulating layer 30 of silicon-nitride (SiNx) is formed on the gate wire 22, 24 and 26, covering them. The gate insulating layer 30 covers the substrate 10 of the display area but does not cover the gate pad 24 and the substrate 10 of the peripheral area.

A semiconductor pattern 42 of such as hydrogenated amorphous silicon is formed on the gate insulating layer 30. An ohmic contact layer pattern 55 and 56 of amorphous silicon heavily doped with impurities such as phosphorus is formed on the semiconductor pattern 42.

A data wire 62, 64, 65 and 66 made of conductive materials such as Mo or MoW, Cr, Al or Al alloy, and Ta is formed on the ohmic contact layer pattern 55 and 56. The data wire has a data line 62 including a source electrode 65 and extending in the vertical direction, a data pad 64 connected to an end of data line 62 and transmitting image signals from an external circuit to the data line 62. The data wire also has a drain electrode 66 located at the opposite side of the source electrode 65 with respect to the gate electrode 22.

The data wire 62, 64, 65 and 66 may have a multiple-layered structure like the gate wire 22, 24 and 26. Of course, when the data wire has a multiple-layered structure, it is preferable that one layer is made of a material having a low resistivity and another is made of a material having a good contact with other materials.

The ohmic contact layer pattern 55 and 56 plays a role of reducing the contact resistance between the semiconductor pattern 42 and the data wire 62, 64, 65 and 66, having the same layout as the data wire 62, 64, 65 and 66. The semiconductor pattern 42 has the same layout as the data wire 62, 64, 65 and 66 and the ohmic contact layer pattern 55 and 56 except for the channel part between the source electrode 65 and the drain electrode 66.

A conductive pattern 71, 72, 73 and 74 made of a transparent and conductive material such as ITO (indium tin oxide) is formed on the data wire 62, 64, 65 and 66. The conductive pattern includes a pixel electrode 71 formed on the substrate 10 of the pixel area, surrounded by the gate line 22 and the data line 62. The pixel electrode 71 is extended to the drain electrode 66 and formed on it, overlapping the gate line 22 to make a storage capacitor. The conductive pattern 71, 72, 73 and 74 also includes a redundant data line, a redundant data pad and a redundant gate pad that respectively covers the data line, the data pad and the gate pad.

In the sixth embodiment, a passivation layer 80 covers the conductive pattern 72, 73, and 74 except for the pixel electrode 71, the semiconductor layer pattern 42 that is not covered by the conductive pattern 71, 72, 73 and 74, the redundant gate pad 73, and the gate wire 22, 24 and 26 that is not covered by the gate insulating layer 30. However, the passivation layer 80 may be formed to cover only the channel of the TFT that is a part of the semiconductor layer pattern 42 between the source electrode 65 and the drain electrode 66. The passivation layer 80 may be made of SiNx or an organic insulator such as an acrylic resin.

In this embodiment, the conductive pattern is made of a transparent material, but it can be made of an opaque material in a reflective type LCD.

Now, a method for manufacturing a thin film transistor array panel according to the sixth embodiment of the present invention will be described with reference to the FIGS. 23A to 29B and FIGS. 21 and 22 mentioned above.

Figure 23A:
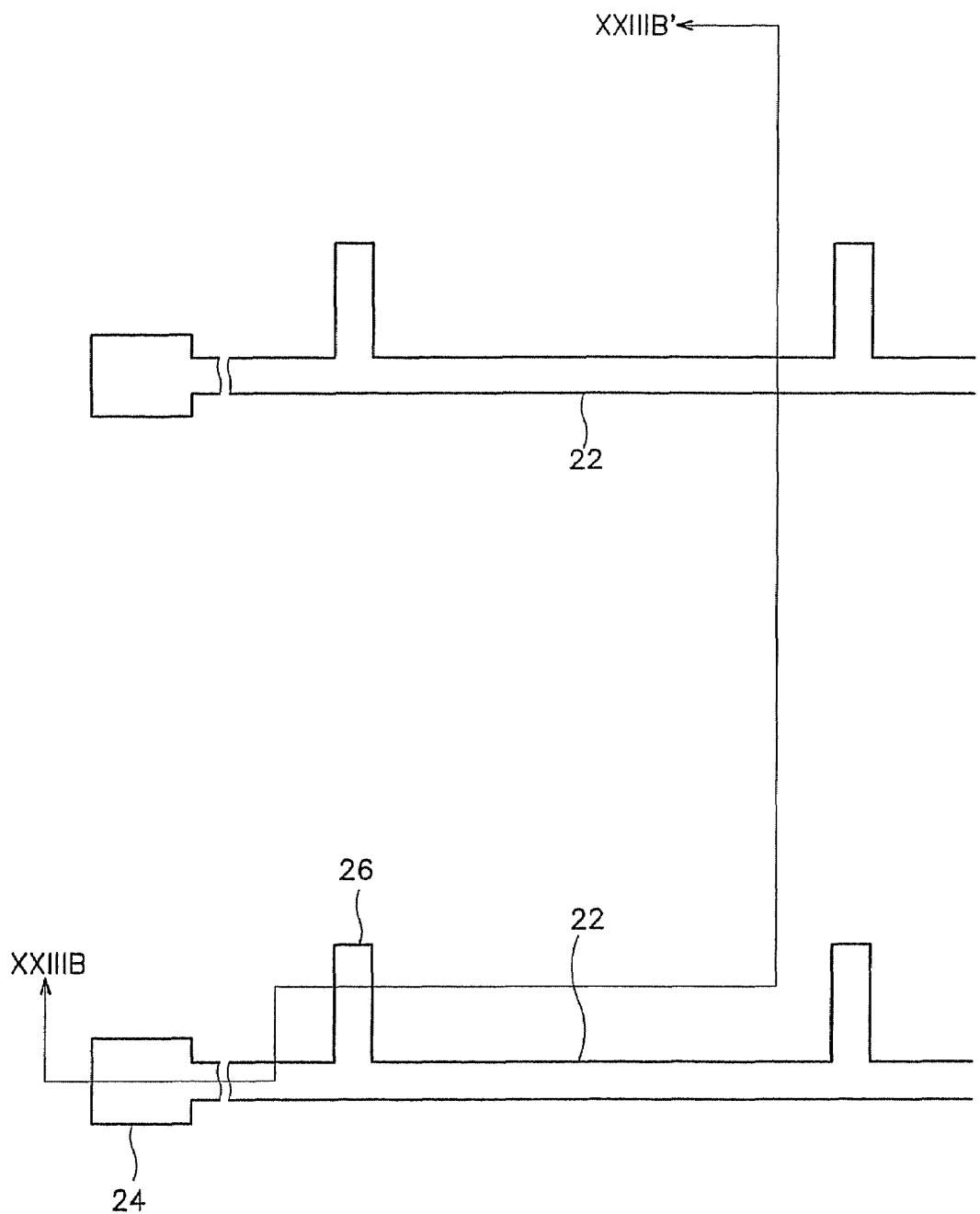
FIG. 23A is a layout view of a TFT panel in the first manufacturing step according to the sixth embodiment of the present invention.
Figure 23B:
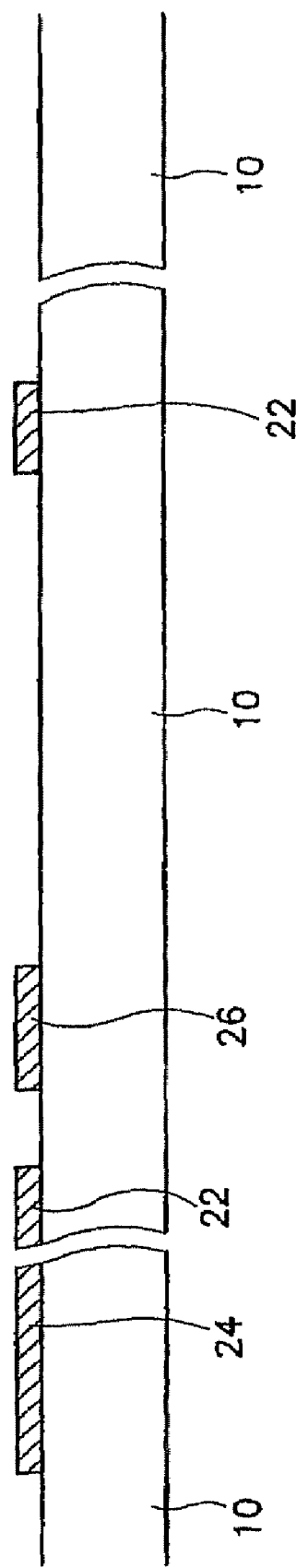
FIG. 23B is the cross-sectional view taken along the line XXIIIB-XXIIIB' of the FIG. 23A.

At first, as shown in FIGS. 23A and 23B, a layer of conductor such as a metal is deposited on a substrate 10 by such a method as sputtering to a thickness 1,000 Å to 3,000 Å. A gate wire including a gate line 22, a gate pad 24 and a gate electrode 26 is formed by dry etch or wet etch using the first mask.

Figure 24A:
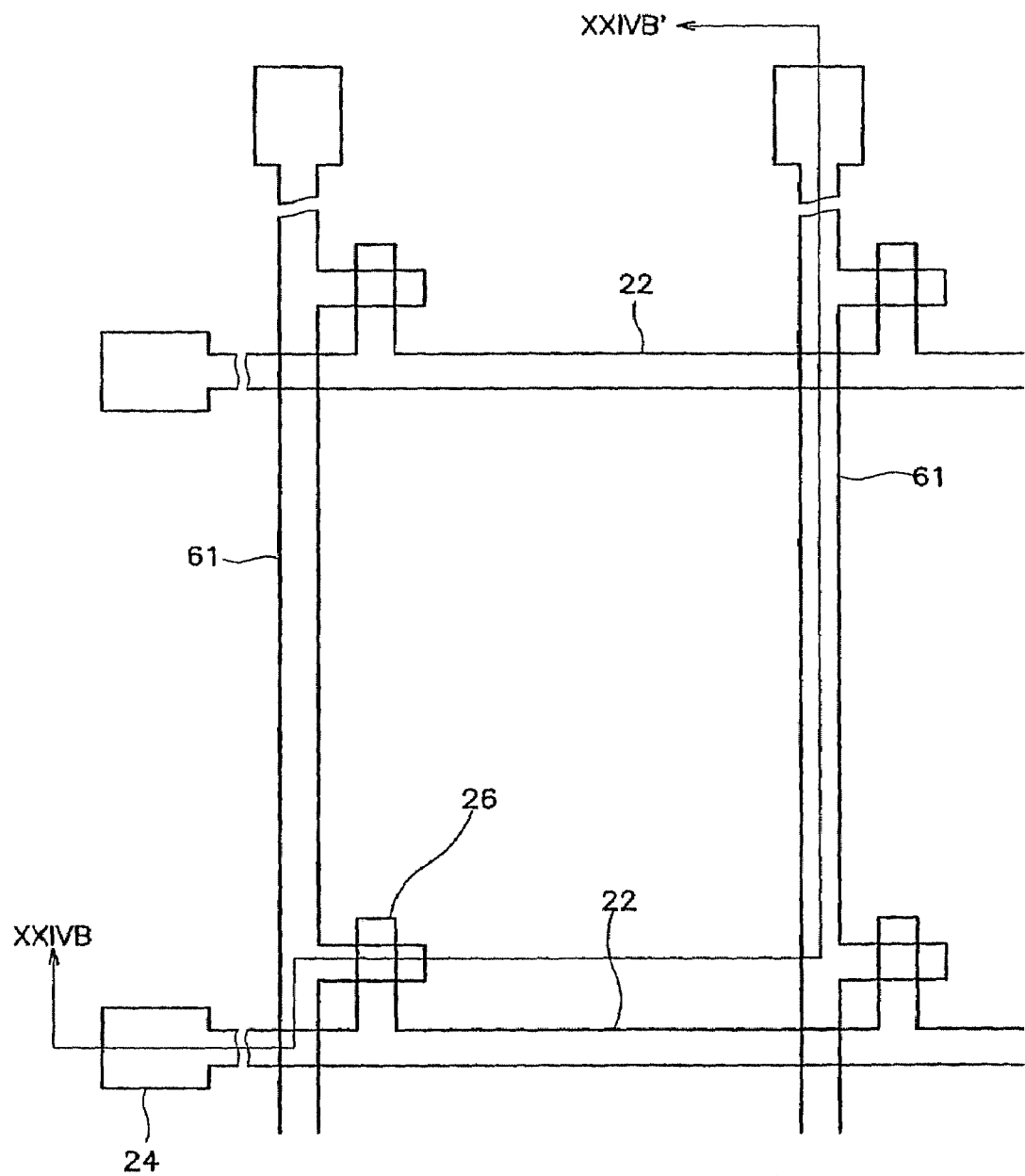
FIG. 24A is a layout view of a TFT panel in a manufacturing step next to the FIGS. 23A and 23B.

Next, as shown in FIGS. 24A and 24B, a gate insulating layer 30, a semiconductor layer 40 and an ohmic contact layer 50 are sequentially deposited to have the thickness of 1,500 Å to 5,000 Å, 500 Å to 2,000 Å and 300 Å to 600 Å respectively by such a method as chemical vapor deposition (CVD). Then, a metal layer 60 is deposited to have the thickness of 1,500 Å to 3,000 Å by such a method as sputtering. The metal layer 60, the ohmic contact layer 50, the semiconductor layer 40 and the gate insulating layer 30 are patterned to form a metal layer pattern 61, a first ohmic contact layer pattern 51 and a semiconductor layer pattern 42 thereunder, as shown in FIG. 28. At this time, the metal layer pattern 61 is similar to the completed data wire except that a source electrode and the drain electrode are not separated yet. In the peripheral area P, the metal layer 70, the ohmic contact layer 50, the semiconductor layer 40 and the gate insulating layer 30 except for the metal layer pattern 61 and the underlying layers are removed. However, in the display area D, the gate insulating layer 30 remains as well as the metal layer pattern 61 and the underlying layers. For this purpose, a photoresist (PR) pattern is formed to have a thickness that varies depending on the location. The layers under the PR pattern are dry etched using the PR pattern as an etch mask. It will be described with reference to the FIGS. 24B to 27.

At first, a PR layer, preferably positive, is coated to a thickness of 5,000 Å to 30,000 Å on the metal layer 60, and exposed to light through the third mask 300, 410 and 420. As shown in the FIG. 24B, the PR layer in the display area D are different from that in the peripheral area P. In concrete, in the display area D, polymers in exposed portion C are partly resolved from the surface to a certain depth, remaining the polymer below the depth intact. However, in the peripheral area P, polymers in exposed portion B are entirely resolved from the surface to the bottom. At this time, the metal layer 60 under the exposed portions C and B is subject to being removed.

For this purpose, a mask 300 that will be aligned on the display area D may have a different structure from masks 410 and 420 that will be aligned on the peripheral area P. Three of such methods will be described.

Figure 25A:
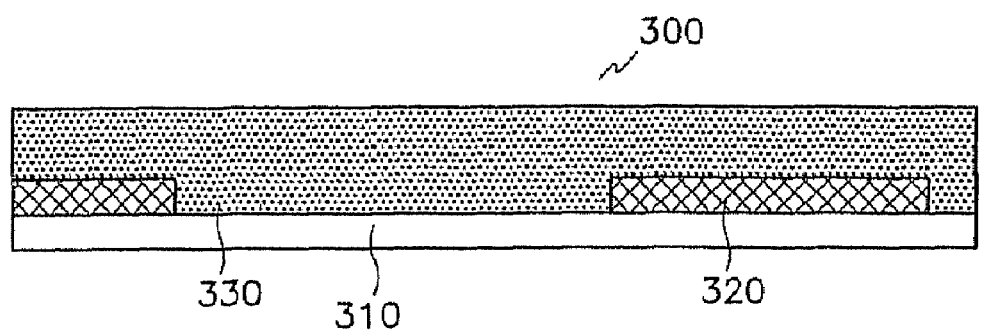
FIGS. 25A and 25B, FIGS. 26A and 26B and FIG. 27 are respectively cross-sectional views of photomasks used in the manufacturing step of FIGS. 24A and 24B.
Figure 25B:
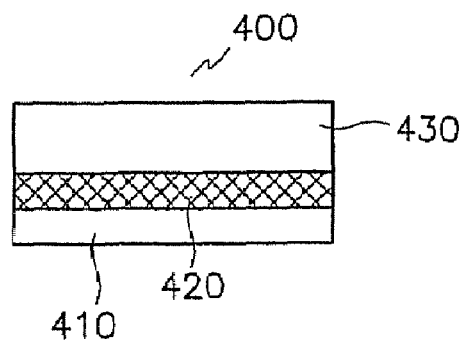

At first, as shown in FIGS. 25A and 25B, masks 300 and 400 include normal substrates 310 and 410, opaque pattern layer 320 and 420 of such as Cr thereon, and pellicles 330 and 430 covering the opaque pattern layer 320 and 420 and the exposed substrates 310 and 410. The light transmittance of pellicle 330 on the mask 300 for the display area D is lower than that of the pellicle 430 on the mask 400 for the peripheral area P. It is preferable that the light transmittance of pellicle 330 is 10% to 80%, more preferably 20% to 60%, of the light transmittance of pellicle 430.

Figure 26A:
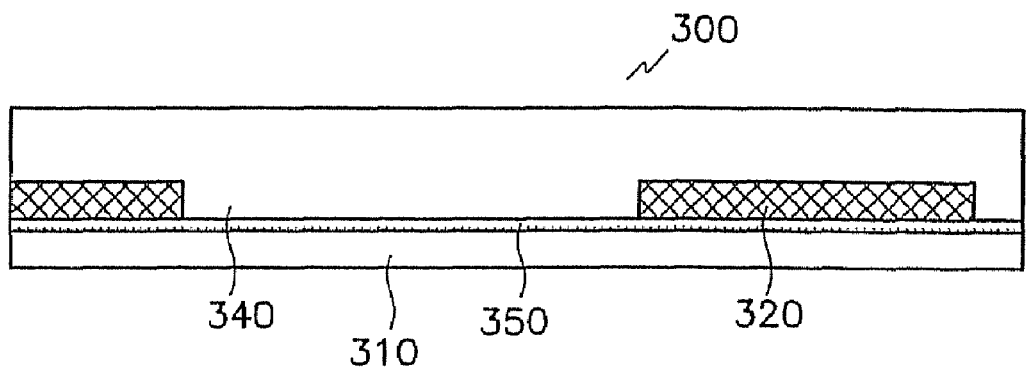
Figure 26B:
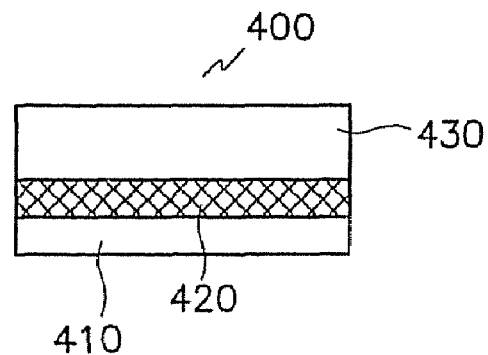

Next, as shown in FIGS. 26A and 26B, a Cr layer 350 remains to a thickness of 100 Å to 300 Å on the entire mask 300 for the display area D to reduce the light transmittance, and the mask 400 for the peripheral area P does not have the Cr layer 35 remaining. At this time, the light transmittance of the pellicle 340 for the mask 300 may be equal to that of the pellicle 430.

A mixed way of above two methods may be available.

Above two methods are available for a multi-shot exposure using a stepper, since the mask for the display area D and that of the peripheral area P may be different pieces. At this time, the thickness of the PR layer may be controlled by adjusting the exposure time.

However, the display area D and the peripheral area P may be exposed to light through one mask. A mask for this method will be described with reference to the FIG. 27.

Figure 27:
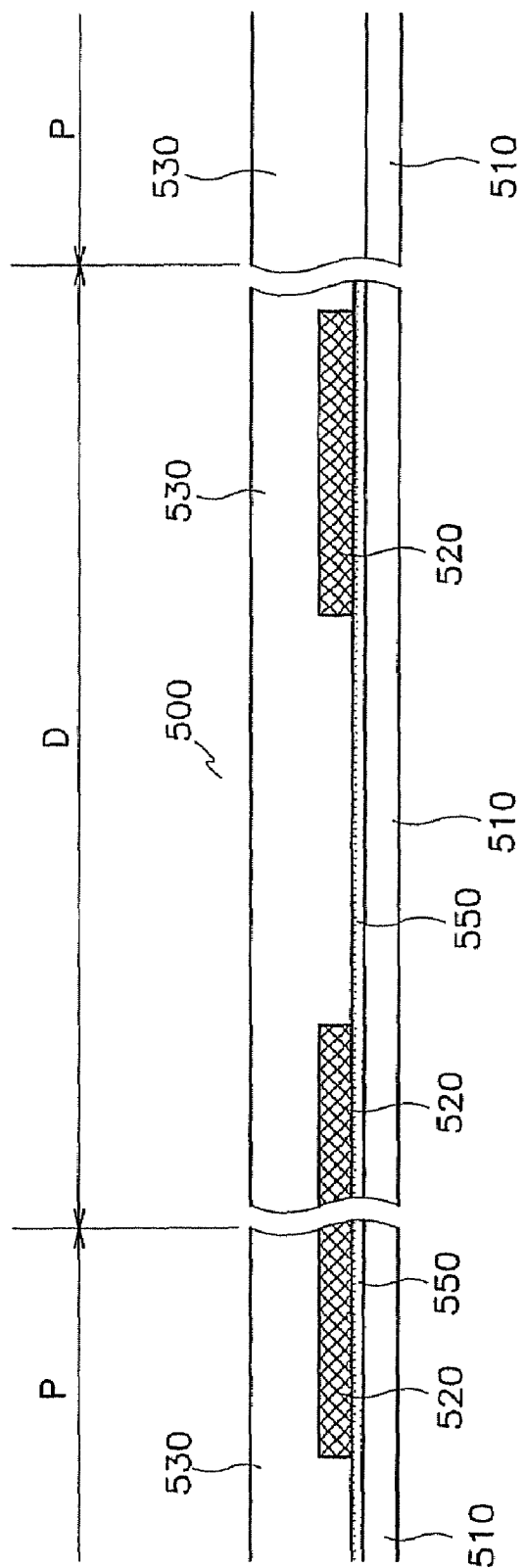
Figure 28:
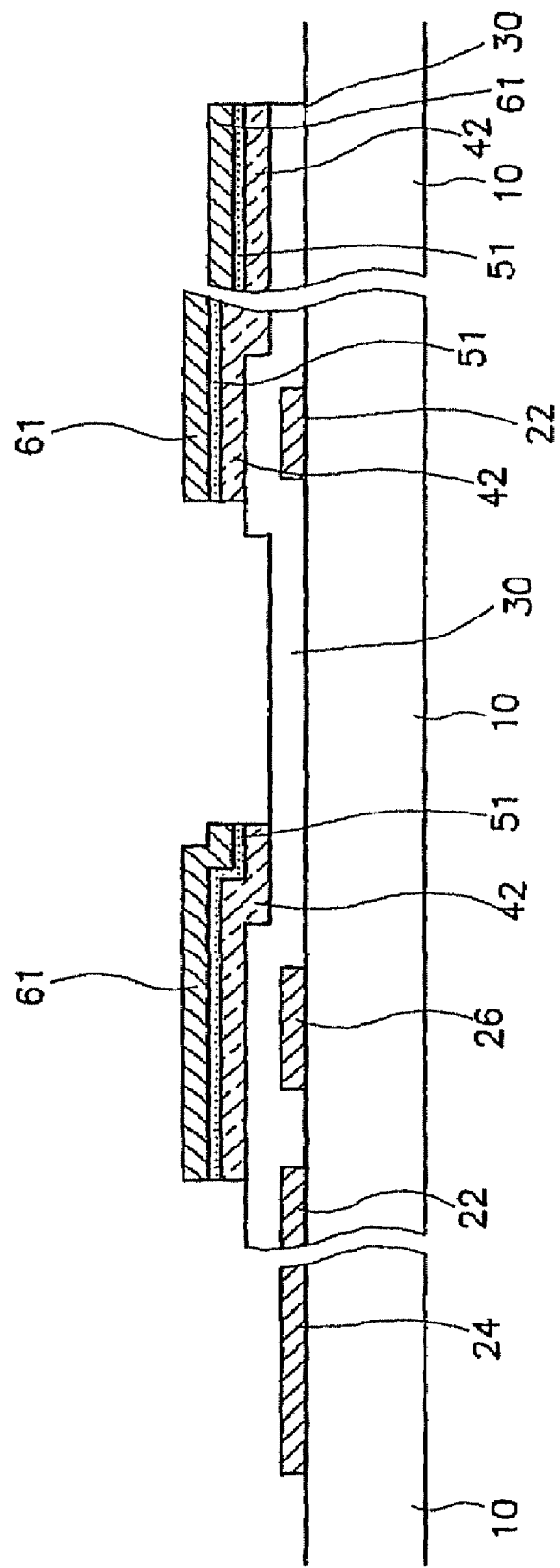
FIG. 28 is the cross-sectional view taken along the line XXIVB-XXIVB' of the FIG. 24A in the manufacturing step following the FIG. 24B.

As shown in FIG. 27, a transmittance controllable layer 550 is formed on a substrate 510 for 500, and a pattern layer 520 is formed on the transmittance controllable layer 550. The transmittance controllable layer 550 is formed not only under the pattern layer 520 but also on the whole area that is going to be aligned on the display area D, but only under the pattern layer 520 on the area that is going to be aligned on the peripheral area P. As a result, at least two patterns having a thickness different from each other are formed on the substrate 510.

A transmittance controllable layer may be formed on the area aligned on the peripheral area P. At this time, the transmittance of the transmittance controllable layer for the peripheral area P should be higher than that of the transmittance controllable layer for the display area D.

To manufacture such a photomask 500 having a transmittance controllable layer 550, the transmittance controllable layer 550 and a pattern layer 520 that has an etch ratio different from the transmittance controllable layer 550 are sequentially piled up on the substrate 500. A PR layer (not shown) is coated on the whole substrate 500, exposed to light and developed. Then the pattern layer 520 is etched to obtain the completed photomask 500 by using the PR layer as etch mask.

In other way, the light transmittance may be controlled by using a mask that has a slit or a lattice pattern smaller than the resolution of exposing light.

The PR layer is exposed and developed to form a PR pattern having different thickness depending on the location, as shown in FIG. 25B. In concrete, there is no PR layer on the peripheral area except for where the metal layer pattern 61 will be formed. A thick PR layer A is formed on which the metal layer pattern 61 will be formed. A thin PR layer C is formed elsewhere of the display area D.

At this time, it is preferable that the thickness of the thin PR layer C is ¼ to ½ of the original thickness, in other words 350 Å to 10,000 Å, and more preferably 1,000 Å to 6,000 Å. For example, when the original thickness of the PR layer is 16,000 Å to 24,000 Å, a thin PR layer having a thickness of 3,000 Å to 7,000 Å may be obtained by setting the transmittance to 30%. Since the thickness of the PR layer should be decided depending on the dry etch condition, the pellicle and the thickness of the remaining Cr layer, the transmittance of the transmittance controllable layer and the exposure time should be controlled depending on the etch condition.

The thin PR layer may be formed by reflow. At this time, a normal exposure and a normal development may be used.

Then, the PR pattern and the underlying layers, in other words, the metal layer 60, the ohmic contact layer 50, the semiconductor layer 40 and the gate insulating layer 30 are dry etched.

At this time, as mentioned above, portion A of the PR pattern should remain, and the metal layer 60, the ohmic contact layer 50, the semiconductor layer 40 and the gate insulating layer 30 under portion B should be removed. The metal layer 60, the ohmic contact layer 50 and the semiconductor layer 40 under portion C should be removed but the gate insulating layer 30 under the C portion should remain.

To achieve this structure, the exposed metal layer 60 of peripheral area is removed to expose the ohmic contact layer 50 by dry etch or wet etch. Next, the PR layer and the underlying layers are etched by a dry etch. The PR layer, the ohmic contact layer 50 and the semiconductor layer 40 can be etched at a time. At this time, it is etched until the thin PR layer C is wholly removed and the underlying metal layer 60 is exposed. At this time, the exposed ohmic contact layer 50 and the underlying semiconductor layer 40 are also etched. By the etch, the semiconductor layer 40 may remain to a certain thickness or wholly removed to expose the gate insulating layer 30. The gate insulating layer 30 may also be etched to some extent, depending on the etch condition and the thickness of the layers 40 and 50. At this time, the thick PR layer A is also etched to some extent. Next, the exposed metal layer 60 under portion C is removed to expose the ohmic contact layer 50 by dry etch or wet etch. The ohmic contact layer and the underlying layers are etched by dry etch. The ohmic contact layer 50, the semiconductor layer 40 and the gate insulating layer 30 can be etched at a time. It is etched until the gate pad 24 is exposed. At this time, the ohmic contact layer 50 and the semiconductor layer 40 under portion C are removed.

Therefore, the metal layer pattern 61, the first ohmic contact layer pattern 51 and the semiconductor layer pattern 42 of the display area is formed, and the metal layer 60, the ohmic contact layer 50, the semiconductor layer 40 and the gate insulating layer 30 of the peripheral area except for the metal layer pattern 61 is removed, by one photolithography step.

Figure 29A:
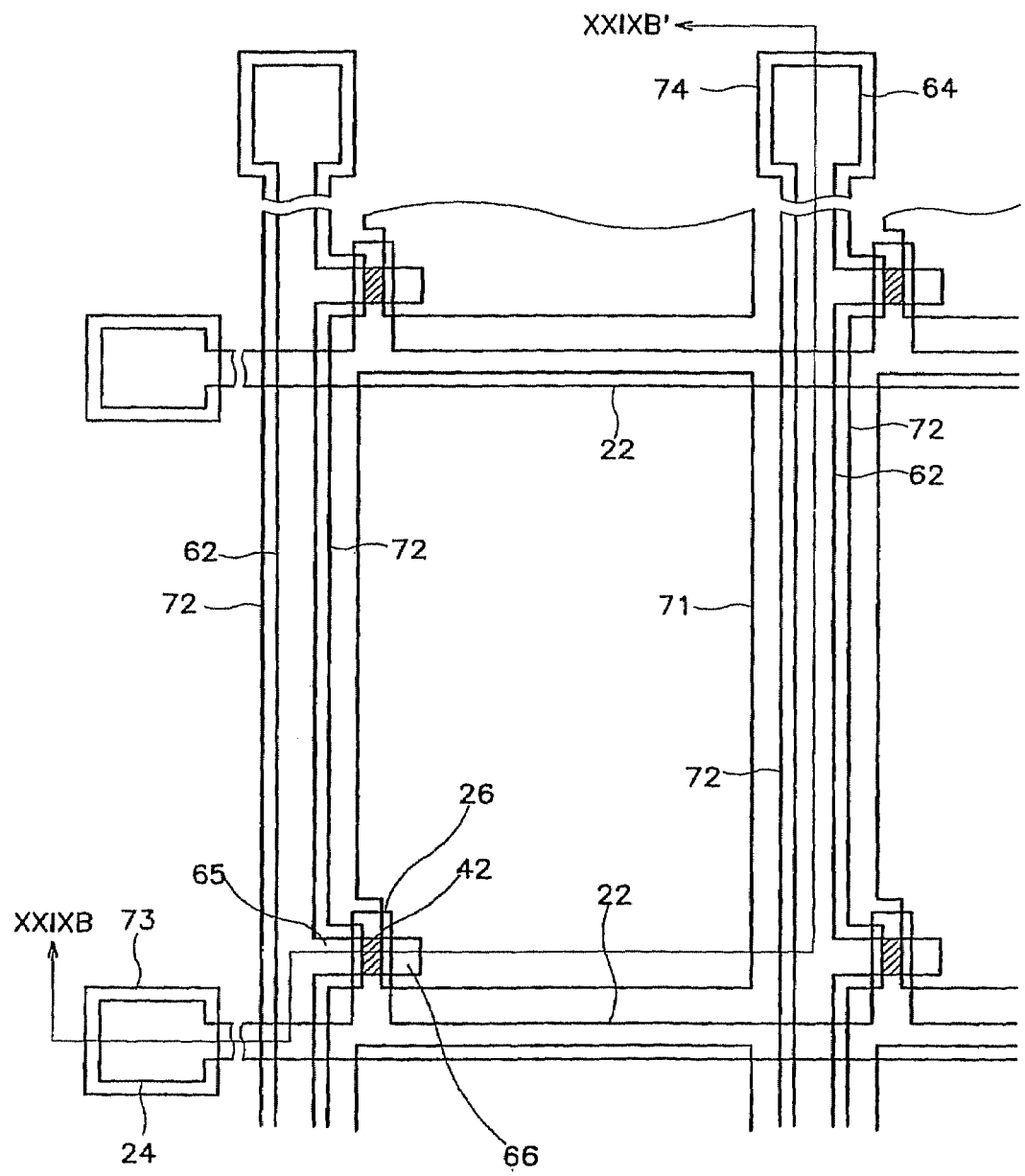
FIG. 29A is a layout view of a TFT panel in a manufacturing step following the FIG. 28.
Figure 29B:
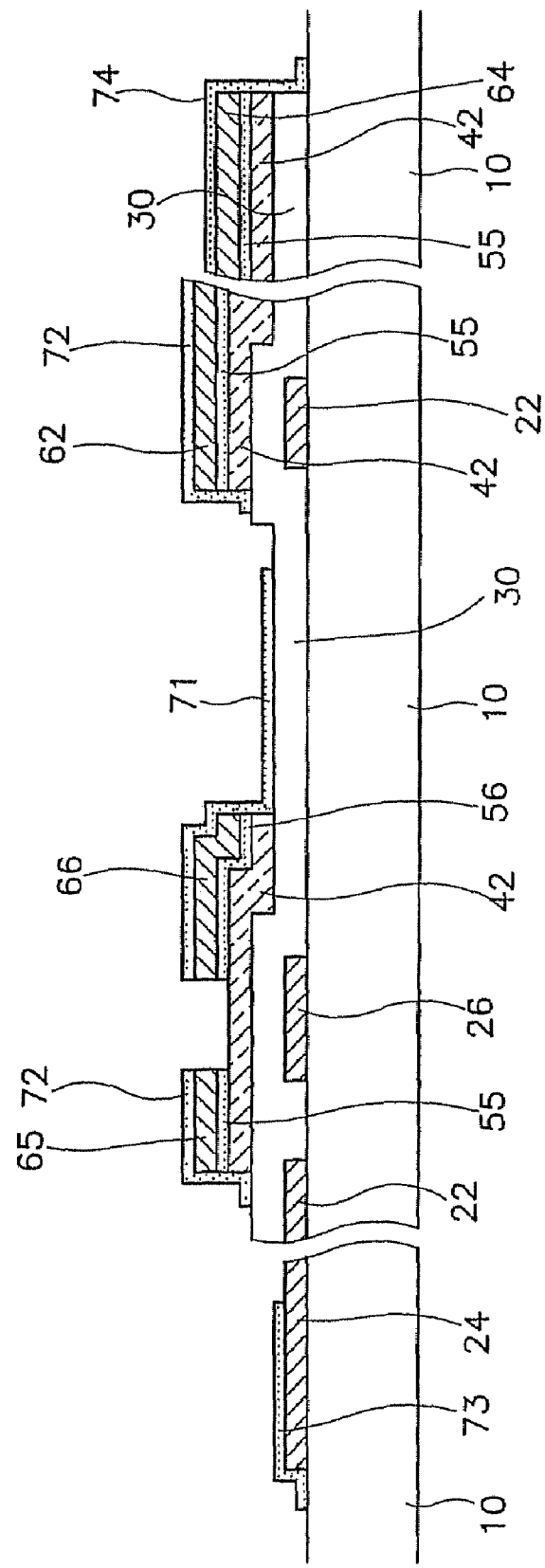
FIG. 29B is the cross-sectional view taken along the line XXIXB-XXIXB' of the FIG. 29A.

Next, after the remaining PR is removed, an ITO layer is deposited to have a thickness of 400 Å to 500 Å by such a method as sputtering. Then, the ITO layer is patterned to form the conductive pattern 71, 72, 73 and 74 as shown in FIGS. 29A and 29B. At this time, the portion between the pixel electrode 71 and the redundant data line 72 of the metal layer pattern 61 is exposed. The exposed metal layer pattern 61 is wet etched to separate the source electrode 65 from the drain electrode 66, exposing the first ohmic contact layer pattern 51 thereunder. Then the exposed first contact pattern 51 is etched out to expose the semiconductor layer 42, achieving a complete TFT.

As a last step, a passivation layer 80 of over 3,000 Å is formed by CVD (chemical vapor deposition) of SiNx or spin coating an organic insulating layer and patterned using the fourth mask. At this time, the passivation layer 80 may be made of a photo-definable material. In this case, the passivation layer 80 may be patterned only by exposure and development without laying a photoresist layer. This step of patterning exposes the pixel electrode 71, the redundant gate pad 73 and the redundant data pad 74.

As described above, the number of photolithography step is reduced by patterning at the same time the gate insulating layer 30 covering the gate pad 24 along with the metal layer pattern 61, the first ohmic contact layer pattern 51 and the semiconductor layer pattern 42.

In the sixth embodiment, the TFT array panel has pixel electrodes only. But the present invention may also be applied to the TFT array panel having common electrodes as well as pixel electrodes. It will be described by the seventh embodiment with reference to FIGS. 30 to 35C.

At first, the structure of the TFT array panel according to the seventh embodiment will be described.

Figure 30:
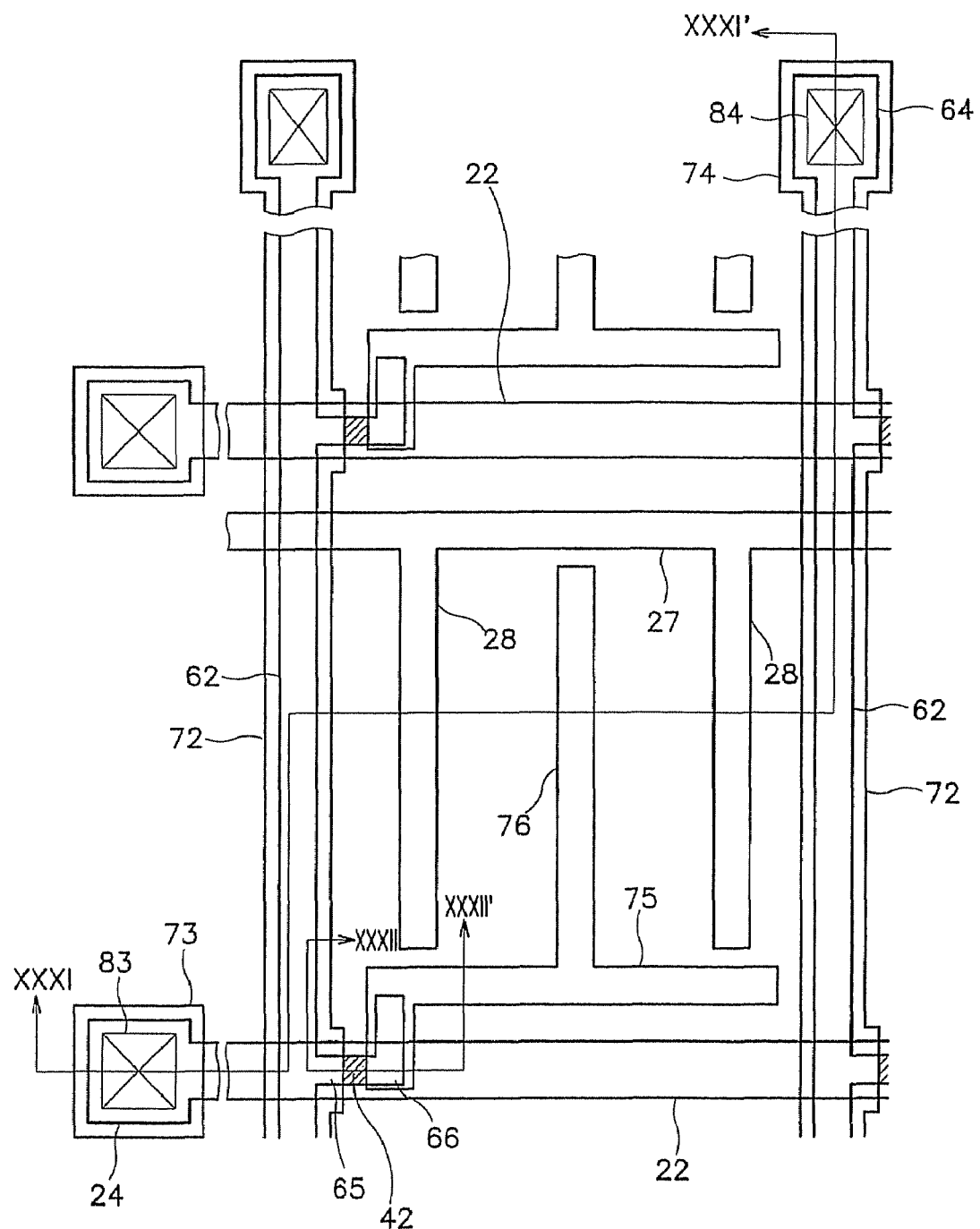
FIG. 30 is a layout view of a TFT panel for an LCD according to the seventh embodiment of the present invention.
Figure 31:
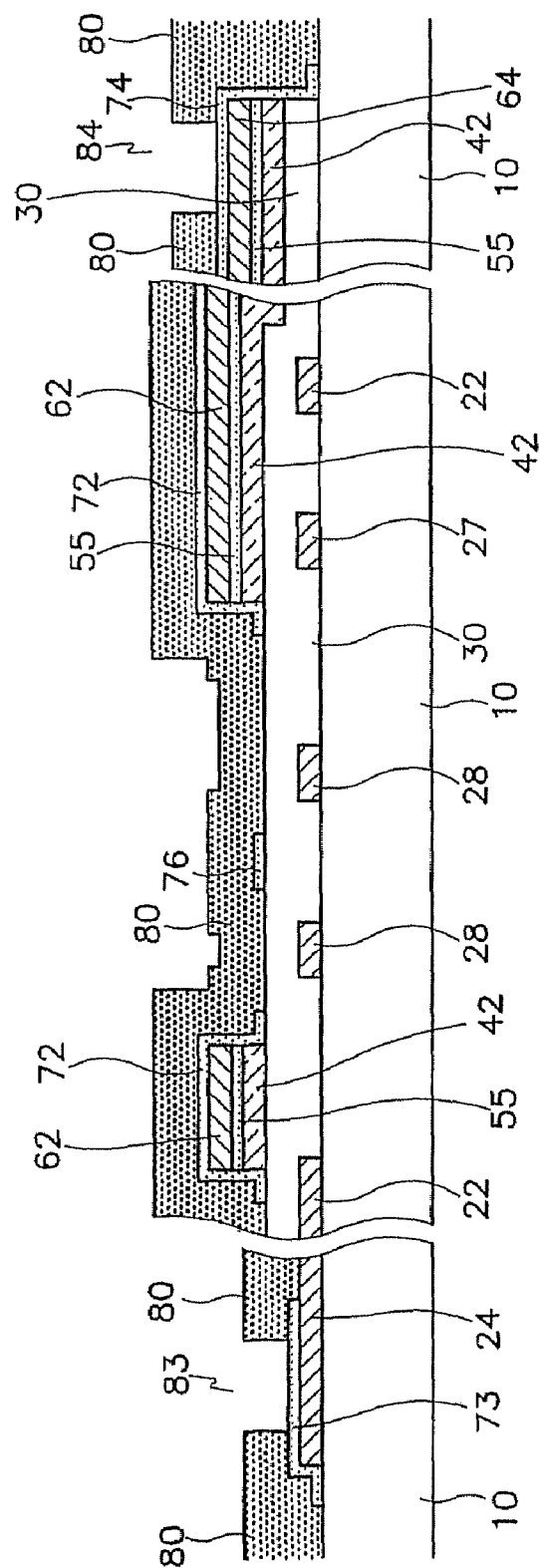
FIGS. 31 and 32 are cross-sectional views respectively taken along the line XXXI-XXXI' and XXXII-XXXII' of the FIG. 30.
Figure 32:
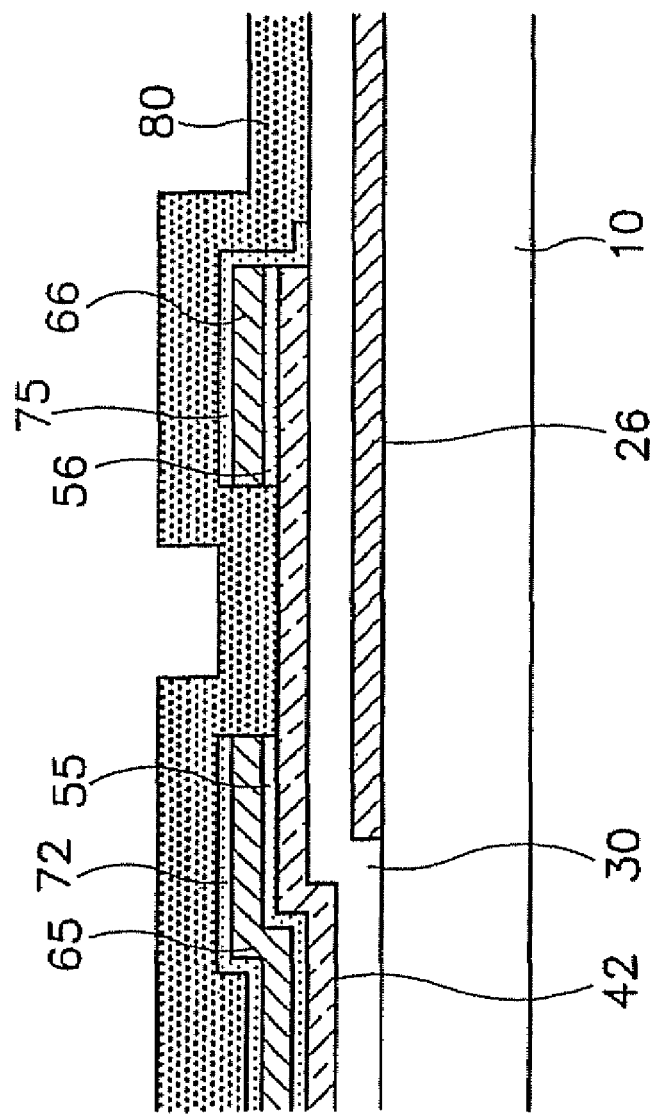

FIG. 30 is a layout view of a TFT panel for an LCD according to the seventh embodiment of the present invention, FIGS. 31 and 32 are cross-sectional views respectively taken along the line XXXI-XXXI' and XXXII-XXXII' of the FIG. 30.

At first, a gate wire of metal or conductive material such as aluminum (Al) or aluminum alloy, molybdenum (Mo) or molybdenum-tungsten (MoW), chromium (Cr) and tantalum (Ta) is formed on an insulating substrate 10. A gate wire includes a gate line (scanning signal line) 22 extending in the horizontal direction, a gate pad 24 connected to an end of the gate line 22 and transmitting a scanning signal from an external circuit to the gate line 22, and a gate electrode 26 that is a part of thin film transistor.

A common electrode wire made of the same material as the gate wire is also formed on the substrate 10. The common electrode wire includes a common line 27, common electrodes 28 that is a vertical branch of the common line 27 and a common pad (not shown) connected to an end of the common line 27 and transmitting a common electrode signal from an external circuit to the common line 27. The common pad is very similar to the gate pad 24.

A gate insulating layer 30 of silicon-nitride (SiNx) is formed on the gate wire 22, 24 and 26 and the common electrode wire 27 and 28, and covers them. The gate insulating layer 30 covers the substrate 10 of the display area but do not cover the gate pad 24, the common pad and the substrate 10 of the peripheral area.

A semiconductor pattern 42 made of semiconductor such as hydrogenated amorphous silicon is formed on the gate insulating layer 30. An ohmic contact layer pattern 55 and 56 made of amorphous silicon heavily doped with impurities such as phosphorus is formed on the semiconductor pattern 42.

A data wire 62, 64, 65 and 66 made of conductive materials such as Mo or MoW, Cr, Al or Al alloy and Ta is formed on the ohmic contact layer pattern 55 and 56. The data wire has a data line 62 including a source electrode 65 and extending in the vertical direction, a data pad 64 connected to an end of data line 62 and transmitting image signal from an external circuit to the data line 62. The data wire also has a drain electrode 66 located at the opposite side of the source electrode 65 with respect to the gate electrode 22.

The ohmic contact layer pattern 55 and 56 plays a role to reduce the contact resistance between the semiconductor pattern 42 and the data wire 62, 64, 65 and 66, and has the same layout as the data wire 62, 64, 65 and 66. The semiconductor pattern 42 has the same layout as the data wire 62, 64, 65 and 66 and the ohmic contact layer pattern 55 and 56 except for the channel part between the source electrode 65 and the drain electrode and 66.

A conductive pattern 72, 73, 74, 75 and 76 made of a transparent and conductive material such as ITO (indium tin oxide) is formed on the data wire 62, 64, 65 and 66. The conductive pattern includes a pixel electrode line 75 formed on the drain electrode 66 and parallel with the common line 27, and pixel electrodes 76 connected to the pixel electrode line 75 and parallel with the common electrode. The pixel electrode 76 and the common electrode 27 are located by turns and generate electric fields between them when voltages applied. The pixel electrode 76 may be overlapped with the common electrode line 27 to make a storage capacitor. The conductive pattern also includes a redundant data line 72 covering the data line 62 and the source electrode 65, a redundant data pad 74 covering the data pad 64, a redundant gate pad 73 covering the gate pad 24 and a redundant common pad (not shown) covering the common pad.

Next, a passivation layer 80 having contact holes 83 and 84 respectively exposing the redundant gate pad 73, the redundant data pad 74 and the redundant common pad is formed on the conductive pattern 71, 72, 73 and 74. The passivation layer 80 may be made of SiNx or an organic insulator such as an acrylic resin.

Now, a manufacturing method of a thin film transistor array panel according to the seventh embodiment of the present invention will be described with reference to the FIGS. 33A to 35C and FIGS. 30 to 32 mentioned above.

Figure 33A:
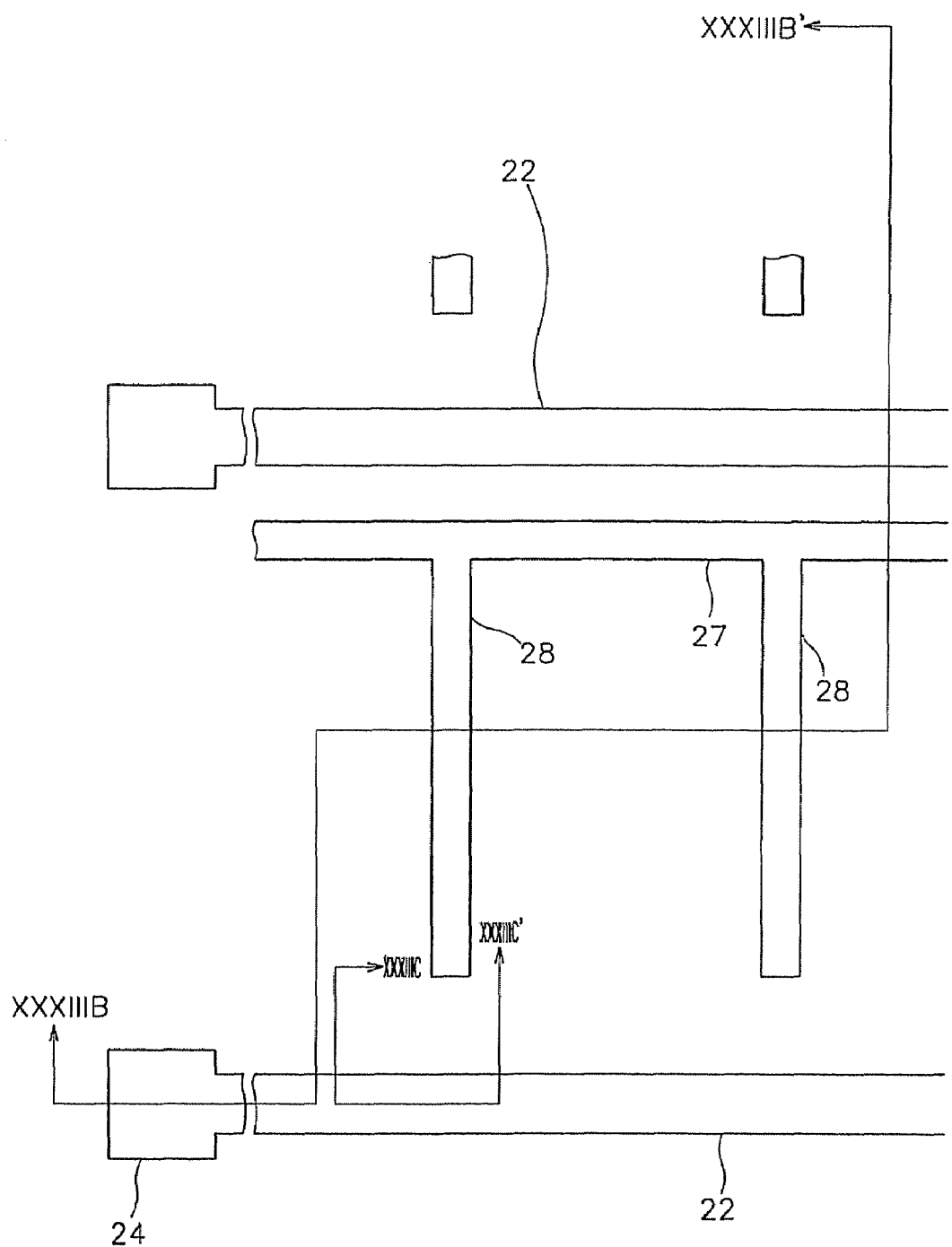
FIG. 33A is a layout view of a TFT panel in the first manufacturing step according to the seventh embodiment of the present invention.
Figure 33B:
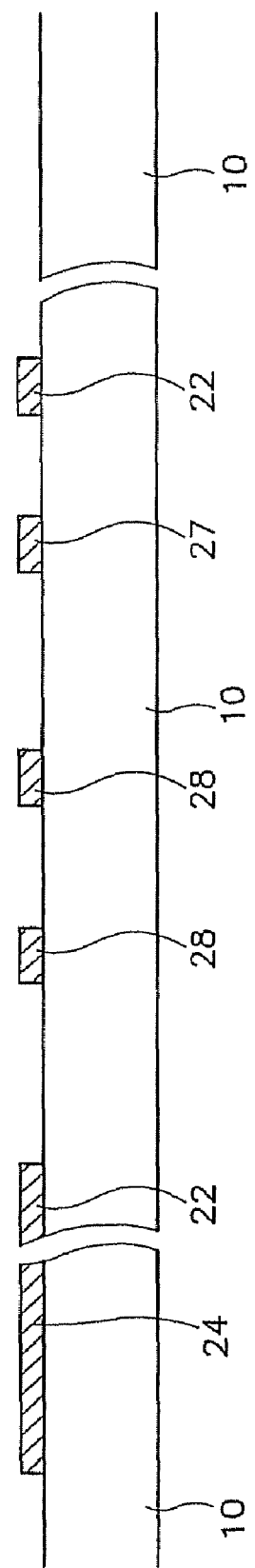
FIGS. 33B and 33C are respectively the cross-sectional views taken along the line XXXIIIB-XXXIIIB' and XXXIIIC-XXXIIIC' of the FIG. 33A.
Figure 33C:
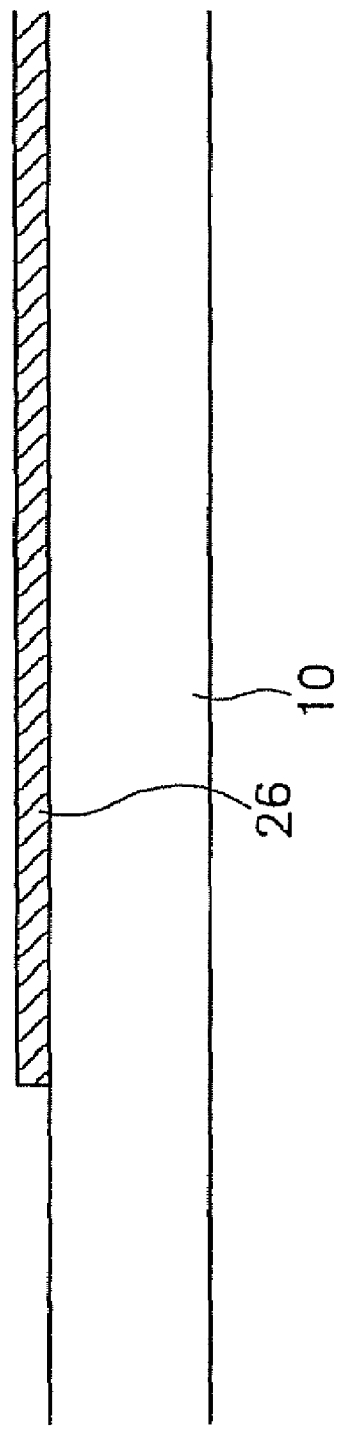

At first, as shown in FIGS. 33A through 33C, a layer of conductor such as a metal is deposited on a substrate 10 by such a method as sputtering to a thickness 1,000 Å to 3,000 Å. A gate wire including a gate line 22, a gate pad 24 and a gate electrode 26 and a common electrode wire including a common line 27, common electrodes 28 and a common pad are formed by dry etch or wet etch using the first mask.

Figure 34A:
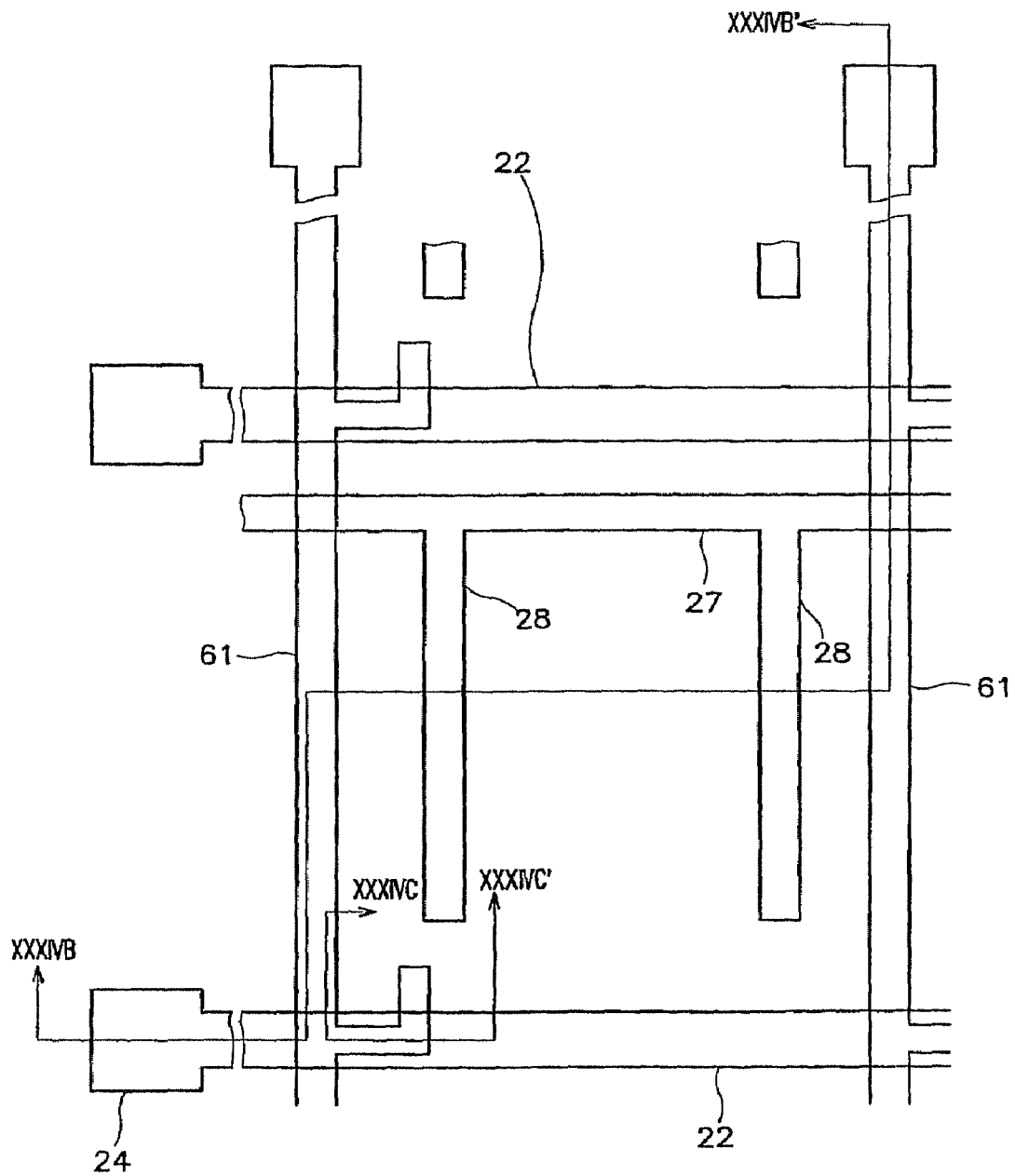
FIG. 34A is a layout view of a TFT panel in a manufacturing step following the FIGS. 33A to 33C.
Figure 34B:
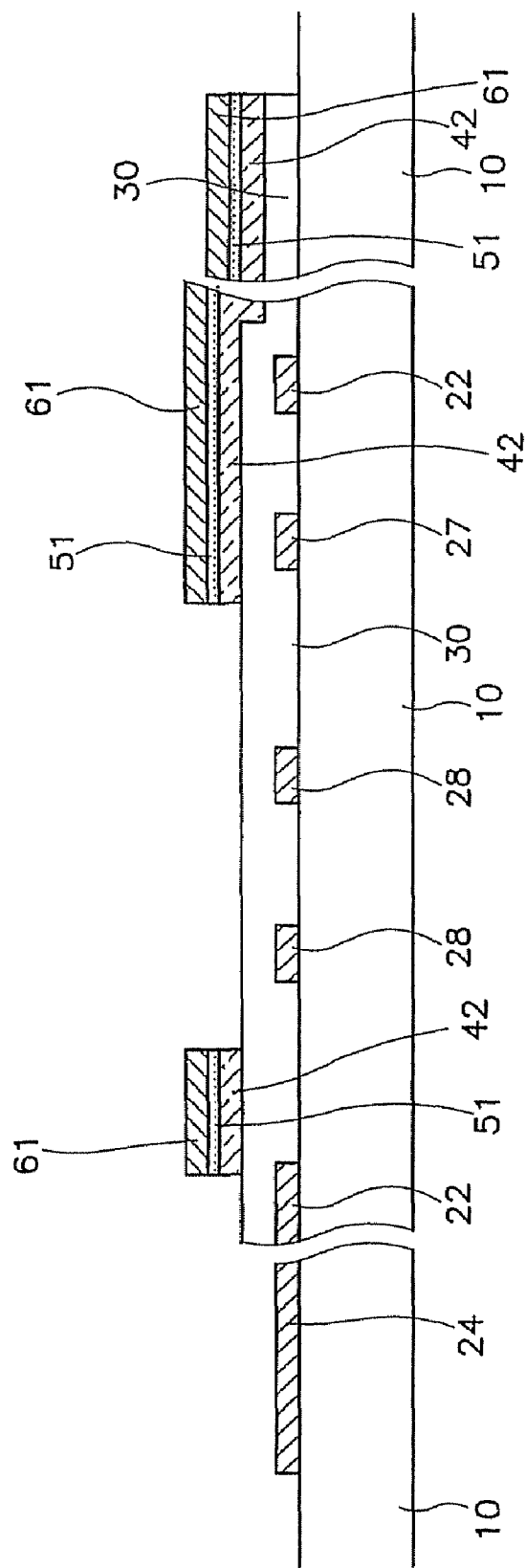
FIGS. 34B and 34C are respectively the cross-sectional views taken along the line XXXIVB-XXXIVB' and XXXIVC-XXXIVC' of the FIG. 34A.
Figure 34C:
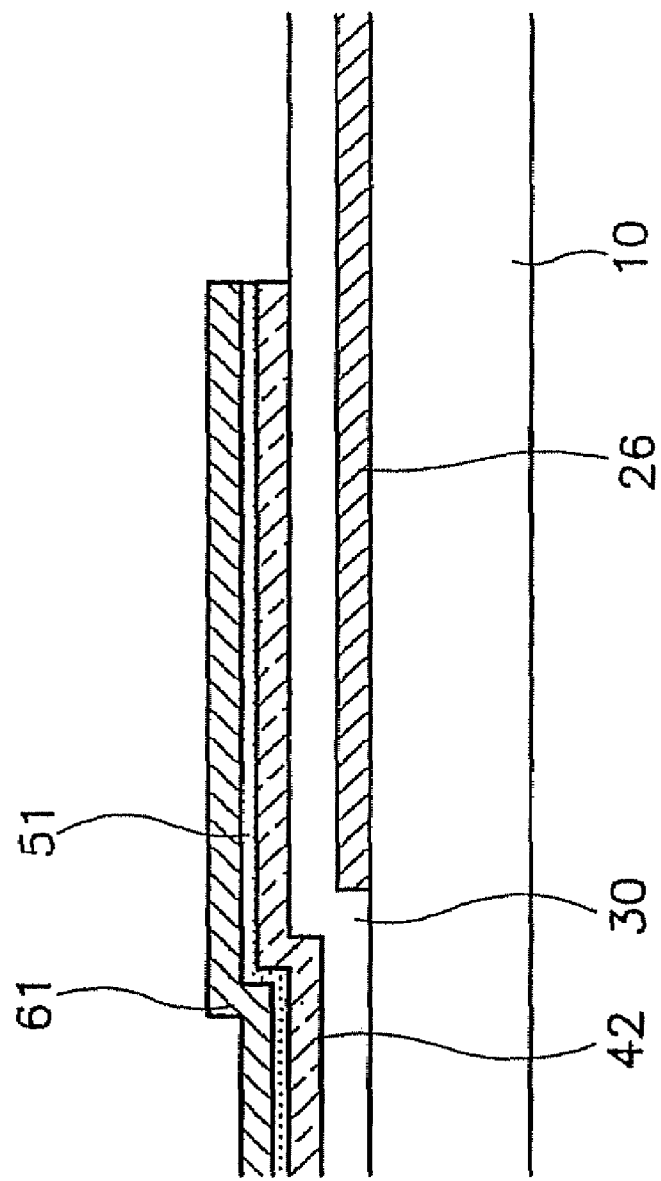

Next, as shown in FIGS. 34A through 34C, a gate insulating layer 30, a semiconductor layer 40 and an ohmic contact layer 50 are sequentially deposited to have the thickness of 1,500 Å to 5,000 Å, 500 Å to 2,000 Å and 300 Å to 600 Å respectively by such a method as chemical vapor deposition (CVD). Then, a metal layer 60 is deposited to have a thickness of 1,500 Å to 3,000 Å by such a method as sputtering. The metal layer 60, the ohmic contact layer 50, the semiconductor layer 40 and the gate insulating layer 30 are patterned to form a metal layer pattern 61, a first ohmic contact layer pattern 51 and a semiconductor layer pattern 42 thereunder, as shown in FIGS. 34B and 34C. At this time, the metal layer pattern 61 is similar to the completed data wire except that a source electrode and the drain electrode are not separated. In the peripheral area P, except for the metal layer pattern 61, the metal layer 70, the ohmic contact layer 50, the semiconductor layer 40 and the gate insulating layer 30 and the underlying layers are removed. However, in the display area, neither the gate insulating layer 30 nor the metal layer pattern 61 with the underlying layers are removed.

It is done by the method described in the sixth embodiment. That is, a PR pattern of which thickness varies depending on the location is formed and etched with the underlying layers at a time.

Figure 35A:
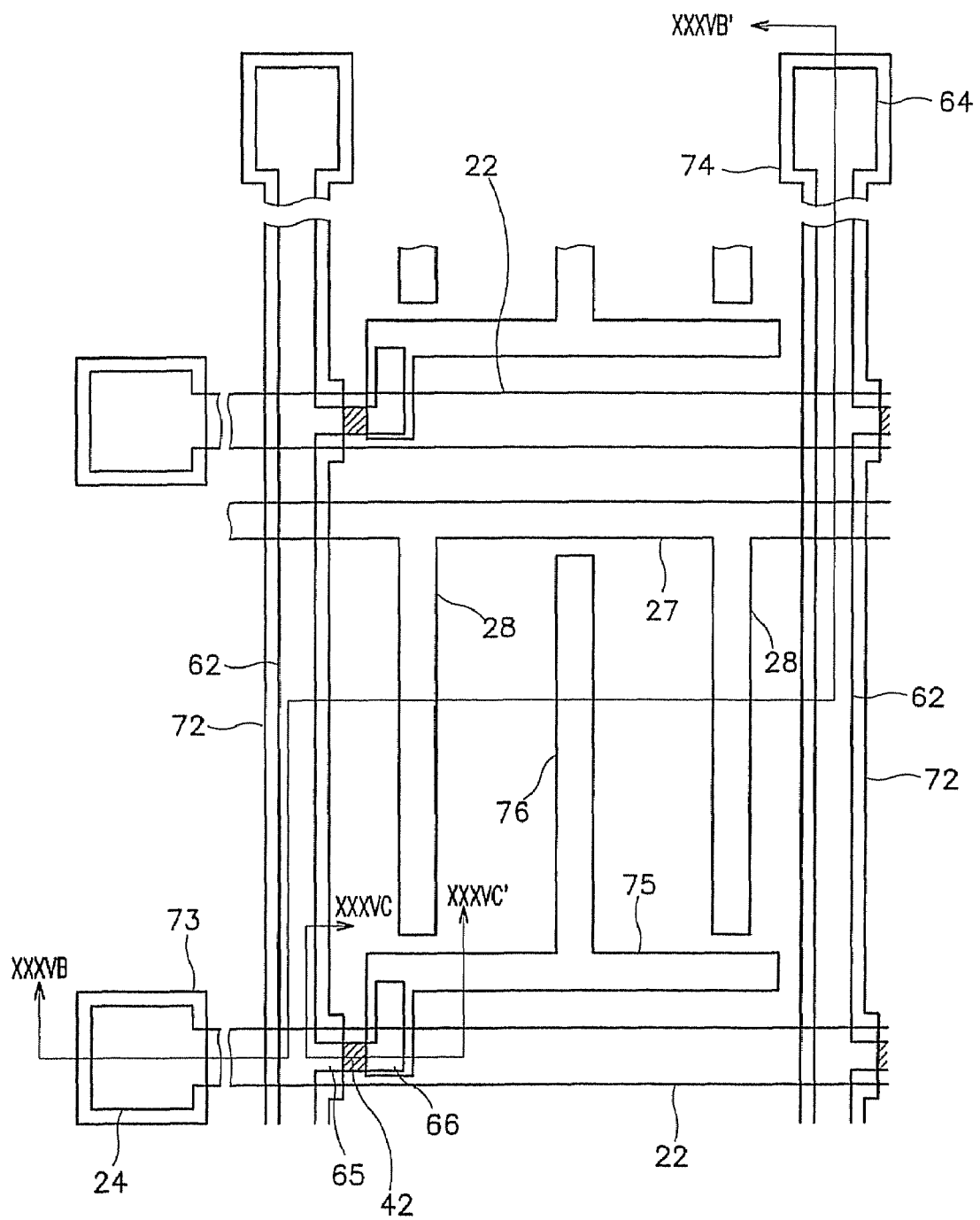
FIG. 35A is a layout view of a TFT panel in a manufacturing step following the FIGS. 34A to 34C.
Figure 35B:
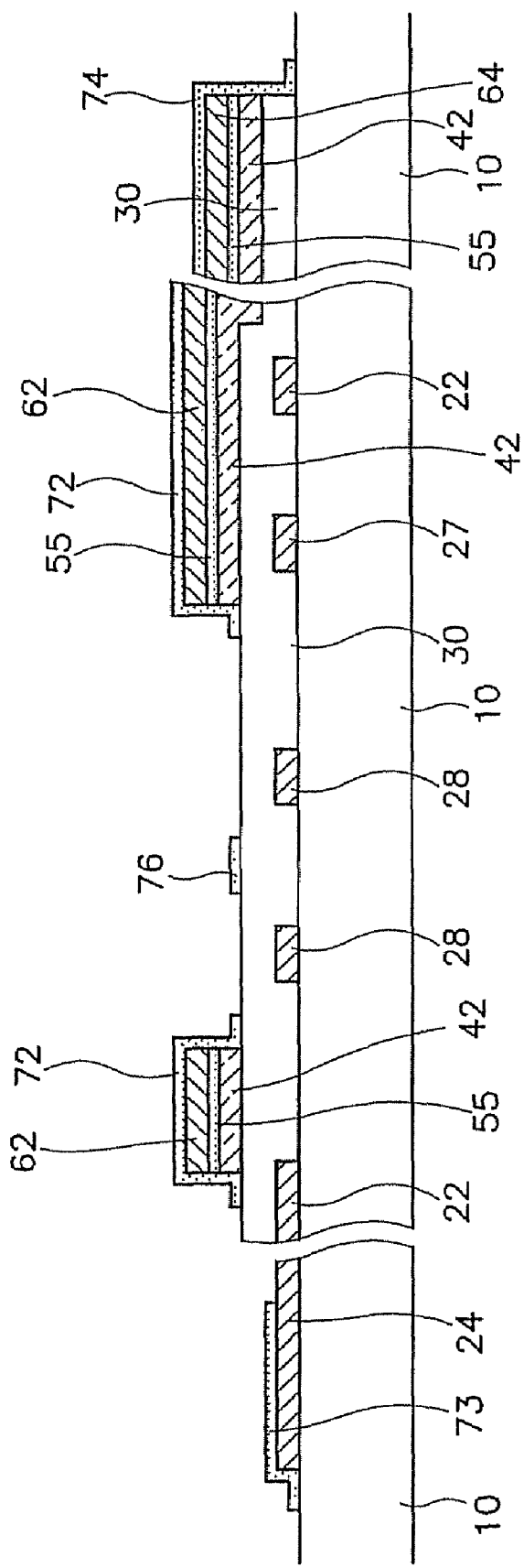

Next, a conductor layer is deposited to have a thickness of 400 Å to 500 Å by such a method as sputtering. Then, the conductor layer is patterned to form the conductive pattern 72, 73, 74, 75 and 76 as shown in FIGS. 35A and 35B. At this time, the portion between the pixel electrode line 75 and the redundant data line 72 of the metal layer pattern 61 is exposed. The exposed metal layer pattern 61 is wet etched to separate the source electrode 65 from the drain electrode 66, exposing the first ohmic contact layer pattern 51 thereunder. Then the exposed first contact pattern 51 is etched to expose the semiconductor layer 42, achieving a complete TFT.

As a last step, a passivation layer 80 of over 3,000 Å is formed by CVD (chemical vapor deposition) of SiNx or spin coating an organic insulating layer and patterned by using the fourth mask. This patterning exposes the redundant gate pad 73 and the redundant data pad 74.

Another manufacturing method of TFT array panel using only four steps of photolithography process will be described by the eighth embodiment. In the eighth embodiment, the common electrode and the pixel electrode are formed on the TFT array panel.

Now, a TFT array panel and a manufacturing method thereof according to the eighth embodiment of the present invention will be described With reference to the FIGS. 36 to 41C.

Figure 36:
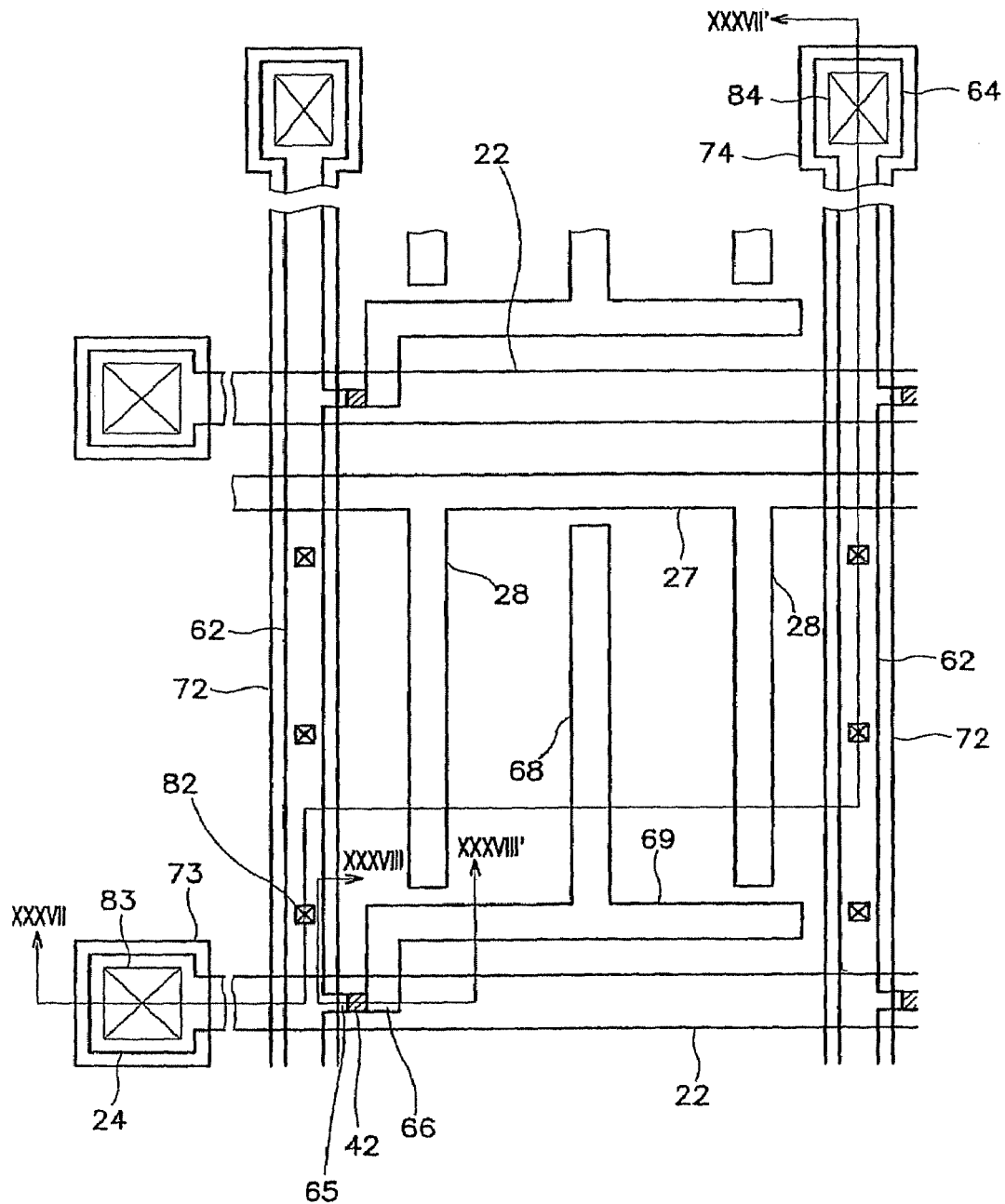
FIG. 36 is a layout view of a TFT panel for an LCD according to the eighth embodiment of the present invention.
Figure 37:
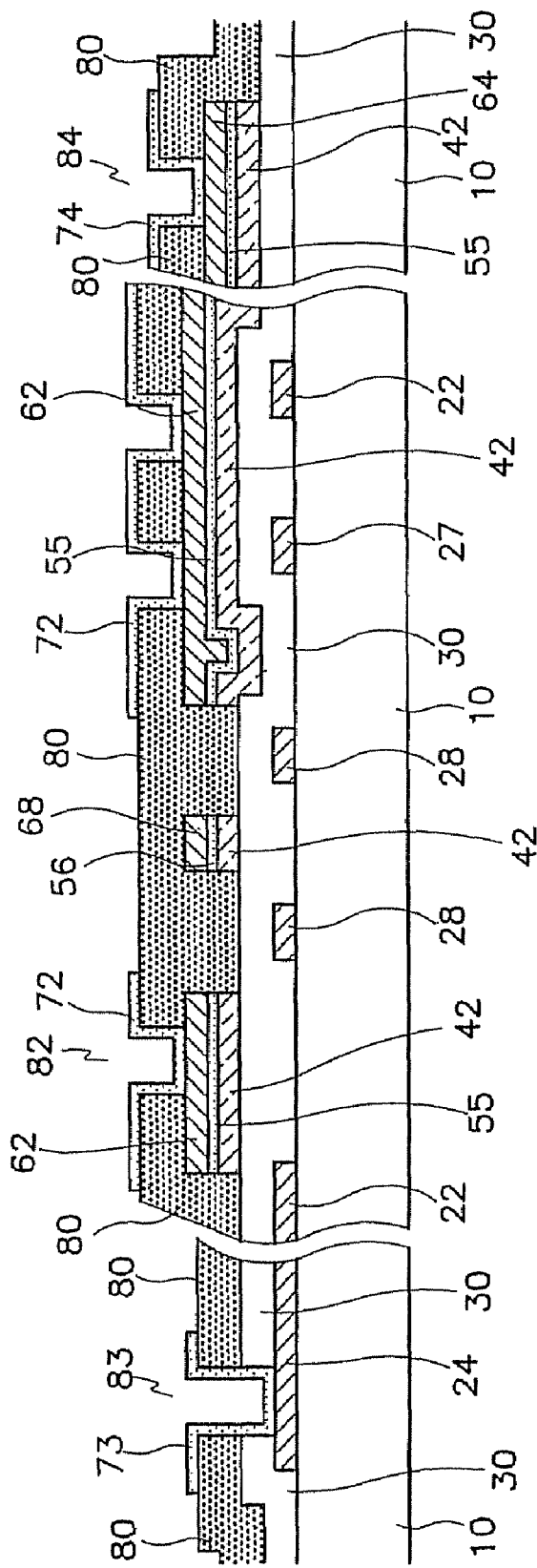
FIGS. 37 and 38 are cross-sectional views respectively taken along the line XXXVII-XXXVII' and XXXVIII-XXXVIII' of the FIG. 36.
Figure 38:
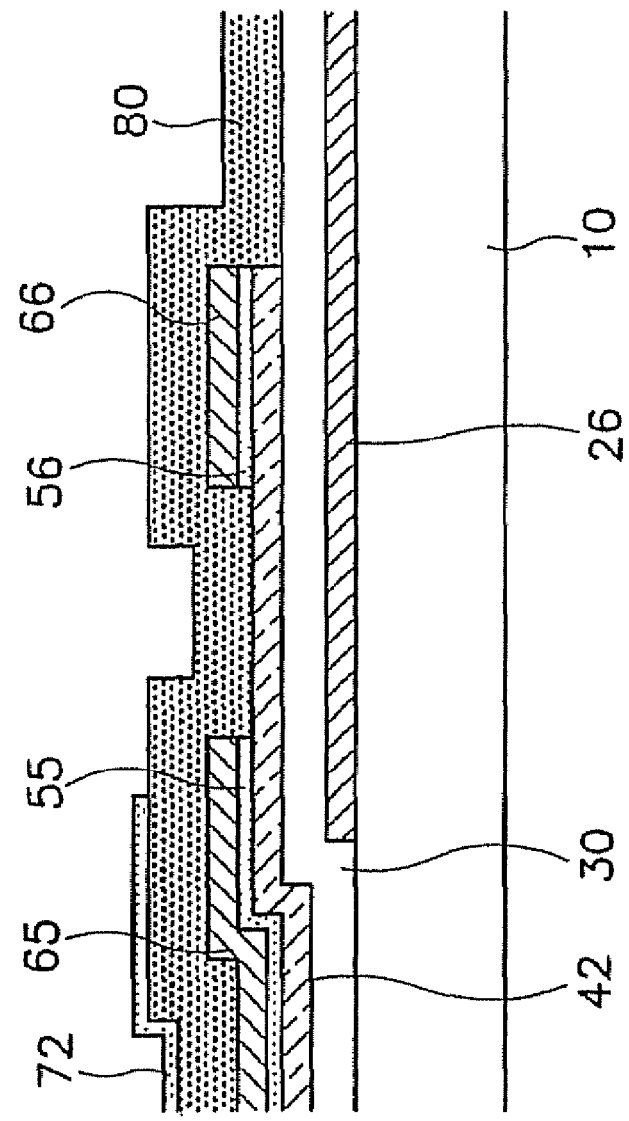

At first, FIG. 36 is a layout view of a TFT panel for an LCD according to the eighth embodiment of the present invention. FIGS. 37 and 38 are cross-sectional views respectively taken along the line XXXVII-XXXVII' and XXXVIII-XXXVIII' of the FIG. 36.

A gate wire of metal or conductive material such as aluminum (Al) or aluminum alloy, molybdenum (Mo) or molybdenum-tungsten (MoW), chromium (Cr) and tantalum (Ta) is formed on an insulating substrate 10. A gate wire includes a gate line (scanning signal line) 22 extending in the horizontal direction, a gate pad 24 connected to an end of the gate line 22 and transmitting a scanning signal from an external circuit to the gate line 22, a gate electrode 26 that is a portion of the gate line 22.

A common electrode wire made of the same material as the gate wire is also formed on the substrate 10. The common electrode wire includes a common line 27, common electrodes 28 that is a vertical branch of the common line 27 and a common pad (not shown) connected to an end of the common line 27 and transmitting a common electrode signal from an external circuit to the common line 27. The common pad is very similar to the gate pad 24.

A gate insulating layer 30 of silicon-nitride (SiNx) is formed on the gate wire 22, 24 and 26 and the common electrode wire 27 and 28, covering the same. The gate insulating layer 30 covers the substrate 10 of the display area but do not cover the gate pad 24, the common pad and the substrate 10 of the peripheral area.

A semiconductor pattern 42 made of semiconductor such as hydrogenated amorphous silicon is formed on the gate insulating layer 30. An ohmic contact layer pattern 55 and 56 made of amorphous silicon heavily doped with impurities such as phosphorus is formed on the semiconductor pattern 42.

A data wire 62, 64, 65, 66, 68 and 69 made of conductive materials such as Mo or MoW, Cr, Al or Al alloy and Ta is formed on the ohmic contact layer pattern 55 and 56. The data wire has a data line 62 including a source electrode 65 and extending in the vertical direction, a data pad 64 connected to an end of data line 62 and transmitting image signal from an external circuit to the data line 62. The data wire also has a drain electrode 66 located at the opposite side of the source electrode 65 with respect to the gate electrode 26, a pixel electrode line 69 extended from the drain electrode 66 and parallel with the common line 27, and pixel electrodes 68 which are branches of the pixel electrode line 69 and parallel with the common electrode 28. The pixel electrode 68 and the common electrode 28 are located by turns and generate electric fields therebetween when voltages applied. The pixel electrode 68 may be overlapped with the common electrode line 27 to form a storage capacitor.

The ohmic contact layer pattern 55 and 56 plays a role to reduce the contact resistance between the semiconductor pattern 42 and the data wire 62, 64, 65, 66, 68 and 69, and has the same layout as the data wire 62, 64, 65, 66, 68 and 69. The semiconductor pattern 42 has the same layout as the data wire 62, 64, 65, 66, 68 and 69 and the ohmic contact layer pattern 55 and 56 except for the channel part between the source electrode 65 and the drain electrode and 66.

A passivation layer 80 is formed on the data wire 62, 64, 65, 66, 68 and 69. The passivation layer 80 has contact holes 82, 83 and 84 respectively exposing the data line 62, gate pad 24 and the data pad 64. The passivation layer 80 may be made of SiNx or an organic insulator such as an acrylic resin.

A conductive pattern 72, 73, 74, 75 and 76 is formed on the passivation layer 80. The conductive pattern includes a redundant data line 72 covering the data line 62, a redundant data pad 74 covering the data pad 64 and a redundant gate pad 73 covering the gate pad 24.

Now, a manufacturing method of a thin film transistor array panel according to the eighth embodiment of the present invention will be described with reference to the FIGS. 39A to 41C and FIGS. 36 to 38 mentioned above.

Figure 39A:
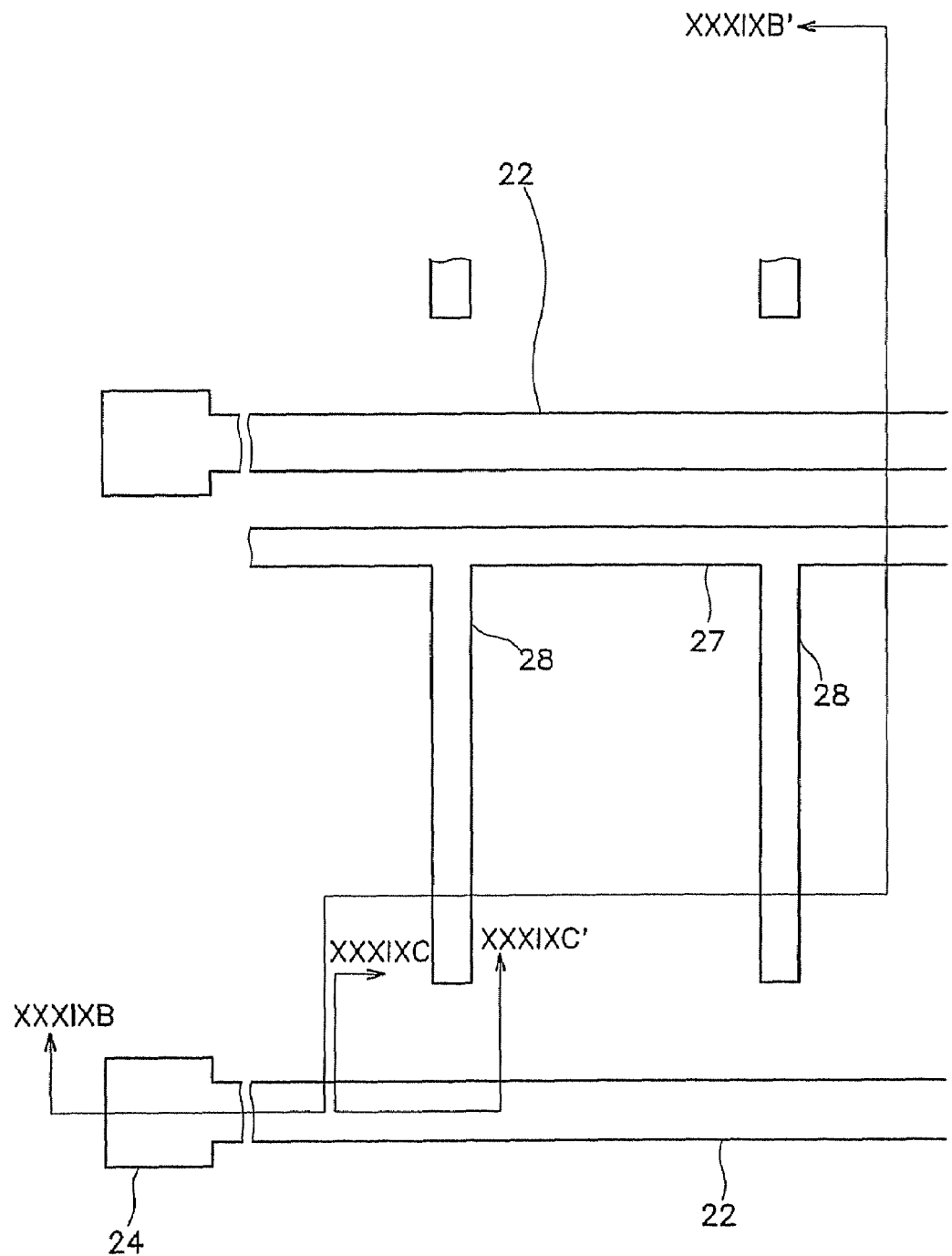
FIG. 39A is a layout view of a TFT panel in the first manufacturing step according to the eighth embodiment of the present invention.
Figure 39B:
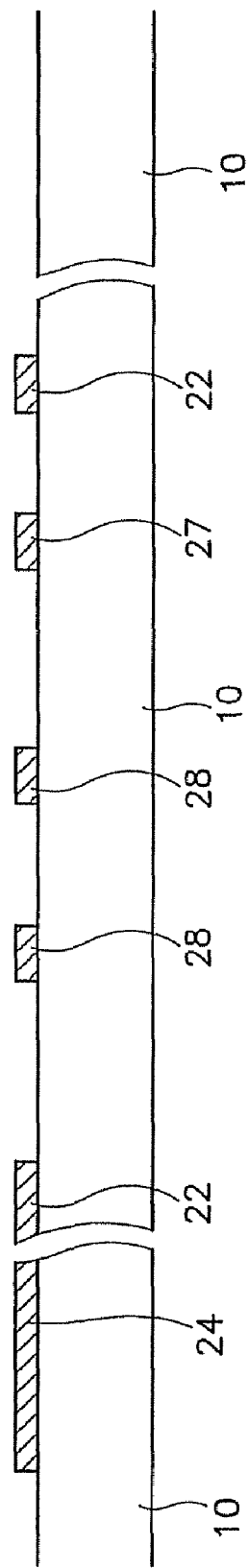
FIGS. 39B and 39C are respectively the cross-sectional views taken along the line XXXIXB-XXXIXB' and XXXIXC-XXXIXC' of the FIG. 39A.
Figure 39C:
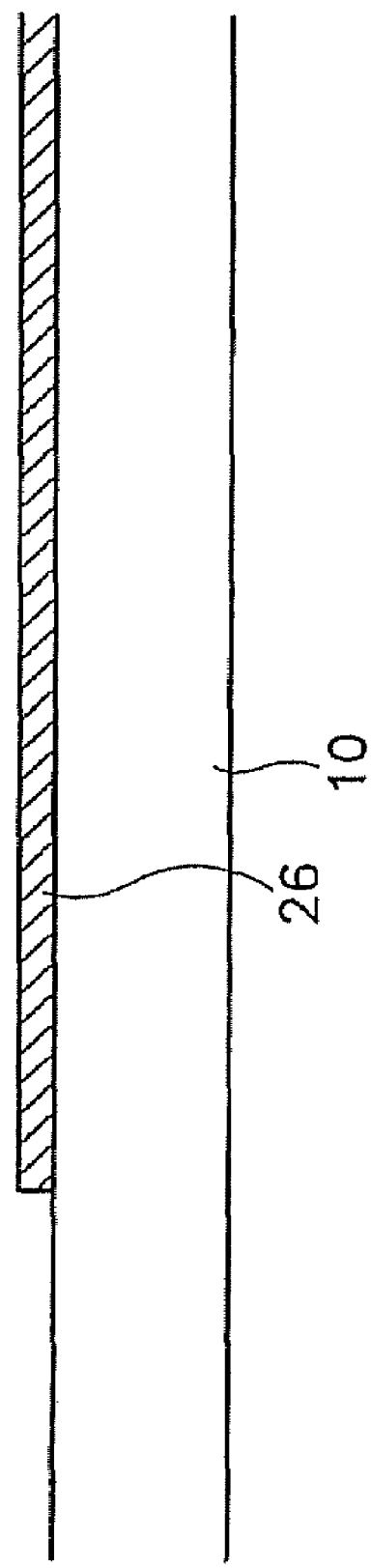

At first, as shown in FIGS. 39A to 39C, a layer of conductor such as a metal is deposited on a substrate 10 by such a method as sputtering to a thickness of 1,000 Å to 3,000 Å. A gate wire including a gate line 22, a gate pad 24 and a gate electrode 26 and a common electrode wire including a common line 27, common electrodes 28 and a common pad (not shown) are formed by dry etch or wet etch using the first mask.

Figure 40A:
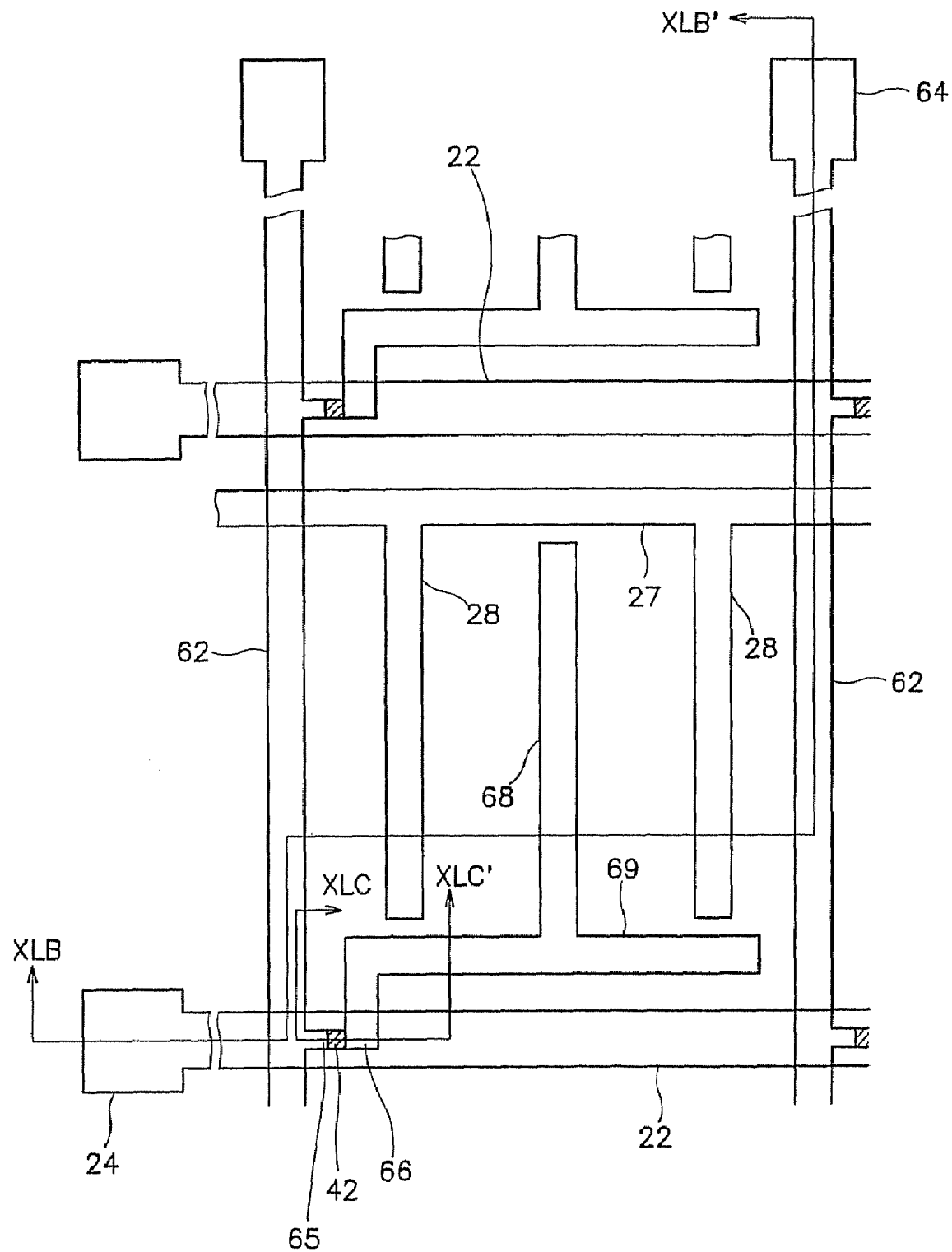
FIG. 40A is a layout view of a TFT panel in a manufacturing step following the FIGS. 39A to 39C.
Figure 40B:
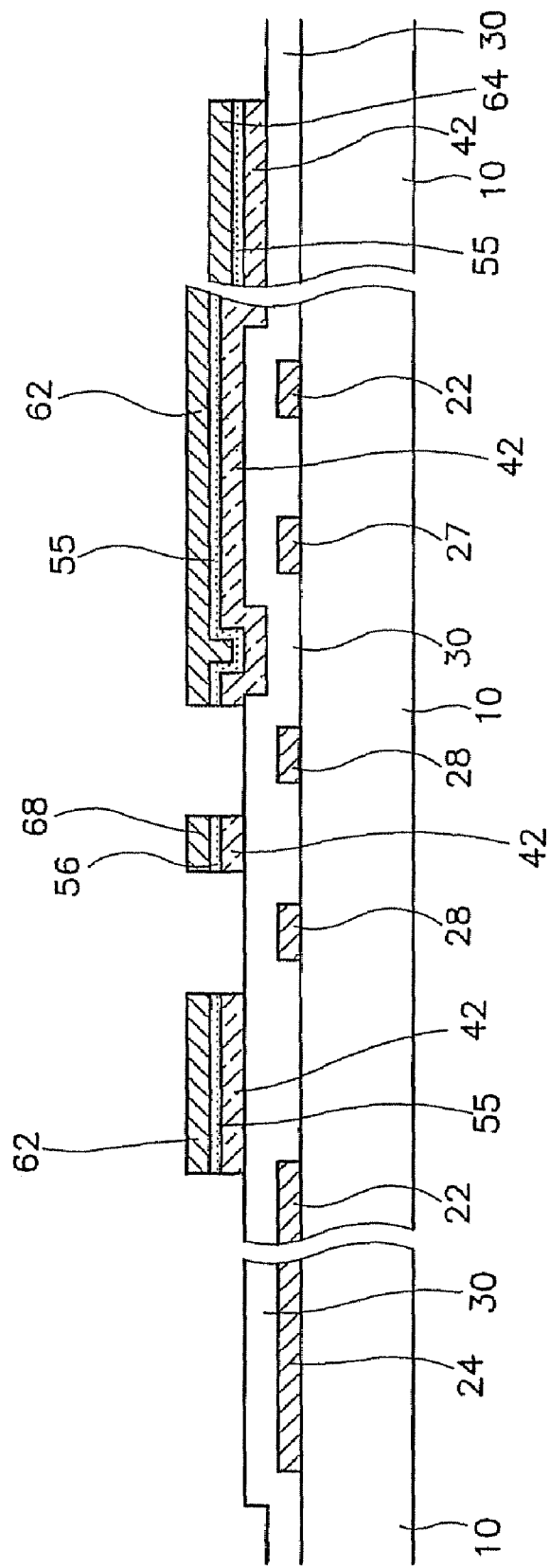
FIGS. 40B and 40C are respectively the cross-sectional views taken along the line XLB-XLB' and XLC-XLC' of the FIG. 40A.
Figure 40C:
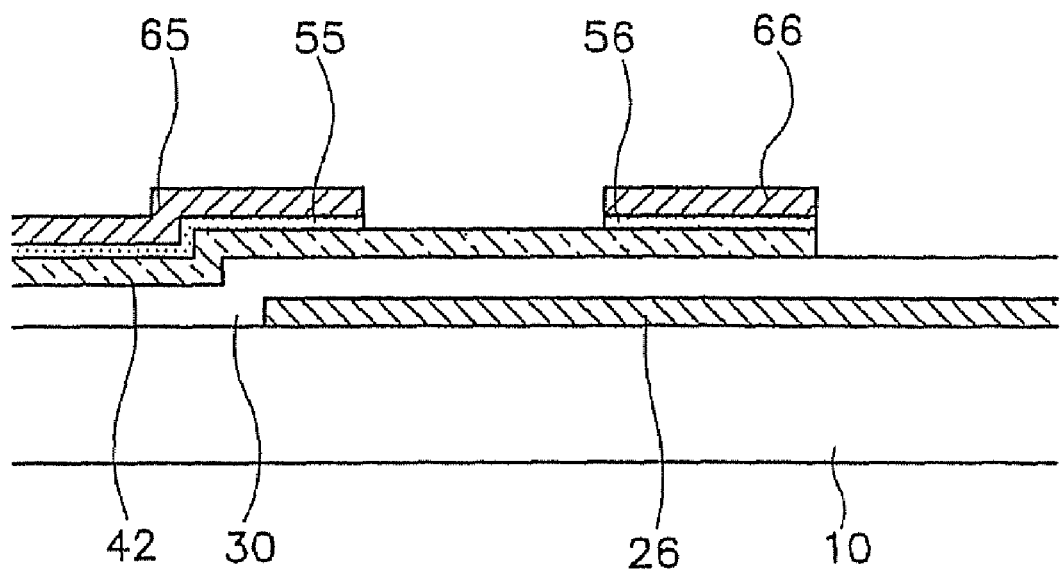

Next, as shown in FIGS. 40A to 40C, a gate insulating layer, a semiconductor layer and an ohmic contact layer are sequentially deposited to have the thickness of 1,500 Å to 5,000 Å, 500 Å to 2,000 Å and 300 Å to 600 Å respectively by such a method as chemical vapor deposition (CVD). Then, a metal layer is deposited to have a thickness of 1,500 Å to 3,000 Å by such a method as sputtering. The metal layer, the ohmic contact layer, the semiconductor layer are patterned to form a data wire 62, 64, 65, 66, 68 and 69, and the ohmic contact pattern 55 and 56 and the semiconductor layer pattern 42 thereunder in the second photolithography step. At this time, the semiconductor layer pattern 42 remains under the data wire 62, 64, 65, 66, 68 and 69 and between the source electrode 65 and the drain electrode 66. In the other area, the semiconductor layer is totally removed. The portion of semiconductor layer pattern 42 between the source electrode 65 and the drain electrode 66 is exposed and forms a channel of the TFT. To obtain this, it is necessary to fabricate a PR pattern of which portion corresponding to the channel has a thickness thinner than that of the portion corresponding to the data line. Such a PR pattern may be obtained by using a photomask of which portion corresponding to the channel has a lower transmittance than elsewhere.

After forming the PR layer pattern that has a variant thickness, the layers are etched using the PR layer pattern as etch mask. First, the exposed portion of the metal layer is etched by such a method as wet etch. Then, the thin PR layer on the channel, the exposed ohmic contact layer and the semiconductor layer thereunder except for the portion under the data wire are etched at the same time. Therefore, the metal layer of the channel part is exposed, the thick PR layer on the data wire is stripped to a certain thickness and the gate insulating layer 30 of elsewhere is exposed. Next, the metal layer of the channel part is wet etched exposing the ohmic contact layer thereunder. The exposed ohmic contact layer is dry etched out to complete a pattern.

Figure 41A:
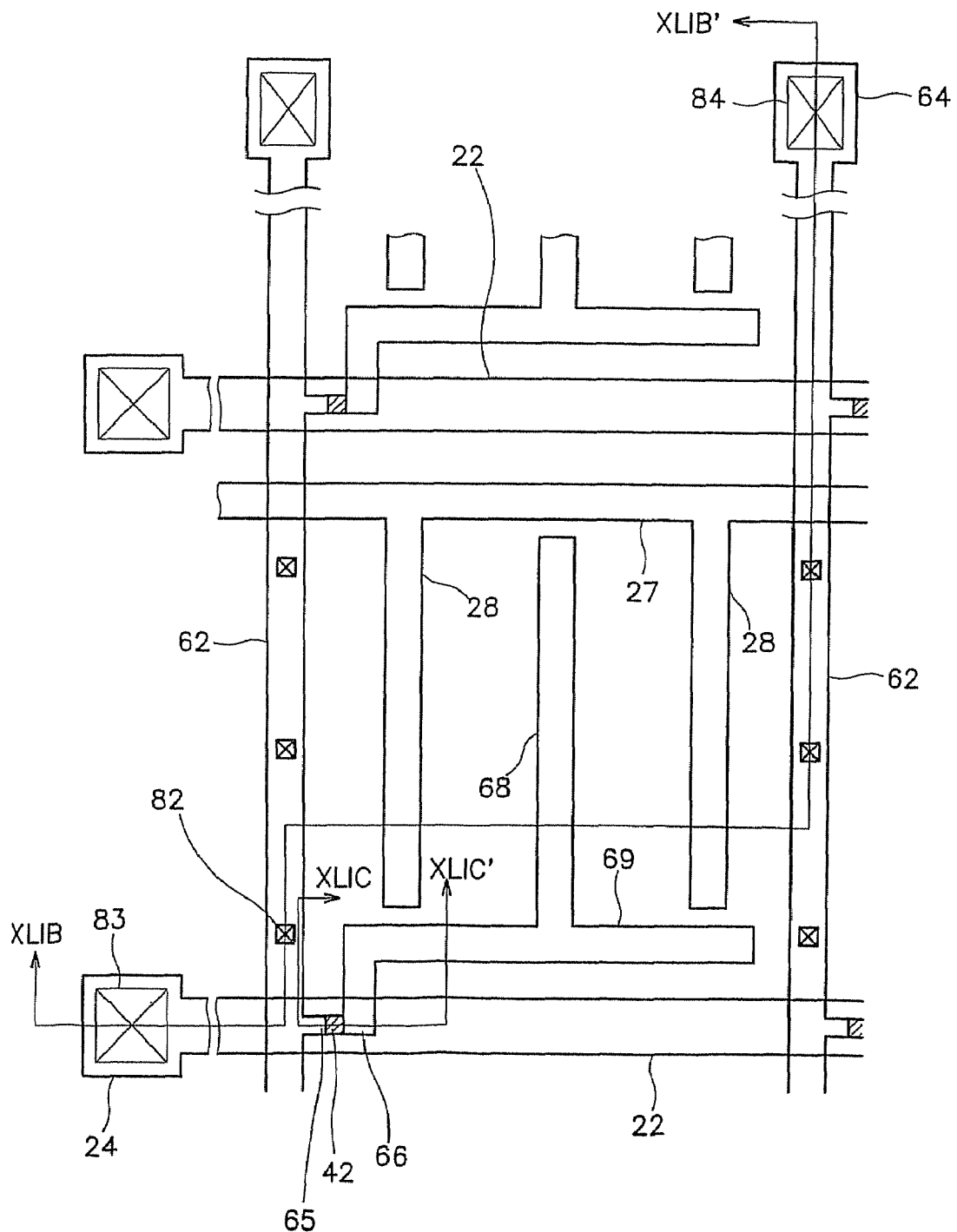
FIG. 41A is a layout view of a TFT panel in a manufacturing step following the FIGS. 40A to 40C.
Figure 41B:
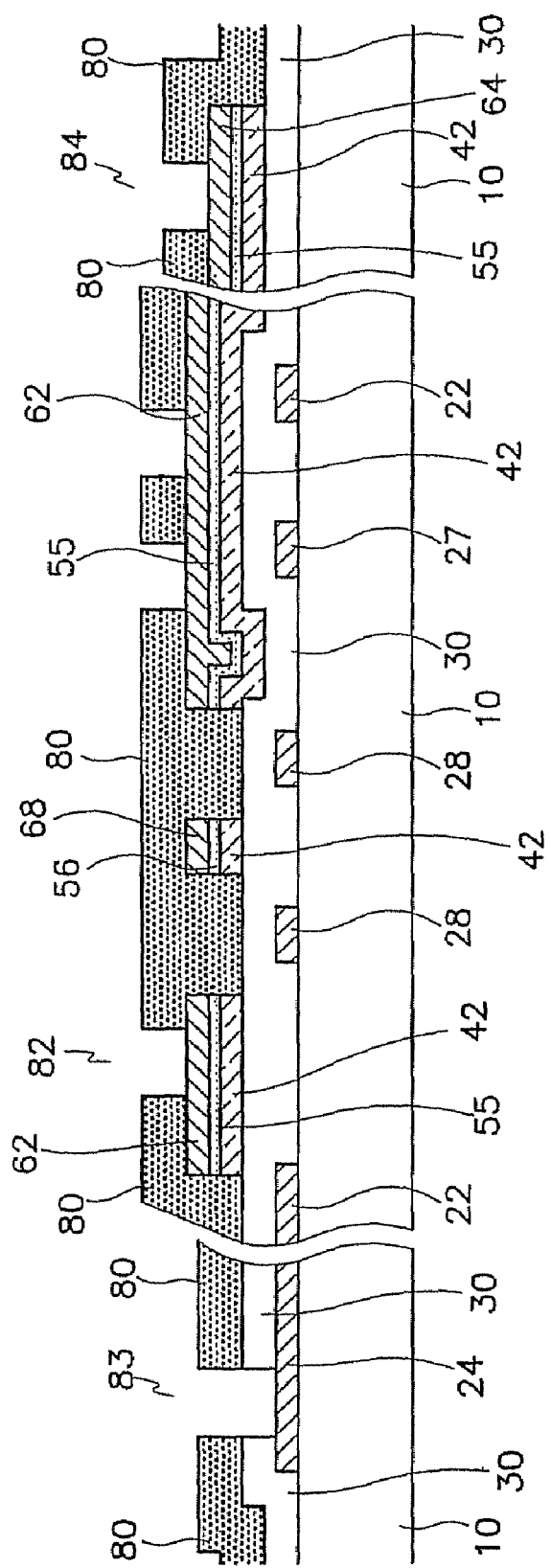
FIGS. 41B and 41C are respectively the cross-sectional views taken along the line XLIB-XLIB' and XLIC-XLIC' of the FIG. 41A.
Figure 41C:
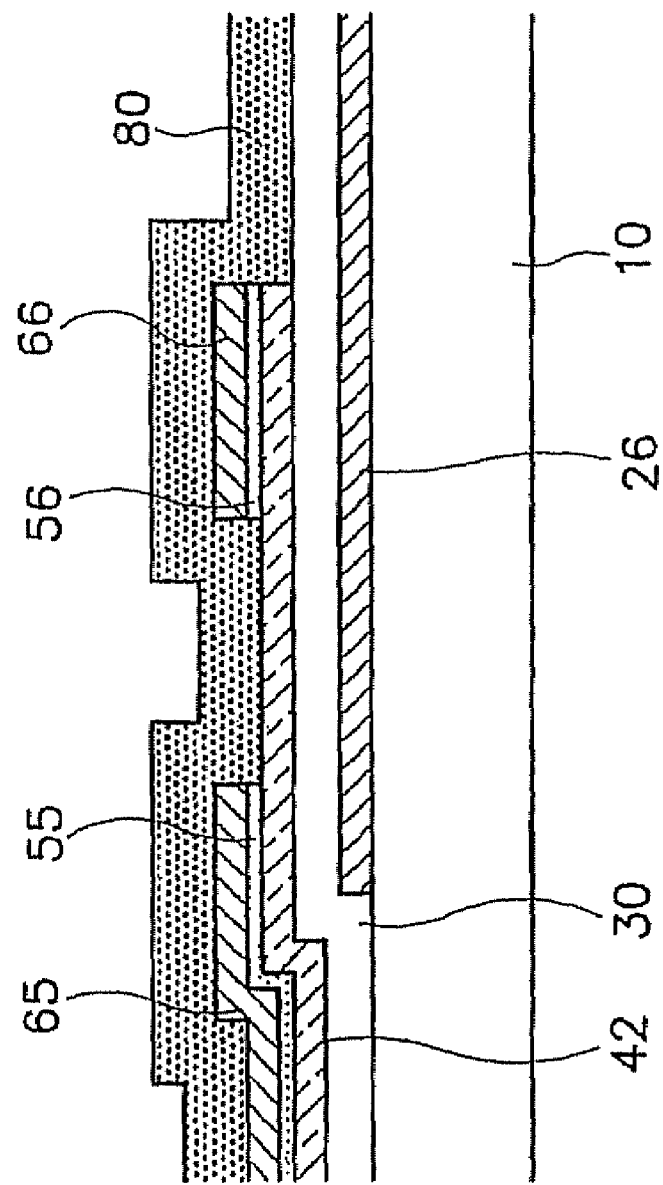

Next, as shown in FIGS. 41A to 41C, a passivation layer 80 of over 3,000 Å is formed by CVD (chemical vapor deposition) of SiNx or by spin coating an organic insulating layer and patterned along with the gate insulating layer 30 using the third mask. By this patterning, the gate pad 73, the data pad 74 and the data line 62 are exposed.

As the last step, a conductor layer is deposited to a thickness of 400 Å to 500 Å and patterned to form a conductive pattern 72, 73 and 74 as shown in FIGS. 41A to 41C using the fourth mask.

As described above, in the eighth embodiment, the number of photolithography step is reduced by patterning the semiconductor layer along with the data wire 62, 64, 65, 66, 68 and 69 at the same time.

By the present invention, the manufacturing process of a thin film transistor panel for a liquid crystal display is efficiently simplified. At the same time, the gate pads and the data pads are protected. In addition, the leakage current of an LCD is efficiently reduced.

In the drawings and specification, there have been disclosed typical preferred embodiments of the present invention and, although specific terms are employed, they are used in a generic and descriptive sense only and not for purposes of limitation, the scope of the invention being set forth in the following claims.

What is claimed is:

1. A manufacturing method of a thin film transistor away panel, the method comprising:
   forming a plurality of gate lines, and a plurality of gate electrodes respectively connected to the gate lines;
   forming a gate insulating layer which covers the gate lines;
   forming a plurality of semiconductors on the gate insulating layer;
   forming a plurality of ohmic contacts on the semiconductors;
   forming a plurality of data lines and source electrodes connected to the data lines, and a plurality of drain electrodes separate from the source electrodes on the ohmic contacts;
   forming a passivation layer covering the data lines and the drain electrodes except a part of the drain electrodes; and
   forming a plurality of conductive electrodes connected to the drain electrodes,
   wherein the separation of the source electrodes and the drain electrodes is performed by a photolithography process of using a photoresist layer pattern, and the photoresist layer pattern includes a first portion located between the source electrodes and the drain electrodes, a second portion thicker than the first portion and a third portion thinner than the first portion.

2. The method of claim 1, further comprising forming a plurality of common electrodes.

3. The method of claim 2, wherein the common electrodes are formed with the same layer as the gate lines.

4. The method of claim 3, wherein the forming a plurality of data lines and drain electrodes, ohmic contacts and semiconductors comprise:
    etching the portion of the metal layer under the third portion to expose the ohmic contact layer by wet or dry etch;
    dry etching the ohmic contact layer under the third portion and the semiconductor layer thereunder along with the first portion to expose the gate insulating layer under the third portion and the metal layer under the first portion and to complete the semiconductors; and
    etching the portion of the metal layer under the first portion and the ohmic contact layer thereunder to complete the data lines and the drain electrodes, and the ohmic contacts.

5. The method of claim 1, wherein the conductive electrodes are pixel electrodes.

6. The method of claim 1, wherein the data lines and the drain electrodes, the ohmic contacts, and the semiconductor are formed by using a mask.

7. The method of claim 1, wherein the forming a plurality of semiconductors, ohmic contacts, and data lines and drain electrode comprise:
    depositing the semiconductor layer, the ohmic contact layer and the metal layer on the gate insulating layer;
    coating a photoresist layer on the metal layer;
    exposing the photoresist layer through the photomask;
    developing the photoresist layer to form the photoresist layer pattern of which the second portion is located on the data wire;
    etching the portion of the metal layer, the ohmic contact layer and the semiconductor layer under the third portion, the first portion along with the portion of the metal layer and the ohmic contact layer thereunder, and some thickness of the second portion to form the data lines and the drain electrodes, the ohmic contacts, and the semiconductors; and
    removing the photoresist layer pattern.

* * * * *